(12) United States Patent
Chen et al.

(10) Patent No.: US 11,016,918 B2
(45) Date of Patent: May 25, 2021

(54) FLASH-DRAM HYBRID MEMORY MODULE

(71) Applicant: Netlist, Inc., Irvine, CA (US)

(72) Inventors: Chi-She Chen, Walnut, CA (US);
Jeffrey C. Solomon, Irvine, CA (US);
Scott H. Milton, Irvine, CA (US);
Jayesh Bhakta, Cerritos, CA (US)

(73) Assignee: Netlist, Inc., Irvine, CA (US)

( * ) Notice: Subject to any disclaimer, the term of this patent is extended or adjusted under 35 U.S.C. 154(b) by 0 days.

(21) Appl. No.: 17/138,766

(22) Filed: Dec. 30, 2020

(65) Prior Publication Data

US 2021/0124701 A1 Apr. 29, 2021

Related U.S. Application Data

(63) Continuation of application No. 15/934,416, filed on Mar. 23, 2018, which is a continuation of application
(Continued)

(51) Int. Cl.
*G06F 13/36* (2006.01)
*G06F 13/28* (2006.01)
(Continued)

(52) U.S. Cl.
CPC .............. *G06F 13/28* (2013.01); *G06F 1/185* (2013.01); *G06F 3/0613* (2013.01);
(Continued)

(58) Field of Classification Search
CPC .. G06F 13/28; G06F 13/4027; G06F 13/1694; G06F 13/4223; G06F 12/0638;
(Continued)

(56) References Cited

U.S. PATENT DOCUMENTS 2,043,099 A 6/1936 Hanna
3,562,555 A 2/1971 Ahrons
(Continued)

FOREIGN PATENT DOCUMENTS

EP 2737383 A2 6/2014
KR 0130873 B1 4/1999
(Continued)

OTHER PUBLICATIONS

Exhibit, Decision Denying Institution of Inter Partes Review, *Smart Modular Technologies, Inc. v. Netlist, Inc.*, Case No. 4:13-cv-05889-YGR Document 309-3, filed Mar. 17, 2015, 23 pages.
(Continued)

*Primary Examiner* — Hashem Farrokh
(74) *Attorney, Agent, or Firm* — Shami Messinger PLLC

(57) ABSTRACT

In certain embodiments, a memory module includes a printed circuit board (PCB) having an interface that couples it to a host system for provision of power, data, address and control signals. First, second, and third buck converters receive a pre-regulated input voltage and produce first, second and third regulated voltages. A converter circuit reduces the pre-regulated input voltage to provide a fourth regulated voltage. Synchronous dynamic random access memory (SDRAM) devices are coupled to one or more regulated voltages of the first, second, third and fourth regulated voltages, and a voltage monitor circuit monitors an input voltage and produces a signal in response to the input voltage having a voltage amplitude that is greater than a threshold voltage.

30 Claims, 22 Drawing Sheets

Related U.S. Application Data

No. 14/840,865, filed on Aug. 31, 2015, now Pat. No. 9,928,186, which is a continuation of application No. 14/489,269, filed on Sep. 17, 2014, now Pat. No. 9,158,684, which is a continuation of application No. 13/559,476, filed on Jul. 26, 2012, now Pat. No. 8,874,831, which is a continuation-in-part of application No. 12/240,916, filed on Sep. 29, 2008, now Pat. No. 8,301,833, which is a continuation of application No. 12/131,873, filed on Jun. 2, 2008, now abandoned.

(60) Provisional application No. 60/941,586, filed on Jun. 1, 2007, provisional application No. 61/512,871, filed on Jul. 28, 2011.

(51) Int. Cl.
  *G06F 12/02* (2006.01)
  *G06F 13/16* (2006.01)
  *G06F 1/18* (2006.01)
  *G06F 12/06* (2006.01)
  *G06F 13/42* (2006.01)
  *G11C 7/10* (2006.01)
  *G11C 14/00* (2006.01)
  *G06F 3/06* (2006.01)
  *G06F 13/40* (2006.01)

(52) U.S. Cl.
  CPC .......... *G06F 3/0659* (2013.01); *G06F 3/0685* (2013.01); *G06F 12/0246* (2013.01); *G06F 12/0638* (2013.01); *G06F 13/1694* (2013.01); *G06F 13/4027* (2013.01); *G06F 13/4243* (2013.01); *G11C 7/1072* (2013.01); *G11C 14/0018* (2013.01); *G06F 2212/205* (2013.01); *G06F 2212/7208* (2013.01)

(58) Field of Classification Search
  CPC .... G06F 12/0246; G06F 1/185; G06F 3/0613; G06F 3/0685; G06F 3/0659; G06F 2212/7208; G06F 2212/205; G11C 7/1072; G11C 14/0018
  USPC .......................... 711/103, 104, 105; 710/138
  See application file for complete search history.

(56) References Cited

U.S. PATENT DOCUMENTS

| | | |
|---|---|---|
| 3,916,390 A | 10/1975 | Chang et al. |
| 4,234,920 A | 11/1980 | Ness et al. |
| 4,420,821 A | 12/1983 | Hoffman |
| 4,449,205 A | 5/1984 | Hoffman |
| 4,607,332 A | 8/1986 | Goldberg |
| 4,658,204 A | 4/1987 | Goodwin |
| 4,882,709 A | 11/1989 | Wyland |
| 4,884,242 A | 11/1989 | Lacy et al. |
| 4,965,828 A | 10/1990 | Ergott, Jr. et al. |
| 5,430,742 A | 7/1995 | Jeddeloh et al. |
| 5,444,664 A | 8/1995 | Kuroda et al. |
| 5,490,155 A | 2/1996 | Abdoo et al. |
| 5,519,663 A | 5/1996 | Harper, Jr. et al. |
| 5,519,831 A | 5/1996 | Holzhammer |
| 5,563,839 A | 10/1996 | Herdt et al. |
| 5,577,213 A | 11/1996 | Avery et al. |
| 5,619,644 A | 4/1997 | Crockett et al. |
| 5,630,096 A | 5/1997 | Zuravleff et al. |
| 5,675,725 A | 10/1997 | Malcolm |
| 5,757,712 A | 5/1998 | Nagel et al. |
| 5,799,200 A | 8/1998 | Brant et al. |
| 5,813,029 A | 9/1998 | Klein |
| 5,870,350 A | 2/1999 | Bertin et al. |
| 5,874,995 A | 2/1999 | Naimpally et al. |
| 5,890,192 A | 3/1999 | Lee et al. |
| 5,953,215 A | 9/1999 | Karabatsos |
| 5,991,885 A | 11/1999 | Chang et al. |
| 6,023,421 A | 2/2000 | Iadanza et al. |
| 6,026,465 A | 2/2000 | Mills et al. |
| 6,065,092 A | 5/2000 | Roy |
| 6,112,310 A | 8/2000 | Jun et al. |
| 6,145,068 A | 11/2000 | Lewis |
| 6,158,015 A | 12/2000 | Klein |
| 6,199,142 B1 | 3/2001 | Saulsbury et al. |
| 6,216,247 B1 | 4/2001 | Creta et al. |
| 6,269,382 B1 | 7/2001 | Cabrera et al. |
| 6,336,174 B1 | 1/2002 | Li et al. |
| 6,336,176 B1 | 1/2002 | Leyda et al. |
| 6,363,450 B1 | 3/2002 | Lash et al. |
| 6,421,279 B1 | 7/2002 | Tobita et al. |
| 6,459,647 B1 | 10/2002 | Kengeri |
| 6,487,102 B1 | 11/2002 | Halbert et al. |
| 6,487,623 B1 | 11/2002 | Emerson et al. |
| 6,571,244 B1 | 5/2003 | Larson |
| 6,614,685 B2 | 9/2003 | Wong |
| 6,658,507 B1 | 12/2003 | Chan |
| 6,691,209 B1 | 2/2004 | O'connell |
| 6,693,840 B2 | 2/2004 | Shimada et al. |
| 6,721,212 B2 | 4/2004 | Sasaki |
| 6,721,860 B2 | 4/2004 | Klein |
| 6,769,081 B1 | 7/2004 | Parulkar |
| 6,799,241 B2 | 9/2004 | Kahn et al. |
| 6,799,244 B2 | 9/2004 | Tanaka et al. |
| 6,810,513 B1 | 10/2004 | Vest |
| 6,816,982 B2 | 11/2004 | Ravid |
| 6,839,774 B1 | 1/2005 | Ahn et al. |
| 6,910,635 B1 | 6/2005 | Miks et al. |
| 6,944,042 B2 | 9/2005 | Komatsuzaki |
| 6,948,029 B2 | 9/2005 | Yano |
| 6,952,368 B2 | 10/2005 | Miura et al. |
| 7,053,470 B1 | 5/2006 | Sellers et al. |
| 7,062,618 B2 | 6/2006 | Tsunoda et al. |
| 7,089,412 B2 | 8/2006 | Chen |
| 7,102,391 B1 | 9/2006 | Sun et al. |
| 7,107,480 B1 | 9/2006 | Moshayedi et al. |
| 7,111,142 B2 | 9/2006 | Spencer et al. |
| 7,136,978 B2 | 11/2006 | Miura et al. |
| 7,155,627 B2 | 12/2006 | Matsui |
| 7,200,021 B2 | 4/2007 | Raghuram |
| 7,234,099 B2 | 6/2007 | Gower et al. |
| 7,353,325 B2 | 4/2008 | Lofgren et al. |
| 7,409,491 B2 | 8/2008 | Doblar et al. |
| 7,409,590 B2 | 8/2008 | Moshayedi et al. |
| 7,411,859 B2 | 8/2008 | Sohn et al. |
| 7,421,552 B2 | 9/2008 | Long |
| 7,467,251 B2 | 12/2008 | Park et al. |
| 7,519,754 B2 | 4/2009 | Wang et al. |
| 7,600,142 B2 | 10/2009 | Ichikawa |
| 7,613,877 B2 | 11/2009 | Shimozono et al. |
| 7,716,411 B2 | 5/2010 | Panabaker et al. |
| 7,818,488 B2 | 10/2010 | Park et al. |
| 7,873,750 B2 | 1/2011 | Yabuta et al. |
| 7,881,150 B2 | 2/2011 | Solomon et al. |
| 7,952,179 B2 | 5/2011 | Chiu et al. |
| 8,001,434 B1 | 8/2011 | Lee et al. |
| 8,081,536 B1 | 12/2011 | Solomon et al. |
| 8,086,955 B2 | 12/2011 | Zhou et al. |
| 8,102,614 B2 | 1/2012 | Song et al. |
| 8,214,616 B2 | 7/2012 | Ware et al. |
| 8,233,303 B2 | 7/2012 | Best et al. |
| 8,301,833 B1 | 10/2012 | Chen et al. |
| 8,407,395 B2 | 3/2013 | Kim et al. |
| 8,412,879 B2 | 4/2013 | Chang et al. |
| 8,516,187 B2 | 8/2013 | Chen et al. |
| 8,671,243 B2 | 3/2014 | Chen et al. |
| 8,677,060 B2 | 3/2014 | Chen et al. |
| 8,874,831 B2 | 10/2014 | Lee et al. |
| 8,880,791 B2 | 11/2014 | Chen et al. |
| 8,904,098 B2 | 12/2014 | Amidi et al. |
| 8,904,099 B2 | 12/2014 | Chen et al. |
| 9,043,677 B2 | 5/2015 | Kong et al. |
| 9,158,684 B2 | 10/2015 | Lee et al. |
| 9,361,250 B2 | 6/2016 | Shan et al. |

(56) References Cited

U.S. PATENT DOCUMENTS

| | | |
|---|---|---|
| 9,436,600 B2 | 9/2016 | Lee |
| 9,921,762 B2 | 3/2018 | Amidi et al. |
| 9,928,186 B2 | 3/2018 | Lee et al. |
| 2002/0053944 A1 | 5/2002 | Brass et al. |
| 2002/0083368 A1 | 6/2002 | Abe et al. |
| 2002/0199061 A1 | 12/2002 | Friedman et al. |
| 2003/0028733 A1 | 2/2003 | Tsunoda et al. |
| 2003/0076726 A1 | 4/2003 | Cowles et al. |
| 2003/0137881 A1 | 7/2003 | Sasaki |
| 2003/0147297 A1 | 8/2003 | Shiota et al. |
| 2003/0158995 A1 | 8/2003 | Lee et al. |
| 2003/0204776 A1 | 10/2003 | Testin |
| 2003/0206478 A1 | 11/2003 | Ayukawa et al. |
| 2003/0210601 A1 | 11/2003 | Lin et al. |
| 2004/0088508 A1 | 5/2004 | Ballard et al. |
| 2004/0163027 A1 | 8/2004 | MacLaren et al. |
| 2004/0190210 A1 | 9/2004 | Leete |
| 2005/0044302 A1 | 2/2005 | Pauley et al. |
| 2005/0060488 A1 | 3/2005 | Poechmueller |
| 2005/0132250 A1 | 6/2005 | Hansen et al. |
| 2005/0141273 A1 | 6/2005 | Park et al. |
| 2005/0144418 A1 | 6/2005 | Kita |
| 2005/0183472 A1 | 8/2005 | Choi |
| 2005/0204091 A1 | 9/2005 | Kilbuck et al. |
| 2005/0249011 A1 | 11/2005 | Maeda |
| 2005/0273548 A1 | 12/2005 | Roohparvar |
| 2006/0039197 A1 | 2/2006 | Khouri et al. |
| 2006/0069896 A1 | 3/2006 | Sanders |
| 2006/0080515 A1 | 4/2006 | Spiers et al. |
| 2006/0126369 A1 | 6/2006 | Raghuram |
| 2006/0212651 A1 | 9/2006 | Ashmore |
| 2006/0294295 A1 | 12/2006 | Fukuzo |
| 2007/0070669 A1 | 3/2007 | Tsern |
| 2007/0136523 A1* | 6/2007 | Bonella ............... G06F 9/4401 711/113 |
| 2007/0147115 A1 | 6/2007 | Lin et al. |
| 2007/0192627 A1 | 8/2007 | Oshikiri |
| 2007/0255898 A1 | 11/2007 | Nishide et al. |
| 2007/0276995 A1 | 11/2007 | Caulkins et al. |
| 2007/0288683 A1 | 12/2007 | Panabaker et al. |
| 2008/0104344 A1 | 5/2008 | Shimozono et al. |
| 2008/0126624 A1* | 5/2008 | Prete ....................... G11C 7/106 710/53 |
| 2008/0126690 A1 | 5/2008 | Rajan et al. |
| 2008/0147968 A1 | 6/2008 | Lee et al. |
| 2008/0189479 A1 | 8/2008 | Cope et al. |
| 2008/0195806 A1 | 8/2008 | Cope |
| 2008/0235443 A1 | 9/2008 | Chow et al. |
| 2008/0291727 A1 | 11/2008 | Seo et al. |
| 2009/0031099 A1 | 1/2009 | Sartore |
| 2009/0235038 A1 | 9/2009 | Sartore |
| 2010/0110748 A1 | 5/2010 | Best |
| 2010/0122200 A1 | 5/2010 | Merry, Jr. et al. |
| 2010/0274953 A1 | 10/2010 | Lee et al. |
| 2010/0322020 A1 | 12/2010 | Kim |
| 2011/0078496 A1 | 3/2011 | Jeddeloh |
| 2011/0161569 A1 | 6/2011 | Shan et al. |
| 2011/0320804 A1 | 12/2011 | Chan et al. |
| 2012/0110417 A1 | 5/2012 | Abreu et al. |
| 2012/0117402 A1 | 5/2012 | Machnicki et al. |
| 2012/0204079 A1 | 8/2012 | Takefman et al. |
| 2012/0265952 A1 | 10/2012 | Kurita |
| 2012/0271990 A1* | 10/2012 | Chen ....................... G06F 12/00 711/103 |
| 2012/0317433 A1 | 12/2012 | Ellis et al. |
| 2013/0019076 A1 | 1/2013 | Amidi et al. |
| 2013/0086309 A1 | 4/2013 | Lee et al. |
| 2013/0254456 A1 | 9/2013 | Chen et al. |
| 2013/0254497 A1 | 9/2013 | Chen et al. |
| 2014/0032820 A1 | 1/2014 | Harasawa et al. |
| 2014/0059170 A1 | 2/2014 | Gasparakis et al. |
| 2014/0156919 A1 | 6/2014 | Chen et al. |
| 2014/0156920 A1 | 6/2014 | Chen et al. |
| 2015/0058701 A1 | 2/2015 | Xing et al. |

FOREIGN PATENT DOCUMENTS

| | | |
|---|---|---|
| KR | 100606242 B1 | 7/2006 |
| WO | 2013016723 A2 | 1/2013 |

OTHER PUBLICATIONS

Exhibit, Decision Denying Institution of Inter Partes Review, *Smart Modular Technologies, Inc.* v. *Netlist, Inc.*, Case No. 4:13-cv-05889-YGR Document 309-4, filed Mar. 17, 2015, 20 pages.

Exhibit, Decision Denying Institution of Inter Partes Review, *Smart Modular Technologies, Inc.* v. *Netlist, Inc.*, Case No. 4:13-cv-05889-YGR Document 309-5, filed Mar. 17, 2015, 28 pages.

Exhibit, Decision Denying Institution of Inter Partes Review, *Smart Modular Technologies, Inc.* v. *Netlist, Inc.*, Case No. 4:13-cv-05889-YGR Document 309-9, filed Mar. 17, 2015,17 pages.

Exhibit, Institution of Inter Partes Review, *Sandisk Corporation* v. *Netlist, Inc.*, Case 4:13-cv-05889-YGR Document 316-9, filed Mar. 24, 2015, 29 pages.

Exhibit, Institution of Inter Partes Review, *Smart Modular Technologies, Inc.* v. *Netlist, Inc.*, Case 4:13-cv-05889-YGR Document 309-1, filed Mar. 17, 2015, 22 pages.

JEDEC Standard, Double Data Rate (DDR) SDRAM Specification, JESD79, Jun. 2000, 77 pages.

Exhibit, Letter sent via email on Dec. 6, 2013, Case 4:13-cv-03901-YGR Document 53-2, filed Jan. 6, 2014.

Exhibit, Order Denying Defendant's Motion to Stay Pending Inter Partes Review (Doc.59), *The Procter and Gamble Company* v. *Team Technologies, Inc, et al.*, Case 4:13-cv-05889-YGR Document 316-6, filed Mar. 24, 2015, 10 pages.

Exhibit, Patent Public Advisory Committee Quarterly Meeting, Appeals Statistics USPTO, Case No. 4:13-cv-05889-YGR Document 309-8, filed Mar. 17, 2015, 23 pages.

Exhibit, Reporter's Transcript of Proceedings, *Netlist, Inc* v. *Smart Modular Technologies, Inc., et al.*, Case 4:13-cv-05889-YGR Document 316-3, filed Mar. 24, 2015, 15 pages.

Exhibit, Transcript of Official Electronic Sound Recording Proceeding, *Netlist* v. *Smart Modular Technologies, Inc, et al.*, Case 4:13-cv-05889-YGR Document 305-7, filed Mar. 10, 2015, 10 pages.

File History for U.S. Appl. No. 12/240,916, filed Sep. 29, 2008, 320 pages.

File History for U.S. Appl. No. 13/905,048, filed May 29, 2013, 181 pages.

File History for U.S. Appl. No. 60/941,586, filed Jun. 1, 2007, 23 pages.

File History U.S. Pat. No. 8,671,243.

Final Office Action, dated Jun. 15, 2016, issued in U.S. Appl. No. 14/489,281, 10 pages.

Final Office Action, *SanDisk Corporation* v. *Netlist, Inc.*, U.S. Pat. No. 8,301,833, IPR2014-0099-1007 (PTAB), dated Feb. 1, 2012, 13 pages.

Final Written Decision, U.S. Pat. No. 8,671,243, IPR2017-00587-34, Paper No. 34, entered Jun. 20, 2018, 53 pages.

Final Written Decision, U.S. Pat. No. 8,874,831, IPR2017-00692, Paper No. 25, entered Jul. 5, 2018, 42 pages.

Final Written Decision, U.S. Pat. No. 7,881,150, Case No. Case IPR2014-00882, (PTAB), Paper 33, filed Dec. 14, 2015, 51 pages.

Hasan, J. et al. Efficient Use of Memory Bandwidth to Improve Network Processor Throughput, Proceedings of the 30th Annual International Symposium on Computer Architecture (ISCA'03), IEEE, 2003, 12 pages.

Inter Partes Review No. IPR2017-00692 (PTAB), U.S. Pat. No. 8,874,831, filed Jul. 26, 2012, 78 pages.

Inter Partes Review of U.S. Pat. No. 8,874,831, Case IPR2017-00692 (PTAB), filed Jul. 26, 2012, Paper No. 1, 78 pages.

International Preliminary Report on Patentabillity in PCT/US12/48750, dated Apr. 3, 2014pp. 1-8.

International Search Report and Written Opinion in PCT/US12/48750, dated Oct. 10, 2012pp. 1-10.

ISSCC 2006 / Session 7 / Non-Volatile Memory / 7.7, IEEE International Solid-State Circuits Conference, 2006, 10 pages.

(56) References Cited

OTHER PUBLICATIONS

Jacob, B., "Memory Systems Cache, DRAM, Disk", Morgan Kaufman Publishers, Burlington, MA, 2008, Preface and Ch. 7 pp. 315-322, 58 pages.
Jandhyala, S. et al., "Design-For-Test Analysis of a Buffered SDRAM DIMM", Semiconductor Group, Texas Instruments, Proceedings of International Workshop in Memory Technology, Design and Testing, Singapore, 13014, Aug. 1996,15 pages.
JEDEC Definition of DIMM, Exhibit 1029, IPR No. 2017-00587, Dec. 18, 2017, 2 pages.
JEDEC Global Standard for the Microelectronics Industry, Why JEDEC Standards Matter, 2014, 1 page.
JEDEC Standard No. 21-C (Release 17), Annex J: Serial Presence Detects for DDR2 SDRAM (Revision 1.3), 60 pages.
Petition for Inter Partes Review of U.S. Pat. No. 8,516,187 (on behalf of SMART Modular Technologies, Inc.), filed Aug. 22, 2014.
Petition for Inter Partes Review of U.S. Pat. No. 8,671,243, filed May 29, 2013.
Petition for Inter Partes Review of U.S. Pat. No. 8,874,831, filed Jul. 26, 2012.
Petition for Inter Partes Review of U.S. Pat. No. 8,301,833 (on behalf of SMART Modular Technologies, Inc.), filed Aug. 22, 2014.
U.S. Appl. No. 60/912,321, Case No. No. IPR2017-00692-1007 (PTAB), filed Apr. 17, 2017, 42 pages.
Petition for Inter Partes Review of U.S. Pat. No. 8,516,187, IPR2014-00982 (PTAB), dated Jun. 19, 2014, 67 pages.
Petition for Inter Partes Review of U.S. Pat. No. 8,671,243, Case No. IPR2017-00587-1(PTAB), May 29, 2013, 82 pages.
Petition for Inter Partes Review, *SanDisk Corporation* v. *Netlist, Inc.*, U.S. Pat. No. 8,301,833, IPR2014-00994 (PTAB), filed Jun. 20, 2014, 69 pages.
Webster's II New College Dictionary, Houghton Mifflin Company, Boston, MA, 2001, pp. 259, 1115.
Videotaped Deposition of Russel Jacob Baker, U.S. Pat. No. 8,671,243, Case Nos. IPR2017-00587-1030 (PTAB), filed Dec. 18, 2017, 268 pages.
Petitioners Demonstratives, *SK hynix Inc., et al.,* v. *Netlist, Inc.*, U.S. Pat. No. 8,671,243, IPR2017-00587-1037, 89 pages.
Petitioners' Reply in Support of its Motion to Exclude, U.S. Pat. No. 8,874,831, Case No. IPR2017-00692, filed Apr. 9, 2018, 8 pages.
Petitioners' Reply to Patent Owner's Response, Inter Partes Review No. IPR2017-00587-16, U.S. Pat. No. 8,671,243, filed Jan. 12, 2018, 38 pages.
Petitioners' Reply, U.S. Pat. No. 8,874,831, Case No. IPR2017-00692 (PTAB), Paper No. 15, filed Mar. 2, 2018, 35 pages.
Petitioners' Request for Hearing, U.S. Pat. No. 8,301,833, Case No. Case No. IPR2017-00649-2020 (PTAB), Paper No. 8, entered Aug. 23, 2017, 18 pages.
Prosecution History, U.S. Appl. No. 12/240,916, U.S. Pat. No. 8,301,833, *SK hynix Inc* v *Netlist Inc*, Case No. IPR2017-00649-1002 (PTAB), 320 pages.
Prosecution History, U.S. Appl. No. 13/559,476, U.S. Pat. No. 8,301,833, *SK hynix Inc* v *Netlist Inc*, Case No. IPR2017-00649-1002 (PTAB), 312 pages.
Prosecution History, U.S. Appl. No. 60/941,586, *SK hynix Inc* v *Netlist Inc*, Case No. IPR2017-00649-1005 (PTAB), 23 pages.
Provisional Application for Advance Dynamic Disk Memory Module, Specification, *SK hynix Inc.,* V. *Netlist, Inc.*, Case No. IPR2017-00649-1006 (PTAB), dated Dec. 8, 2005, 53 pages.
U.S. Appl. No. 60/912,321, filed Apr. 17, 2007.
U.S. Appl. No. 60/941,586, filed Jun. 1, 2007.
Requirement for Restriction Election, *SanDisk Corporation* v. *Netlist, Inc.*, U.S. Pat. No. 8,301,833, IPR2014-00994-1003 (PTAB), dated Mar. 31, 2019, 7 pages.
Restriction Requirement in U.S. Appl. No. 12/240,916, dated Mar. 31, 2011.
Search Report (Updated) Prior Art Search for U.S. Pat. No. 8,301,833, Global Patent Solutions, Nov. 24, 2020, 179 pages.
Search Report Prior Art Search for U.S. Pat. No. 8,301,833, Global Patent Solutions, Nov. 2, 2020, 38 pages.

Second Amended Answer and Counterclaims to Plaintiff's Complaint for Declaratory Judgment, *Diablo Technologies, Inc.* v. *Netlist, Inc.*, Case No. 4:13-CV-03901 (NDCA), YGR, filed Feb. 17, 2014, 21 pages.
Supplemental Declaration of Ronald H. Spuhler, *Netlist* v. *Smart Storage Systems, Inc. et. al.*, Case 4:13-cv-05889-YGR Document 305-1, filed Mar. 10, 2015, 2 pages.
U.S. Office Action in U.S. Appl. No. 13/536,173, dated Apr. 15, 2013, pp. 1-10.
U.S. Appl. No. 12/240,916, Case No. IPR2017-00692-2018 (PTAB), dated Sep. 29, 2008, 52 pages.
Third Amended Complaint for Patent Infringement, *Netlist* v. *Smart Storage Systems, Inc. et. al.*, Case 4:13-CV-05889-YGR (NDCA), filed Oct. 7, 2014, 21 pages.
Drawing by R. Jacob Bake regarding Address of DRAM and Flash, U.S. Pat. No. 8,671,243, Case IPR2017-00587-1023 (PTAB), filed Dec. 18, 2017, 1 page.
Advisory Action in U.S. Appl. No. 12/240,916, dated Mar. 13, 2012.
Amendment and Reply to Office Action, *SanDisk Corporation* v. *Netlist*, U.S. Appl. No. 13/536,173, IPR2014-00982 (PTAB), dated May 21, 2013, 24 pages.
Amendment and Response to Election Restriction, *SanDisk Corporation* v. *Netlist, Inc.*, U.S. Pat. No. 8,301,833, IPR2014-00994-1004 (PTAB), dated May 20, 2011, 9 pages.
American Heritage Dictionary of the English Language, Third Ed., Houghton Mifflin Company, Boston, MA, 1996, 7 pages.
Appeals from the USPTO, PTAB in Nos. IPR2014-00882, IPR2014-00883, IPR2014-01011, US Court of Appeals for the Federal Circuit, decided Jul. 25, 2017, 8 pages.
Charles C., Multiplexers and Demultiplexers, Ex. 1024, IPR No. 2017-00587-1024(PTAB), 2003, 8 pages.
Charles C., Multiplexers and Demultiplexers, Ex. 1033, IPR No. 2017-00587-1033 (PTAB), 2003, 8 pages.
Charles C., Multiplexers and Demultiplexers, Ex. 1034, IPR No. 2017-00587-1033 (PTAB), 2003, 8 pages.
Charles C., Multiplexers and Demultiplexers, Ex. 1035, IPR No. 2017-00587-1035 (PTAB), 2003, 8 pages.
Corrected Petition for Inter Partes Review of Claims 1-30 of U.S. Pat. No. 8,301,833, Declaration of Michael F. Heafey, IPR2014-01370 (PTAB), filed Sep. 22, 2014, 4 pages.
Corrected Petition for Inter Partes Review of Claims 1-32 of U.S. Pat. No. 8,516,187, IPR2014-01371 (PTAB), Sep. 22, 2014, 67 pages.
Corrected Petition for Inter Partes Review of Claims 1-32 of U.S. Pat. No. 8,516,187, Declaration of Dr. Nader Bagherzadeh, IPR2014-01371 (PTAB), filed Sep. 22, 2014, 306 pages.
Decision Denying Institution of Inter Partes Review, U.S. Pat. No. 8,516,187, IPR2014-01371 (PTAB), Paper 12, entered Mar. 13, 2015, 22 pages.
Decision Denying Institution of Inter Partes Review, *SanDisk Corporation* v. *Netlist, Inc.*, U.S. Pat. No. 8,301,833, IPR2014-00994 (PTAB), Paper 8, dated Dec. 16, 2014, 16 pages.
Decision Denying Institution of Inter Partes Review, *SanDisk Corporation* v. *Netlist*, U.S. Pat. No. 8,516,187, IPR2014-00982 (PTAB), Paper 9, dated Dec. 22, 2014, 16 pages.
Decision Denying Institution of Inter Partes Review, *Smart Modular Tech* v *Netlist Inc.*, U.S. Pat. No. 8,301,833, IPR2014-01370 (PTAB), Paper 13, entered Mar. 13, 2015, 19 pages.
Decision Instituting Inter Partes Review, U.S. Pat. No. 8,671,243, Case No. IPR2017-00587-7(PTAB), Paper No. 7, entered Jun. 22, 2017, 40 pages.
Declaration of R. Jacob Baker, U.S. Pat. No. 8,874,831, Case IPR2017-00692-2016 (PTAB), filed Nov. 10, 2017, 72 pages.
Declaration of R. Jacob Baker, U.S. Pat. No. 8,671,243, Case IPR2017-00587-2016 (PTAB), filed Oct. 13, 2019, 109 pages.
Declaration of Jeff McMullen, *Netlist, Inc.* v. *Diablo Technologies, Inc.*, Case No. 4: I 3-CV-05889-YGR (NDCA), Document 362-1, filed Sep. 5, 2018, 3 pages.
Declaration of Paul Min, In Inter Partes Review of U.S. Pat. No. 8,301,833, IPR2014-00994-1020 (PTAB), filed Sep. 29, 2008, 215 pages.

(56) References Cited

OTHER PUBLICATIONS

Declaration of Paul Min, In Inter Partes Review of U.S. Pat. No. 8,516,187, IPR2014-00982-1013 (PTAB), filed Jun. 28, 2012, pp. 240.
Declaration of Ron Maltiel, U.S. Pat. No. 8,671,243, No. IPR2017-00587-1003 (PTAB), filed May 29, 2013, 131 pages.
Declaration of Ron Maltiel, U.S. Pat. No. 8,874,831, No. IPR2017-00692-1003 (PTAB), filed Jul. 26, 2012 29, 172 pages.
Declaration of Steven J. Corr, *Netlist, Inc. v. SMART Storage Systems, Inc., et al.*, Case 4:13-cv-05889-YGR (NDCA), Document 305-8, filed Mar. 10, 2015, 3 pages.
Deposition of Baker, Exhibit 1030, p. 78, U.S. Pat. No. 8,671,243, *SK hynix Inc., et al. v. Netlist, Inc.*, Case No. IPR-2017-00587 (PTAB), filed Dec. 18, 2017, 268 pages.
Deposition of Ron Maltiel, U.S. Pat. No. 8,874,831, Case No. IPR2017-00692-2010 (PTAB), dated Sep. 27, 2017, 155 pages.
Joint Status Report Regarding Inter Partes Review, *Netlist v. Smart Storage Systems, Inc. et. al.*, Case No. 4:13-CV-05889-YGR (NDCA), filed Aug. 17, 2018, 4 pages.
Material Science & Engineering, Department of Material Science and Engineering, Stanford University, Exhibit 2011, Case No. IPR2017-00692, 2 pages.
Merriam-Webster's Collegiate Dictionary, Eleventh Ed., Merriam Webster Corporation, Springfield, MA, 2003, 7 pages.
Microsoft Computer Dictionary Fifth Edition, 2002, 3 pages.
Microsoft Computer Dictionary Fifth Edition, 2002, 9 pages.
Microsoft Press, Computer Dictionary, Second Edition, 1994, 4 pages.
Microsoft Windows 2000 Professional Resource Kit, 76 pages.
Notice of Allowance in U.S. Appl. No. 12/240,916, dated Sep. 17, 2012.
Notice of Allowance in U.S. Appl. No. 13/536,173, dated Jul. 2, 2013.
Notice of Allowance in U.S. Appl. No. 13/559,476, dated May 6, 2014.
Notice of Allowance in U.S. Appl. No. 13/559,476, dated Sep. 29, 2014.
Notice of Allowance in U.S. Appl. No. 13/905,048, dated Dec. 19, 2013, 8 pages.
Notice of Allowance in U.S. Appl. No. 13/905,053, dated Dec. 11, 2013.
Notice of Allowance in U.S. Appl. No. 14/173,219 dated Jul. 7, 2014.
Notice of Allowance in U.S. Appl. No. 14/489,269, dated Oct. 8, 2015.
Notice of Allowance, *SanDisk Corporation v. Netlist*, U.S. Appl. No. 13/536,173, IPR2014-00982 (PTAB), dated Jul. 2, 2013, 8 pages.
Office Action in U.S. Appl. No. 12/240,916, dated Apr. 3, 2012.
Office Action in U.S. Appl. No. 13/536,176, dated Apr. 15, 2013.
Office Action in U.S. Appl. No. 13/625,563, dated Aug. 5, 2013.
Office Action in U.S. Appl. No. 13/625,563, dated May 9, 2014.
Office Action in U.S. Appl. No. 13/905,048, dated Aug. 1, 2013.
Office Action in U.S. Appl. No. 13/905,053, dated Aug. 1, 2013.
Office Action in U.S. Appl. No. 14/173,219, dated Mar. 13, 2014.
Office Action in U.S. Appl. No. 14/302,292, dated Dec. 21, 2015.
Office Action in U.S. Appl. No. 12/240,916, dated Feb. 1, 2012, 14 pages.
Office Action in U.S. Appl. No. 14/173,242, dated Mar. 14, 2014, 7 pages.
Office Action, U.S. Appl. No. 12/240,916, IPR2014-0099-1005 (PTAB), dated Jul. 29, 2011, 8 pages.
Office Action, U.S. Appl. No. 12/240,916, IPR2014-0099-1010 (PTAB), dated Apr. 3, 2012, 11 pages.
Office Action, U.S. Appl. No. 13/536,173, IPR2014-00982 (PTAB), dated Apr. 15, 2013, 9 pages.
Patent Owner's Demonstratives, U.S. Pat. No. 8,671,243, Case No. IPR 2017-00587-2023, (PTAB), 57 pages.
Patent Owner's Listing of New Arguments and Evidence in Petitioners' Reply, U.S. Pat. No. 8,671,243, Case No. IPR2017-00587 (PTAB), filed Jan. 29, 2018, 6 pages.
Patent Owner's Opposition to Petitioners' Motion to Exclude, U.S. Pat. No. 8,874,831, Case No. IPR2017-00692 (PTAB), filed Apr. 2, 2018, 2017, 11 pages.
Patent Owner's Preliminary Response, U.S. Pat. No. 8,516,187, Case IPR2014-01371 (PTAB), filed Dec. 16, 2014, 66 pages.
Patent Owner's Preliminary Response, *SanDisk Corporation v. Netlist, Inc.*, U.S. Pat. No. 8,301,833, IPR2014-00994 (PTAB), Paper 8, dated Oct. 2, 2014, 60 pages.
Patent Owner's Preliminary Response, *SanDisk Corporation v. Netlist*, U.S. Pat. No. 8,516,187, IPR2014-00982 (PTAB), dated Sep. 26, 2014, 57 pages.
Patent Owner's Preliminary Response, *SK hynix Inc., et al.*, v. *Netlist*, U.S. Pat. No. 8,301,833, Case No. IPR2017-00649 (PTAB), filed May 1, 2017, 67 pages.
Patent Owner's Preliminary Response, *SK hynix Inc., et al.*, v. *Netlist*, U.S. Pat. No. 8,874,831, Case No. IPR2017-00692 (PTAB), filed May 1, 2017, 48 pages.
Patent Owner's Preliminary Response, *Smart Modular Tech v Netlist Inc.*, U.S. Pat. No. 8,301,833, Case IPR2014-01370 (PTAB), filed Dec. 16, 2014, 66 pages.
Patent Owner's Response, U.S. Pat. No. 8,671,243, Case No. IPR2017-00587-12 (PTAB), filed Oct. 13, 2017, 80 pages.
Patent Owner's Response, *SK hynix Inc., et al., v. Netlist*, U.S. Pat. No. 8,874,831, Case No. IPR2017-00692-12 (PTAB), filed Nov. 10, 2017, 77 pages.
Petition for Inter Partes Review of Claims 1-30 of U.S. Pat. No. 8,301,833, IPR2014-01370 (PTAB), filed Aug. 22, 2014, 68 pages.
Petition for Inter Partes Review of U.S. Pat. No. 8,301,833 (on behalf of SanDisk, Corp.), filed Jun. 20, 2014.
Petition for Inter Partes Review of U.S. Pat. No. 8,301,833, filed Sep. 29, 2008.
Petition for Inter Partes Review of U.S. Pat. No. 8,516,187 (on behalf of SanDisk, Corp.), filed Jun. 19, 2014.

\* cited by examiner

Spansion EcoRAM Configurations
256GB Spansion EcoRAM Solution – Single Accelerator 256GB Single Accelerator Spansion EcoRAM Solution 256GB Spansion EcoRAM Solution – Dual Accelerator 256GB Single Accelerator Spansion EcoRAM Solution

| DRAM density (GB) | # of blocks per bank | Flash wr-time to rd-time ratio | Avg block use time (sec) | Flash write time (sec) | Max allowed Closed Blk in queue to be written back to Flash |
|---|---|---|---|---|---|
| 1 | 250 | 55 | 1.00E-03 | 2.00E-02 | 0 |
| 1 | 250 | 55 | 1.00E-02 | 2.00E-02 | 2 |
| 1 | 250 | 55 | 2.00E-02 | 2.00E-02 | 5 |
| 1 | 250 | 55 | 5.00E-02 | 2.00E-02 | 11 |
| 2 | 500 | 55 | 1.00E-03 | 2.00E-02 | 0 |
| 2 | 500 | 55 | 1.00E-02 | 2.00E-02 | 5 |
| 2 | 500 | 55 | 2.00E-02 | 2.00E-02 | 9 |
| 2 | 500 | 55 | 5.00E-02 | 2.00E-02 | 23 |
| 4 | 1000 | 55 | 1.00E-03 | 2.00E-02 | 1 |
| 4 | 1000 | 55 | 1.00E-02 | 2.00E-02 | 9 |
| 4 | 1000 | 55 | 2.00E-02 | 2.00E-02 | 18 |
| 4 | 1000 | 55 | 5.00E-02 | 2.00E-02 | 45 |

*FIG. 11*

FLASH-DRAM HYBRID MEMORY MODULE

PRIORITY CLAIM

This application is a continuation of U.S. patent application Ser. No. 15/934,416, filed Mar. 23, 2018, titled "Flash-Dram Hybrid Memory Module," which is a continuation of U.S. patent application Ser. No. 14/840,865, filed Aug. 31, 2015, titled "Flash-Dram Hybrid Memory Module," now U.S. Pat. No. 9,928,186, which is a continuation of U.S. patent application Ser. No. 14/489,269, filed Sep. 17, 2014, titled "Flash-Dram Hybrid Memory Module," now U.S. Pat. No. 9,158,684, which is a continuation of U.S. patent application Ser. No. 13/559,476, filed Jul. 26, 2012, titled "Flash-Dram Hybrid Memory Module," now U.S. Pat. No. 8,874,831, which claims the benefit of U.S. Provisional Patent Application No. 61/512,871, filed Jul. 28, 2011, and is a continuation-in-part of U.S. patent application Ser. No. 12/240,916, filed Sep. 29, 2008, titled "Non-Volatile Memory Module," now U.S. Pat. No. 8,301,833, which is a continuation of U.S. patent application Ser. No. 12/131,873, filed Jun. 2, 2008, which claims the benefit of U.S. Provisional Patent Application No. 60/941,586, filed Jun. 1, 2007, the contents of all of which are incorporated herein by reference in their entirety.

This application may be considered related to U.S. patent application Ser. No. 14/173,242, titled "Isolation Switching For Backup Of Registered Memory," filed Feb. 5, 2014, which is a continuation of U.S. patent application Ser. No. 13/905,053, titled "Isolation Switching For Backup Of Registered Memory," filed May 29, 2013, now U.S. Pat. No. 8,677,060, issued Mar. 18, 2014, which is a continuation of U.S. patent application Ser. No. 13/536,173, titled "Data Transfer Scheme For Non-Volatile Memory Module," filed Jun. 28, 2012, now U.S. Pat. No. 8,516,187, issued Aug. 20, 2013, which is a divisional of U.S. patent application Ser. No. 12/240,916, titled "Non-Volatile Memory Module," filed Sep. 29, 2008, now U.S. Pat. No. 8,301,833, issued Oct. 30, 2012, which is a continuation of U.S. patent application Ser. No. 12/131,873, filed Jun. 2, 2008, now abandoned, which claims the benefit of U.S. Provisional Application No. 60/941,586, filed Jun. 1, 2007, the contents of which are incorporated by reference herein in their entirety.

This application may also be considered related to U.S. patent application Ser. No. 15/000,834, filed Jan. 19, 2016, which is a continuation of U.S. patent application Ser. No. 14/489,332, filed Sep. 17, 2014, now U.S. Pat. No. 9,269,437, which is a continuation of U.S. patent application Ser. No. 14/173,219, filed Feb. 5, 2014, now U.S. Pat. No. 8,904,099, which is a continuation of U.S. patent application Ser. No. 13/905,048, filed May 29, 2013, now U.S. Pat. No. 6,671,243, which is a continuation U.S. patent application Ser. No. 13/536,173 above.

This application may also be considered related to U.S. patent application Ser. No. 15/924,866, which is a continuation of U.S. patent application Ser. No. 14/489,281, filed Sep. 17, 2014, now U.S. Pat. No. 9,921,762, which is a continuation of U.S. patent application Ser. No. 13/625,563, filed Sep. 24, 2012, now U.S. Pat. No. 8,904,098, which claims the benefit of U.S. Provisional Application No. 61/583,775, filed Sep. 23, 2011.

TECHNICAL FIELD

The present disclosure relates generally to computer memory devices, and more particularly, to devices that employ different types of memory devices such as combinations of Flash and random access memories.

BACKGROUND

As technology advances and the usage of portable computing devices, such as tablet notebook computers, increases, more data needs to be transferred among data centers and to/from end users. In many cases, data centers are built by clustering multiple servers that are networked to increase performance.

Although there are many types of networked servers that are specific to the types applications envisioned, the basic concept is generally to increase server performance by dynamically allocating computing and storage resources. In recent years, server technology has evolved to be specific to particular applications such as 'finance transactions' (for example, point-of-service, inter-bank transaction, stock market transaction), 'scientific computation' (for example, fluid dynamic for automobile and ship design, weather prediction, oil and gas expeditions), 'medical diagnostics' (for example, diagnostics based on the fuzzy logic, medical data processing), 'simple information sharing and searching' (for example, web search, retail store website, company home page), 'email' (information distribution and archive), 'security service', 'entertainment' (for example, video-on-demand), and so on. However, all of these applications suffer from the same information transfer bottleneck due to the inability of a high speed CPU (central processing unit) to efficiently transfer data in and out of relatively slower speed storage or memory subsystems, particularly since data transfers typically pass through the CPU input/output (I/O) channels.

The data transfer limitations by the CPU are exemplified by the arrangement shown in FIG. 1, and apply to data transfers between main storage (for example the hard disk (HD) or solid state drive (SSD) and the memory subsystems (for example DRAM DIMM (Dynamic Random Access Memory Dual In-line Memory Module) connected to the front side bus (FSB)). In arrangements such as that of FIG. 1, the SSD/HD and DRAM DIMM of a conventional memory arrangement are connected to the CPU via separate memory control ports (not shown). FIG. 1 specifically shows, through the double-headed arrow, the data flow path between the computer or server main storage (SSD/HD) to the DRAM DIMMs. Since the SSD/HD data I/O and the DRAM DIMM data I/O are controlled by the CPU, the CPU needs to allocate its process cycles to control these I/Os, which may include the IRQ (Interrupt Request) service which the CPU performs periodically. As will be appreciated, the more time a CPU allocates to controlling the data transfer traffic, the less time the CPU has to perform other tasks. Therefore, the overall performance of a server will deteriorate with the increased amount of time the CPU has to expend in performing data transfer.

There have been various approaches to increase the data transfer throughput rates from/to the main storage, such as SSD/HD, to local storage, such as DRAM DIMM. In one example as illustrated in FIG. 2, EcoRAM™ developed by Spansion provides a storage SSD based system that assumes a physical form factor of a DIMM. The EcoRAM™ is populated with Flash memories and a relatively small memory capacity using DRAMs which serve as a data buffer. This arrangement is capable of delivering higher throughput rate than a standard SSD based system since the EcoRAM™ is connected to the CPU (central processing unit) via a high speed interface, such as the HT (Hyper Transport) interface, while an SSD/HD is typically connected via SATA (serial AT attachment), USB (universal serial bus), or PCI Express (peripheral component interface express). For example, the read random access throughput rate of EcoRAM™ is near 3 GB/s compared with 400 MB/s for a NAND SSD memory subsystem using the standard PCI Express-based. This is a 7.5× performance improvement. However, the performance improvement for write random access throughput rate is less than 2×(197 MBs for the EcoRAM vs. 104 MBs for NAND SSD). This is mainly due to the fact that the write speed is cannot be faster than the NAND Flash write access time. FIG. 2 is an example of EcoRAM™ using SSD with the form factor of a standard DIMM such that it can be connected to the FSB (front side bus). However, due to the interface protocol difference between DRAM and Flash, an interface device, EcoRAM Accelerator™), which occupies one of the server's CPU sockets is used, and hence further reducing server's performance by reducing the number of available CPU sockets available, and in turn reducing the overall computation efficiency. The server's performance will further suffer due to the limited utilization of the CPU bus due to the large difference in the data transfer throughput rate between read and write operations.

The EcoRAM™ architecture enables the CPU to view the Flash DIMM controller chip as another processor with a large size of memory available for CPU access.

In general, the access speed of a Flash based system is limited by four items: the read/write speed of the Flash memory, the CPU's FSB bus speed and efficiency, the Flash DIMM controller's inherent latency, and the HT interconnect speed and efficiency which is dependent on the HT interface controller in the CPU and Flash DIMM controller chip.

The published results indicate that these shortcomings are evident in that the maximum throughput rate is 1.56 GBs for the read operation and 104 MBs for the write operation. These access rates are 25% of the DRAM read access speed, and 1.7% of the DRAM access speed at 400 MHz operation. The disparity in the access speed (15 to 1) between the read operation and write operation highlight a major disadvantage of this architecture. The discrepancy of the access speed between this type of architecture and JEDEC standard DRAM DIMM is expected to grow wider as the DRAM memory technology advances much faster than the Flash memory.

Certain types of memory modules comprise a plurality of dynamic random-access memory (DRAM) devices mounted on a printed circuit board (PCB). These memory modules are typically mounted in a memory slot or socket of a computer system (e.g., a server system or a personal computer) and are accessed by the computer system to provide volatile memory to the computer system.

Volatile memory generally maintains stored information only when it is powered. Batteries have been used to provide power to volatile memory during power failures or interruptions. However, batteries may require maintenance, may need to be replaced, are not environmentally friendly, and the status of batteries can be difficult to monitor.

Non-volatile memory can generally maintain stored information while power is not applied to the non-volatile memory. In certain circumstances, it can therefore be useful to backup volatile memory using non-volatile memory.

OVERVIEW

Described herein is a memory module couplable to a memory controller of a host system. The memory module includes a non-volatile memory subsystem, a data manager coupled to the non-volatile memory subsystem, a volatile memory subsystem coupled to the data manager and operable to exchange data with the non-volatile memory subsystem by way of the data manager, and a controller operable to receive commands from the memory controller and to direct (i) operation of the non-volatile memory subsystem, (ii) operation of the volatile memory subsystem, and (iii) transfer of data between any two or more of the memory controller, the volatile memory subsystem, and the non-volatile memory subsystem based on at least one received command from the memory controller.

Also described herein is a method for managing a memory module by a memory controller, the memory module including volatile and non-volatile memory subsystems. The method includes receiving control information from the memory controller, wherein the control information is received using a protocol of the volatile memory subsystem. The method further includes identifying a data path to be used for transferring data to or from the memory module using the received control information, and using a data manager and a controller of the memory module to transfer data between any two or more of the memory controller, the volatile memory subsystem, and the non-volatile memory subsystem based on at least one of the received control information and the identified data path.

Also described herein is a memory module wherein the data manager is operable to control one or more of data flow rate, data transfer size, data buffer size, data error monitoring, and data error correction in response to receiving at least one of a control signal and control information from the controller.

Also described herein is a memory module wherein the data manager controls data traffic between any two or more of the memory controller, the volatile memory subsystem, and the non-volatile memory subsystem based on instructions received from the controller.

Also described herein is a memory module wherein data traffic control relates to any one or more of data flow rate, data transfer size, data buffer size, data transfer bit width, formatting information, direction of data flow, and the starting time of data transfer.

Also described herein is a memory module wherein the controller configures at least one of a first memory address space of the volatile memory subsystem and a second memory address space of the non-volatile memory subsystem in response to at least one of a received command from the memory controller and memory address space initialization information of the memory module.

Also described herein is a memory module wherein the data manager is configured as a bi-directional data transfer fabric having two or more sets of data ports coupled to any one of the volatile and non-volatile memory subsystems.

Also described herein is a memory module wherein at least one of the volatile and non-volatile memory subsystems comprises one or more memory segments.

Also described herein is a memory module wherein each memory segment comprises at least one memory circuit, memory device, or memory die.

Also described herein is a memory module wherein the volatile memory subsystem comprises DRAM memory.

Also described herein is a memory module wherein the non-volatile memory subsystem comprises flash memory.

Also described herein is a memory module wherein at least one set of data ports is operated by the data manager to independently and/or concurrently transfer data to or from one or more memory segments of the volatile or non-volatile memory subsystems.

Also described herein is a memory module wherein the data manager and controller are configured to effect data transfer between the memory controller and the non-volatile memory subsystem in response to memory access commands received by the controller from the memory controller.

Also described herein is a memory module wherein the volatile memory subsystem is operable as a buffer for the data transfer between the memory controller and non-volatile memory.

Also described herein is a memory module wherein the data manager further includes a data format module configured to format data to be transferred between any two or more of the memory controller, the volatile memory subsystem, and the non-volatile memory subsystem based on control information received from the controller.

Also described herein is a memory module wherein the data manager further includes a data buffer for buffering data delivered to or from the non-volatile memory subsystem.

Also described herein is a memory module wherein the controller is operable to perform one or more of memory address translation, memory address mapping, address domain conversion, memory access control, data error correction, and data width modulation between the volatile and non-volatile memory subsystems.

Also described herein is a memory module wherein the controller is configured to effect operation with the host system in accordance with a prescribed protocol.

Also described herein is a memory module wherein the prescribed protocol is selected from one or more of DDR, DDR2, DDR3, and DDR4 protocols.

Also described herein is a memory module wherein the controller is operable to configure memory space in the memory module based on at least one of a command received from the memory controller, a programmable value written into a register, a value corresponding to a first portion of the volatile memory subsystem, a value corresponding to a first portion of the non-volatile memory subsystem, and a timing value.

Also described herein is a memory module wherein the controller configures the memory space of the memory module using at least a first portion of the volatile memory subsystem and a first portion of the non-volatile memory subsystem, and the controller presents a unified memory space to the memory controller.

Also described herein is a memory module wherein the controller configures the memory space in the memory module using partitioning instructions that are application-specific.

Also described herein is a memory module wherein the controller is operable to copy booting information from the non-volatile to the volatile memory subsystem during power up.

Also described herein is a memory module wherein the controller includes a volatile memory control module, a non-volatile memory control module, data manager control module, a command interpreter module, and a scheduler module.

Also described herein is a memory module wherein commands from the volatile memory control module to the volatile memory subsystem are subordinated to commands from the memory controller to the controller.

Also described herein is a memory module wherein the controller effects pre-fetching of data from the non-volatile to the volatile memory.

Also described herein is a memory module wherein the pre-fetching is initiated by the memory controller writing an address of requested data into a register of the controller.

Also described herein is a memory module wherein the controller is operable to initiate a copy operation of data of a closed block in the volatile memory subsystem to a target block in the non-volatile memory subsystem.

Also described herein is a memory module wherein, if the closed block is re-opened, the controller is operable to abort the copy operation and to erase the target block from the non-volatile memory subsystem.

Also described herein is a method for managing a memory module wherein the transfer of data includes a bidirectional transfer of data between the non-volatile and the volatile memory subsystems.

Also described herein is a method for managing a memory module further comprising operating the data manager to control one or more of data flow rate, data transfer size, data width size, data buffer size, data error monitoring, data error correction, and the starting time of the transfer of data.

Also described herein is a method for managing a memory module further comprising operating the data manager to control data traffic between the memory controller and at least one of the volatile and non-volatile memory subsystems.

Also described herein is a method for managing a memory module wherein data traffic control relates to any one or more of data transfer size, formatting information, direction of data flow, and the starting time of the transfer of data.

Also described herein is a method for managing a memory module wherein data traffic control by the data manager is based on instructions received from the controller.

Also described herein is a method for managing a memory module further comprising operating the data manager as a bi-directional data transfer fabric with two or more sets of data ports coupled to any one of the volatile and non-volatile memory subsystems.

Also described herein is a method for managing a memory module wherein at least one of the volatile and non-volatile memory subsystems comprises one or more memory segments.

Also described herein is a method for managing a memory module wherein each memory segment comprises at least one memory circuit, memory device, or memory die.

Also described herein is a method for managing a memory module wherein the volatile memory subsystem comprises DRAM memory.

Also described herein is a method for managing a memory module wherein the non-volatile memory subsystem comprises Flash memory.

Also described herein is a method for managing a memory module further comprising operating the data ports to independently and/or concurrently transfer data to or from one or more memory segments of the volatile or non-volatile memory subsystems.

Also described herein is a method for managing a memory module further comprising directing transfer of data bi-directionally between the volatile and non-volatile memory subsystems using the data manager and in response to memory access commands received by the controller from the memory controller.

Also described herein is a method for managing a memory module further comprising buffering the data transferred between the memory controller and non-volatile memory subsystem using the volatile memory subsystem.

Also described herein is a method for managing a memory module further comprising using the controller to perform one or more of memory address translation, memory address mapping, address domain conversion, memory access control, data error correction, and data width modulation between the volatile and non-volatile memory subsystems.

Also described herein is a method for managing a memory module further comprising using the controller to effect communication with a host system by the volatile memory subsystem in accordance with a prescribed protocol.

Also described herein is a method for managing a memory module wherein the prescribed protocol is selected from one or more of DDR, DDR2, DDR3, and DDR4 protocols.

Also described herein is a method for managing a memory module further comprising using the controller to configure memory space in the memory module based on at least one of a command received from the memory controller, a programmable value written into a register, a value corresponding to a first portion of the volatile memory subsystem, a value corresponding to a first portion of the non-volatile memory subsystem, and a timing value.

Also described herein is a method for managing a memory module wherein the controller configures the memory space of the memory module using at least a first portion of the volatile memory subsystem and a first portion of the non-volatile memory subsystem, and the controller presents a unified memory space to the memory controller.

Also described herein is a method for managing a memory module wherein the controller configures the memory space in the memory module using partitioning instructions that are application-specific.

Also described herein is a method for managing a memory module further comprising using the controller to copy booting information from the non-volatile to the volatile memory subsystem during power up.

Also described herein is a method for managing a memory module wherein the controller includes a volatile memory control module, the method further comprising generating commands by the volatile memory control module in response to commands from the memory controller, and transmitting the generated commands to the volatile memory subsystem.

Also described herein is a method for managing a memory module further comprising pre-fetching of data from the non-volatile memory subsystem to the volatile memory subsystem.

Also described herein is a method for managing a memory module wherein the pre-fetching is initiated by the memory controller writing an address of requested data into a register of the controller.

Also described herein is a method for managing a memory module further comprising initiating a copy operation of data of a closed block in the volatile memory subsystem to a target block in the non-volatile memory subsystem.

Also described herein is a method for managing a memory module further comprising aborting the copy operation when the closed block of the volatile memory subsystem is re-opened, and erasing the target block in the non-volatile memory subsystem.

Also described herein is a memory system having a volatile memory subsystem, a non-volatile memory subsystem, a controller coupled to the non-volatile memory subsystem, and a circuit coupled to the volatile memory subsystem, to the controller, and to a host system. In a first mode of operation, the circuit is operable to selectively isolate the controller from the volatile memory subsystem, and to selectively couple the volatile memory subsystem to the host system to allow data to be communicated between the volatile memory subsystem and the host system. In a second mode of operation, the circuit is operable to selectively couple the controller to the volatile memory subsystem to allow data to be communicated between the volatile memory subsystem and the nonvolatile memory subsystem using the controller, and the circuit is operable to selectively isolate the volatile memory subsystem from the host system.

Also described herein is a method for operating a memory system. The method includes coupling a circuit to a host system, a volatile memory subsystem, and a controller, wherein the controller is coupled to a non-volatile memory subsystem. In a first mode of operation that allows data to be communicated between the volatile memory subsystem and the host system, the circuit is used to (i) selectively isolate the controller from the volatile memory subsystem, and (ii) selectively couple the volatile memory subsystem to the host system. In a second mode of operation that allows data to be communicated between the volatile memory subsystem and the nonvolatile memory subsystem via the controller, the circuit is used to (i) selectively couple the controller to the volatile memory subsystem, and (ii) selectively isolate the volatile memory subsystem from the host system.

Also described herein is a nontransitory computer readable storage medium storing one or more programs configured to be executed by one or more computing devices. The programs, when executing on the one or more computing devices, cause a circuit that is coupled to a host system, to a volatile memory subsystem, and to a controller that is coupled to a nonvolatile memory subsystem, to perform a method in which, in a first mode of operation that allows data to be communicated between the volatile memory subsystem and the host system, operating the circuit to (i) selectively isolate the controller from the volatile memory subsystem, and (ii) selectively couple the volatile memory subsystem to the host system. In a second mode of operation that allows data to be communicated between the volatile memory subsystem and the nonvolatile memory subsystem via the controller, operating the circuit to (i) selectively couple the controller to the volatile memory subsystem, and (ii) selectively isolate the volatile memory subsystem from the host system.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings:

FIG. 11 is a table showing estimates of the maximum allowed closed blocks in a queue to be written back to Flash memory for different DRAM densities using various average block use time.

DESCRIPTION OF EXAMPLE EMBODIMENTS

Figure 1:
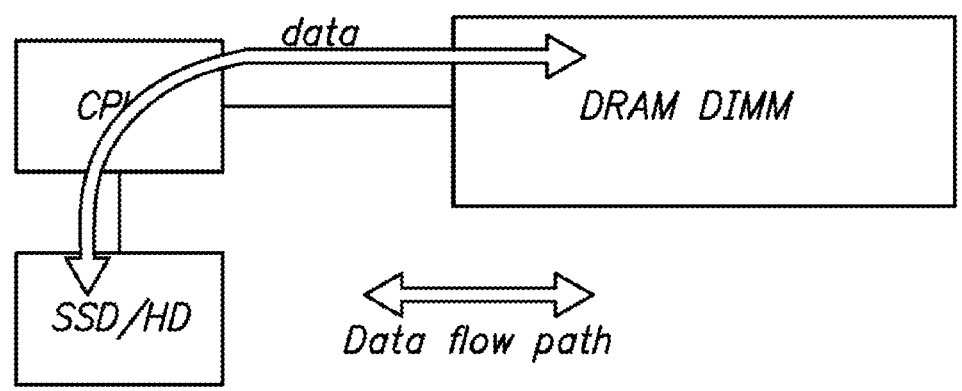
FIG. 1 is a block diagram illustrating the path of data transfer, via a CPU, of a conventional memory arrangement.

Example embodiments are described herein in the context of a system of computers, servers, controllers, memory modules, hard disk drives and software. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used to the extent possible throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Eraseable Programmable Read Only Memory), Flash memory, Jump Drive, and the like), magnetic storage medium (e.g., tape, magnetic disk drive, and the like), optical storage medium (e.g., CD-ROM, DVD-ROM, paper card, paper tape and the like) and other types of program memory.

The term "exemplary" where used herein is intended to mean "serving as an example, instance or illustration." Any embodiment described herein as "exemplary" is not necessarily to be construed as preferred or advantageous over other embodiments.

Disclosed herein are arrangements for improving memory access rates and addressing the high disparity (15 to 1 ratio) between the read and write data throughput rates. In one arrangement, a Flash-DRAM-hybrid DIMM (FDHDIMM) with integrated Flash and DRAM is used. Methods for controlling such an arrangement are described.

In certain embodiments, the actual memory density (size or capacity) of the DIMM and/or the ratio of DRAM memory to Flash memory are configurable for optimal use with a particular application (for example, POS, inter-bank transaction, stock market transaction, scientific computation such as fluid dynamics for automobile and ship design, weather prediction, oil and gas expeditions, medical diagnostics such as diagnostics based on the fuzzy logic, medical data processing, simple information sharing and searching such as web search, retail store website, company home page, email or information distribution and archive, security service, and entertainment such as video-on-demand).

In certain embodiments, the device contains a high density Flash memory with a low density DRAM, wherein the DRAM is used as a data buffer for read/write operation. The Flash serves as the main memory. Certain embodiments described herein overcome the needs of having a long separation period between an Activate command (may be referred to as RAS) and a corresponding read or write command (may be referred to as first CAS command).

Figure 3A:
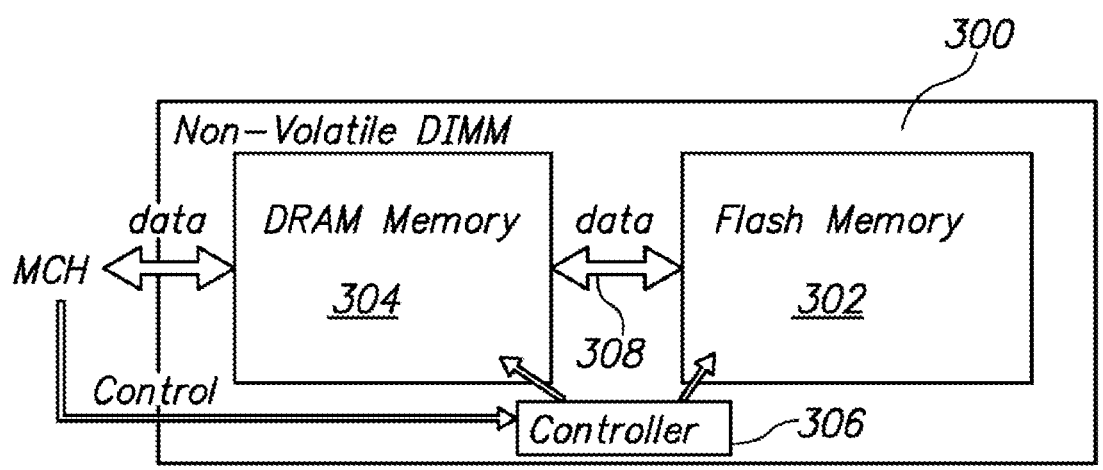
FIGS. 3A and 3B are block diagrams of a non-volatile memory DIMM or NVDIMM.
Figure 2:
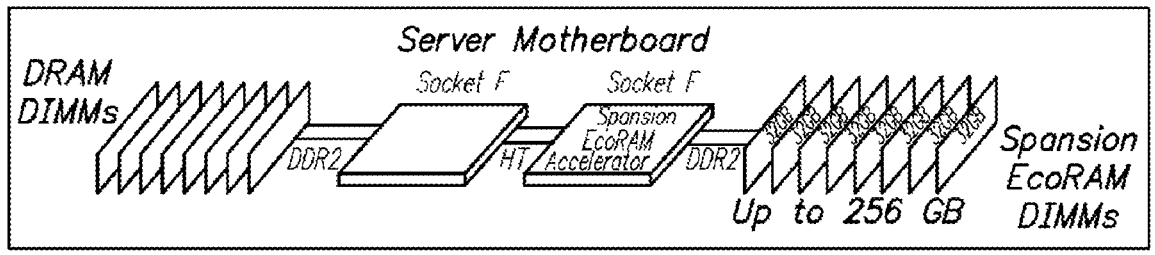
FIG. 2 is a block diagram of a known EcoRAM™ architecture.
Figure 2:
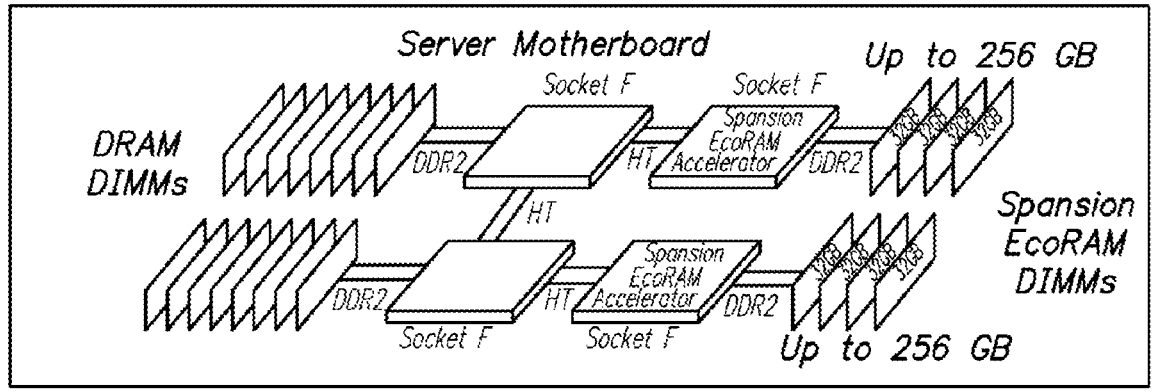
Figure 3B:
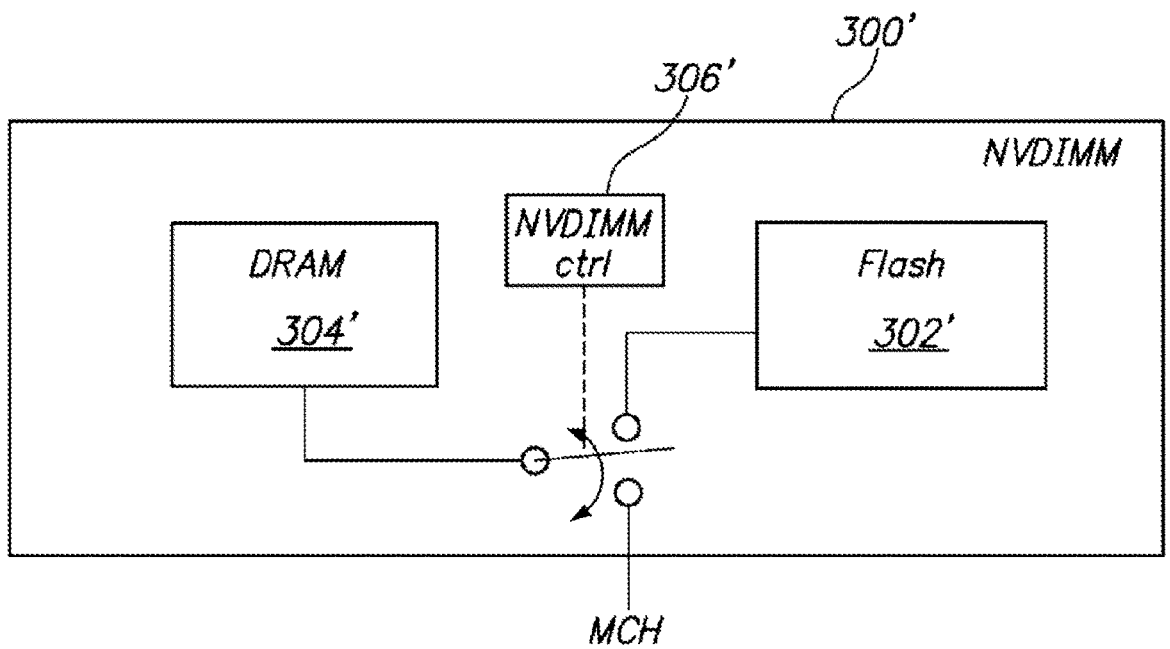

In accordance with one embodiment, described with reference to FIGS. 3A and 3B, a memory system 300 includes a non-volatile (for example Flash) memory subsystem 302 and a volatile (for example DRAM) memory subsystem 304. The examples of FIGS. 3A and 3B are directed to architectures of a non-volatile DIMM (NVDIMM) NVDIMM system that may use a power subsystem (not shown) that can include a battery or a capacitor as a means for energy storage to copy DRAM memory data into Flash memory when power loss occurs, is detected, or is anticipated to occur during operation. When normal power is restored, a restore NVDIMM operation is initiated and the data stored in the Flash memory is properly restored to the DRAM memory. In this architecture, the density of the Flash is about the same as the DRAM memory size or within a few multiples, although in some applications it may be higher. This type of architecture may also be used to provide non-volatile storage that is connected to the FSB (front side bus) to support RAID (Redundant Array of Independent Disks) based systems or other type of operations. An NVDIMM controller 306 receives and interprets commands from the system memory controller hub (MCH). The NVDIMM controller 306 control the NVDIMM DRAM and Flash memory operations. In FIG. 3A, the DRAM 304 communicates data with the MCH, while an internal bus 308 is used for data transfer between the DRAM and Flash memory subsystems. In FIG. 3B, the NVDIMM controller 306' of NVDIMM 300' monitors events or commands and enables data transfer to occur in a first mode between the DRAM 304' and Flash 302' or in a second mode between the DRAM and the MCH.

Figure 4B:
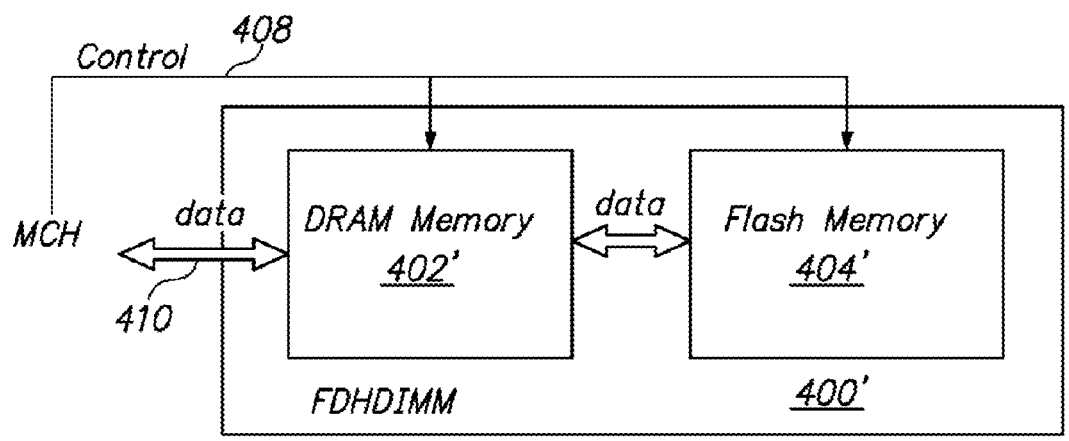
FIGS. 4A and 4B are block diagrams of a Flash-DRAM hybrid DIMM or FDHDIMM.
Figure 4A:
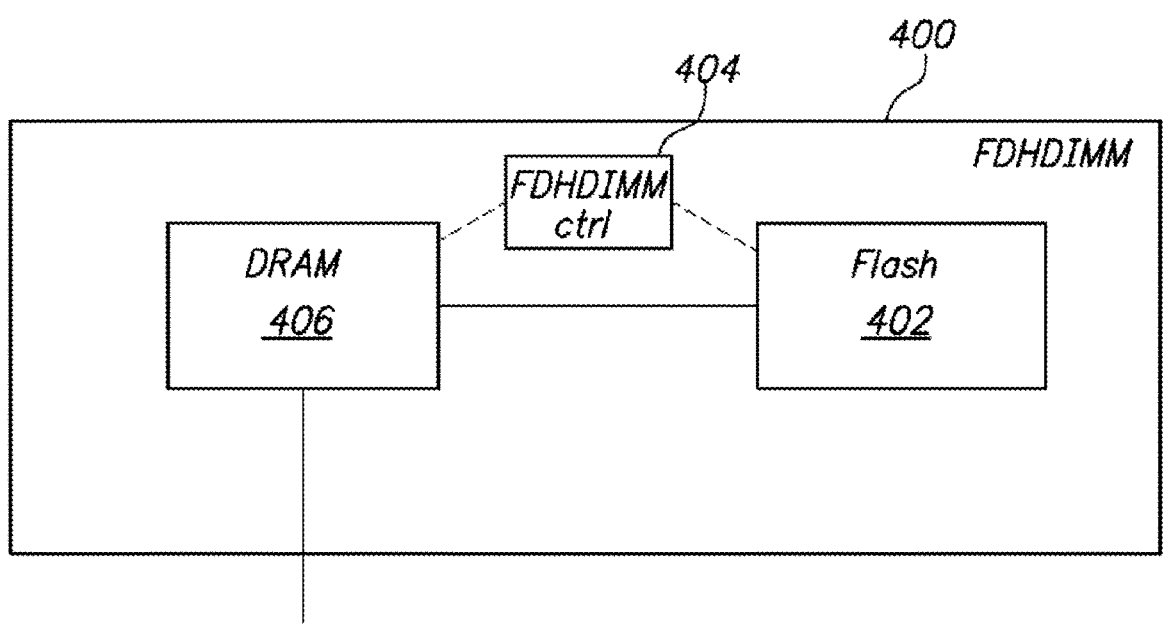

In accordance with one embodiment, a general architecture for a Flash and DRAM hybrid DIMM (FDHDIMM) system 400 is shown in FIG. 4A. The FDHDIMM interfaces with an MCH (memory controller hub) to operate and behave as a high density DIMM, wherein the MCH interfaces with the non-volatile memory subsystem (for example Flash) 402 is controlled by an FDHDIMM controller 404. Although the MCH interfaces with the Flash via the FDHDIMM controller, the FDHDIMM overall performance is governed by the Flash access time. The volatile memory subsystem (for example DRAM) 406 is primarily used as a data buffer or a temporary storage location such that data from the Flash memory 402 is transferred to the DRAM 406 at the Flash access speed, and buffered or collected into the DRAM 406, which then transfers the buffered data to the MCH based on the access time of DRAM. Similarly, when the MCH transfers data to the DRAM 406, the FDHDIMM controller 404 manages the data transfer from the DRAM 406 to the Flash 402. Since the Flash memory access speed (both read and write) is relatively slower than DRAM, (e.g. for example a few hundred microseconds for read access), the average data throughput rate of FDHDIMM 400 is limited by the Flash access speed. The DRAM 406 serves as a data buffer stage that buffers the MCH read or write data. Thus, the DRAM 406 serves as a temporary storage for the data to be transferred from/to the Flash 402. Furthermore, in accordance with one embodiment, the MCH recognizes the physical density of an FDHDIMM operating as a high density DIMM as the density of Flash alone.

In accordance with one embodiment, a read operation can be performed by the MCH by sending an activate command (may be simply referred to as RAS, or row address strobe) to the FDHDIMM 400 to conduct a pre-fetch read data operation from the Flash 402 to the DRAM 406, with the pre-fetch data size being for example a page (1 KB or 2 KB, or may be programmable to any size). The MCH then sends a read command (may be simply referred to as CAS, or column address strobe) to read the data out input of the DRAM. In this embodiment, the data transfer from Flash to DRAM occurs at Flash access speed rates, while data transfer from DRAM to MCH occurs at DRAM access speed rates. In this example, data latency and throughput rates are the same as any DRAM operation as long as the read operations are executed onto the pages that were opened with the activate command previously sent to pre-fetch data from the Flash to DRAM. Thus, a longer separation time period between the RAS (e.g. Activate command) and the first CAS (column address strobe e.g. read or write command) is required to account for the time it takes to pre-fetch data from the Flash to DRAM.

An example of FDHDIMM operating as a DDR DIMM with SSD is shown in FIG. 4B, wherein the FDHDIMM 400' supports two different interface interpretations to the MCH. In the first interface interpretation, the MCH views the FDHDIMM 400' as a combination of DRAM DIMM and SSD (not illustrated). In this mode the MCH needs to manage two address spaces, one for the DRAMs 402' and one for the Flash 404'. The MCH is coupled to, and controls, both of the DRAM and Flash memory subsystems. One advantage of this mode is that the CPU does not need to be in the data path when data is moved from DRAM to Flash or from Flash to DRAM. In the second interface interpretation, the MCH views the FDHDIMM 400' as an on-DIMM Flash with the SSD in an extended memory space that is behind the DRAM space. Thus, in this mode, the MCH physically fetches data from the SSD to the DDR DRAM and then the DRAM sends the data to the MCH. Since all data movement occurs on the FDHDIMM, this mode will provide better performance than if the data were to be moved through or via the CPU.

In accordance with one embodiment and as shown in FIG. 4B, the FDHDIMM 400' receives control signals 408 from the MCH, where the control signals may include one or more control signals specifically for the DRAM 402' operation and one or more control signals specifically for the Flash 404' operation. In this embodiment, the MCH or CPU is coupled to the FDHDIMM via a single data bus interface 410 which couples the MCH to the DRAM.

Figure 5A:
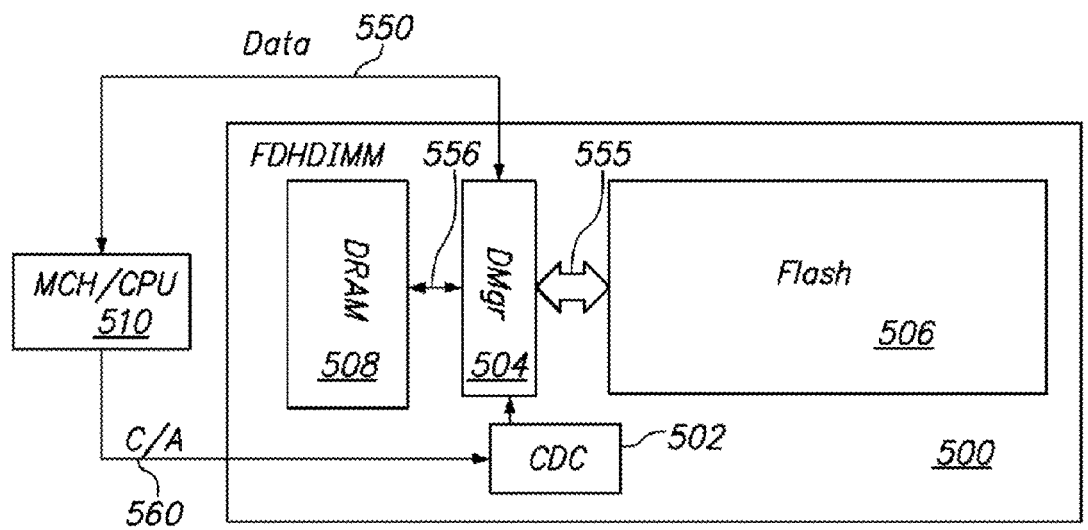
FIG. 5A is a block diagram of a memory module 500 in accordance with certain embodiments described herein.
Figure 5B:
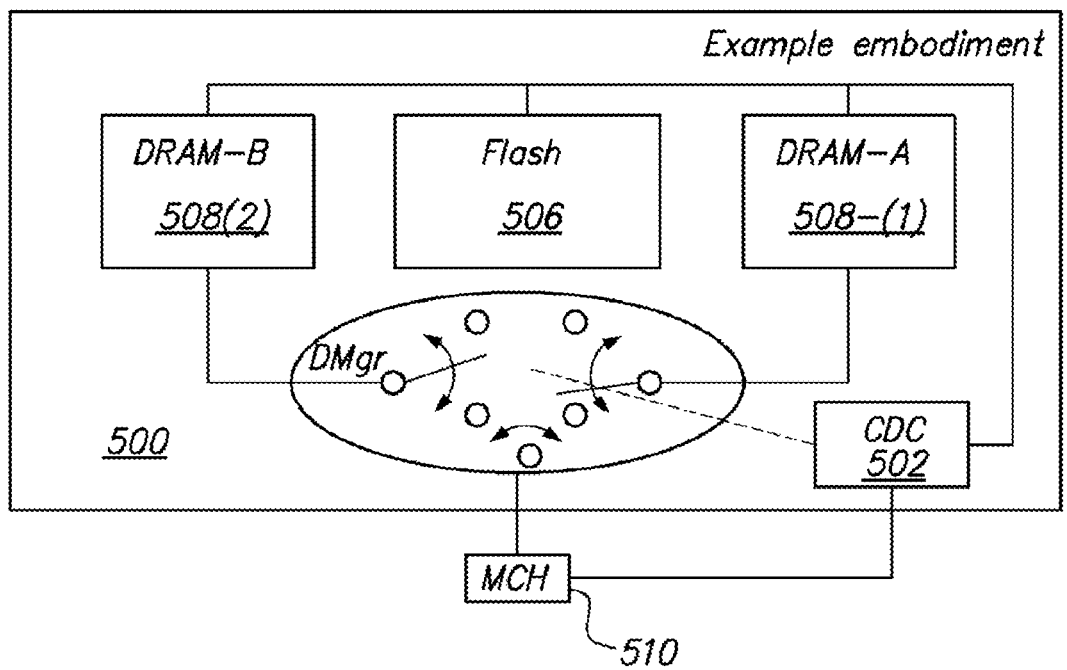
FIG. 5B is a block diagram showing some functionality of a memory module such as that shown in FIG. 5A.

FIGS. 5A and 5B are block diagrams of a memory module 500 that is couplable to a host system (not shown). The host system may be a server or any other system comprising a memory system controller or an MCH for providing and controlling the read/write access to one or more memory systems, wherein each memory system may include a plurality of memory subsystems, a plurality of memory devices, or at least one memory module. The term "read/write access" means the ability of the MCH to interface with a memory system or subsystem in order to write data into it or read data from it, depending on the particular requirement at a particular time.

In certain embodiments, memory module 500 is a Flash-DRAM hybrid memory subsystem which may be integrated with other components of a host system. In certain embodiments, memory module 500 is a Flash-DRAM hybrid memory module that has the DIMM (dual-inline memory module) form factor, and may be referred to as a FDHDIMM, although it is to be understood that in both structure and operation it may be different from the FDHDIMM discussed above and described with reference to FIGS. 4A and 4B. Memory module 500 includes two on-module intermediary components: a controller and a data manager. These on-module intermediary components may be physically separate components, circuits, or modules, or they may be integrated onto a single integrated circuit or device, or integrated with other memory devices, for example in a three dimensional stack, or in any one of several other possible expedients for integration known to those skilled in the art to achieve a specific design, application, or economic goal. In the case of a DIMM, these on-module intermediary components are an on-DIMM Controller (CDC) 502 and an on-DIMM data manager (DMgr) 504. While the DIMM form factor will predominate the discussion herein, it should be understood that this is for illustrative purposes only and memory systems using other form factors are contemplated as well. CDC 502 and data manager DMgr 504 are operative to manage the interface between a non-volatile memory subsystem such as a Flash 506, a volatile memory subsystem such as a DRAM 508, and a host system represented by MCH 510.

In certain embodiments, CDC 502 controls the read/write access to/from Flash memory 506 from/to DRAM memory 508, and to/from DRAM memory from/to MCH 510.

Read/write access between DRAM 508, Flash 506 and MCH 510 may be referred to herein generally as communication, wherein control and address information C/A 560 is sent from MCH 510 to CDC 502, and possible data transfers follow as indicated by Data 550, Data 555, and/or Data 556. In certain embodiments, the CDC 502 performs specific functions for memory address transformation, such as address translation, mapping, or address domain conversion, Flash access control, data error correction, manipulation of data width or data formatting or data modulation between the Flash memory and DRAM, and so on. In certain embodiments, the CDC 502 ensures that memory module 500 provides transparent operation to the MCH in accordance with certain industry standards, such as DDR, DDR2, DDR3, DDR4 protocols. In the arrangement shown in FIGS. 5A and 5B, there is no direct access from the MCH 510 to the Flash 506 memory subsystem. Thus in accordance with certain embodiments, the Flash access speed has minimal impact on the overall FDHDIMM access speed. In the schematic illustration of FIG. 5B and in accordance with one embodiment, the CDC controller 502 receives standard DDR commands from the MCH, interprets, and produces commands and/or control signals to control the operation of the Data manager (DMgr), the Flash memory and the DRAM memory. The DMgr controls the data path routing amongst DRAMs, Flash and MCH, as detailed below. The data path routing control signals are independently operated without any exclusivity.

Figure 6:
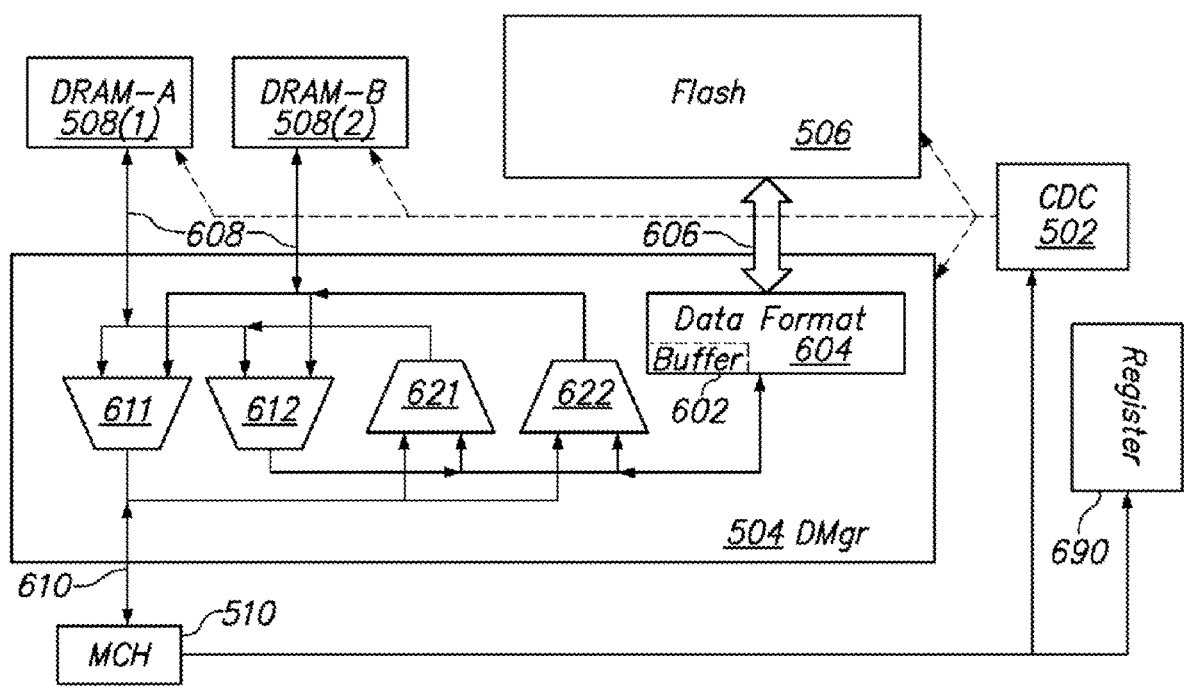
FIG. 6 is a block diagram showing some details of the data manager (DMgr)

An exemplary role of DMgr 504 is described with reference to FIG. 6. In certain embodiments and in response to communication from CDC 502, DMgr 504 provides a variety of functions to control data flow rate, data transfer size, data buffer size, data error monitoring or data error correction. For example, these functions or operations can be performed on-the-fly (while data is being transferred via the DMgr 504) or performed on buffered or stored data in DRAM or a buffer. In addition, one role of DMgr 504 is to provide interoperability among various memory subsystems or components and/or MCH 510.

In one embodiment, an exemplary host system operation begins with initialization. The CDC 502 receives a first command from the MCH 510 to initialize FDHDIMM 500 using a certain memory space. The memory space as would be controlled by MCH 510 can be configured or programmed during initialization or after initialization has completed. The MCH 510 can partition or parse the memory space in various ways that are optimized for a particular application that the host system needs to run or execute. In one embodiment, the CDC 502 maps the actual physical Flash 506 and DRAM 508 memory space using the information sent by MCH 510 via the first command. In one embodiment, the CDC 502 maps the memory address space of any one of the Flash 506 and DRAM 508 memory subsystems using memory address space information that is received from the host system, stored in a register within FDHDIMM 500, or stored in a memory location of a non-volatile memory subsystem, for example a portion of Flash 506 or a separate non-volatile memory subsystem. In one embodiment, the memory address space information corresponds to a portion of initialization information of the FDHDIMM 500.

In one embodiment, MCH 510 may send a command to restore a certain amount of data information from Flash 506 to DRAM 508. The CDC 502 provides control information to DMgr 504 to appropriately copy the necessary information from Flash 506 to the DRAM 508. This operation can provide support for various host system booting operations and/or a special host system power up operation.

In one embodiment, MCH 510 sends a command which may include various fields comprising control information regarding data transfer size, data format options, and/or startup time. CDC 502 receives and interprets the command and provides control signals to DMgr 504 to control the data traffic between the Flash 506, the DRAM 508, and the MCH 510. For example, DMgr 504 receives the data transfer size, formatting information, direction of data flow (via one or more multiplexers such as 611, 612, 621, 622 as detailed below), and the starting time of the actual data transfer from CDC 502. DMgr 504 may also receive additional control information from the CDC 502 to establish a data flow path and/or to correctly establish the data transfer fabric. In certain embodiments, DMgr 504 also functions as a bi-directional data transfer fabric. For example, DMgr 504 may have more than 2 sets of data ports facing the Flash 506 and the DRAM 508. Multiplexers 611 and 612 provide controllable data paths from any one of the DRAMs 508(1) and 508(2) (DRAM-A and DRAM-B) to any one of the MCH 510 and the Flash 506. Similarly multiplexers 621 and 622 provide controllable data paths from any one of the MCH and the Flash memory to any one of the DRAMs 508(1) and 508(2) (DRAM-A and DRAM-B). In one embodiment, DRAM 508(1) is a segment of DRAM 508, while in other embodiments, DRAM 508(1) is a separate DRAM memory subsystem. It will be understood that each memory segment can comprise one or more memory circuits, a memory devices, and/or memory integrated circuits. Of course other configurations for DRAM 508 are possible, and other data transfer fabrics using complex data paths and suitable types of multiplexing logic are contemplated.

In accordance with one embodiment, the two sets of multiplexors 611, 612 and 621, 622 allow independent data transfer to Flash 506 from DRAM-A 508(1) and DRAM-B 508(2). For example, in response to one or more control signals or a command from CDC 502, DMgr 504 can transfer data from DRAM-A 508(1) to MCH 510, via multiplexer 611, at the same time as from DRAM-B 508(2)

to the Flash 506, via multiplexer 612; or data is transferred from DRAM-B 508(2) to MCH 510, via multiplexer 611, and simultaneously data is transferred from the Flash 506 to DRAM-A 508(1), via multiplexer 621. Further, in the same way that data can be transferred to or from the DRAM in both device-wide or segment-by-segment fashion, data can be transferred to or from the flash memory in device-wide or segment-by-segment fashion, and the flash memory can be addressed and accessed accordingly.

In accordance with one embodiment the illustrated arrangement of data transfer fabric of DMgr 504 also allows the CDC 502 to control data transfer from the Flash memory to the MCH by buffering the data from the Flash 506 using a buffer 602, and matching the data rate and/or data format of MCH 510. The buffer 602 is shown in FIG. 6 as a portion of a data format module 604; however, buffer 602 may also be a distributed buffer such that one buffer is used for each one of the set of multiplexer logic elements shown as multiplexers 611, 612, 621, and 622. Various buffer arrangements may be used, such as a programmable size buffer to meet the requirement of a given system design requirement, for example the disparity between read/write access time; or overall system performance, for example latency. In certain embodiments, the buffer 604 may introduce one or more clock cycle delays into a data communication path between MCH 510, DRAM 508, and Flash 506.

In certain embodiments, data format module 604 contains a data formatting subsystem (not shown) to enable DMgr 504 to format and perform data transfer in accordance with control information received from CDC502. Data buffer 604 of data format module 602, discussed above, also supports a wide data bus 606 coupled to the Flash memory 506 operating at a first frequency, while receiving data from DRAM 508 using a relatively smaller width data bus 608 operating at a second frequency, the second frequency being larger than the first frequency in certain embodiments. The buffer 602 is designed to match the data flow rate between the DRAM 508 and the Flash 506.

A register 690 provides the ability to register commands received from MCH 510 via C/A 560 (FIG. 5A). The register 690 may communicate these commands to CDC 502 and/or to the DRAM 508 and/or Flash 506. The register 690 communicates these registered commands to CDC 502 for processing. The register 690 may also include multiple registers (not shown), such that it can provide the ability to register multiple commands, a sequence of commands, or provide a pipeline delay stage for buffering and providing a controlled execution of certain commands received form MCH 510.

In certain embodiments, the register 690 may register commands from MCH 510 and transmit the registered commands to DRAM 508 and/or Flash 506 memory subsystems. In certain embodiments, the CDC 502 monitors commands received from MCH 510, via control and address bus C/A 560, and provides appropriate control information to DMgr 504, DRAM 508, or Flash 506 to execute these commands and perform data transfer operations between MCH 510 and FDHDIMM 500 via MCH data bus 610.

Figure 7:
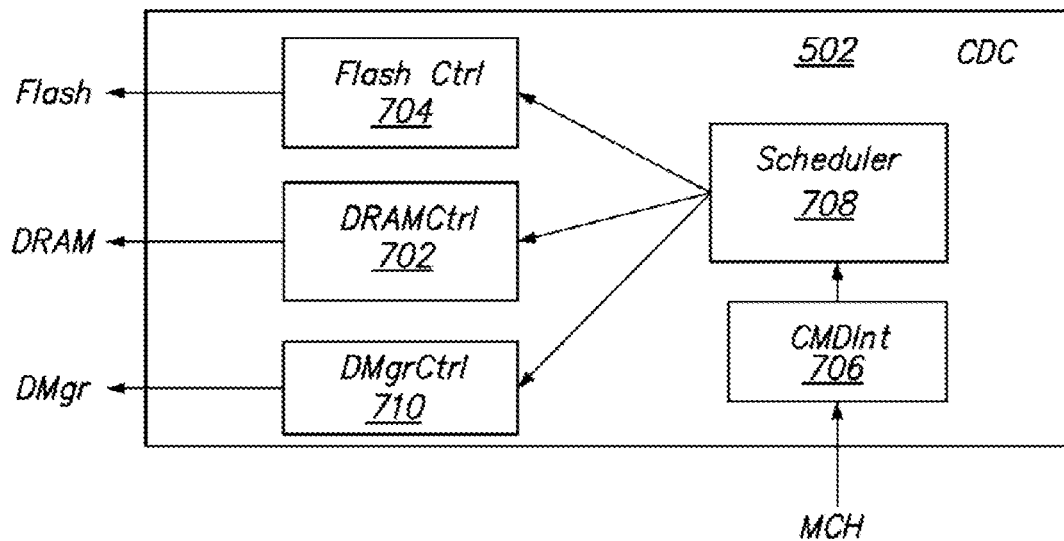
FIG. 7 is a functional block diagram of the on-module controller (CDC)

FIG. 7 illustrates a functional block diagram of the CDC 502. In certain embodiments, the major functional blocks of the CDC 502 are a DRAM control block DRAMCtrl 702, Flash control block FlashCtrl 704, MCH command interpreter CmdInt 706, DRAM-Flash interface scheduler Scheduler 708, and DMgr control block (DMgrCtrl) 710.

In accordance with one embodiment, DRAMCtrl 702 generates DRAM commands that are independent from the commands issued by the MCH 510. In accordance with one embodiment, when the MCH 510 initiates a read/write operation from/to the same DRAM 508 that is currently executing a command from the DRAMCtrl 702, then the CDC 502 may choose to instruct DRAMCtrl 702 to abort its operation in order to execute the operation initiated by the MCH. However, the CDC 502 may also pipeline the operation so that it causes DRAMCtrl 702 to either halt or complete its current operation prior to executing that of the MCH. The CDC 502 may also instruct DRAMCtrl 702 to resume its operation once the command from MCH 510 is completed.

In accordance with one embodiment, the FlashCtrl 704 generates appropriate Flash commands for the proper read/write operations. The CmdInt 706 intercepts commands received from MCH 510 and generates the appropriate control information and control signals and transmit them to the appropriate FDHDIMM functional block. For example, CmdInt 706 issues an interrupt signal to the DRAMCtrl 702 when the MCH issues a command that collides (conflicts) with the currently executing or pending commands that DRAMCtrl 702 has initiated independently from MCH 510, thus subordinating these commands to those from the MCH. The Scheduler 708 schedules the Flash-DRAM interface operation such that there is no resource conflict in the DMgr 504. In accordance with one embodiment, the Scheduler 708 assigns time slots for the DRAMCtrl 702 and FlashCtrl 704 operation based on the current status and the pending command received or to be received from the MCH. The DMgrCtrl 710 generates and sends appropriate control information and control signals for the proper operation and control of the data transfer fabric to enable or disable data paths between Flash 506, DRAM 508, and the MCH 510.

Figure 8A:
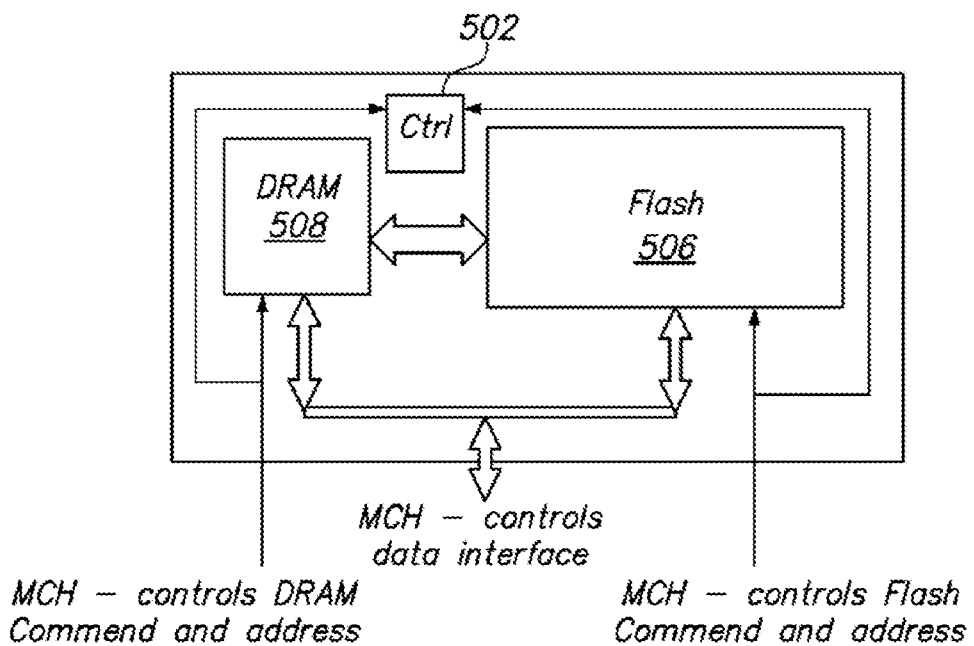
FIG. 8A is a block diagram showing more details of the prior art Flash-DRAM hybrid DIMM (FDHDIMM) of FIGS. 4A and 4B.

FIG. 8A is a block diagram showing a Flash-DRAM hybrid DIMM (FDHDIMM). As seen from FIG. 8A, this Flash-DRAM hybrid DIMM requires two separate and independent address buses to separately control the address spaces: one for the Flash memory Flash 506 and the other for the DRAM memory DRAM 508. The MCH treats the DRAM 508 and Flash 506 as separate memory subsystems, for example DRAM and SSD/HD memory subsystems. The memory in each address space is controlled directly by the MCH. However, the on-DIMM data path between Flash 506 and DRAM 508 allows for direct data transfer to occur between the Flash 506 and the DRAM 508 in response to control information from Ctrl 502. In this embodiment, this data transfer mechanism provides direct support for executing commands from the MCH without having the MCH directly controlling the data transfer, and thus improving data transfer performance from Flash 506 to the DRAM 508. However, the MCH needs to manage two address spaces and two different memory protocols simultaneously. Moreover, the MCH needs to map the DRAM memory space into the Flash memory space, and the data interface time suffers due to the difference in the data access time between the Flash memory and the DRAM memory.

Figure 8B:
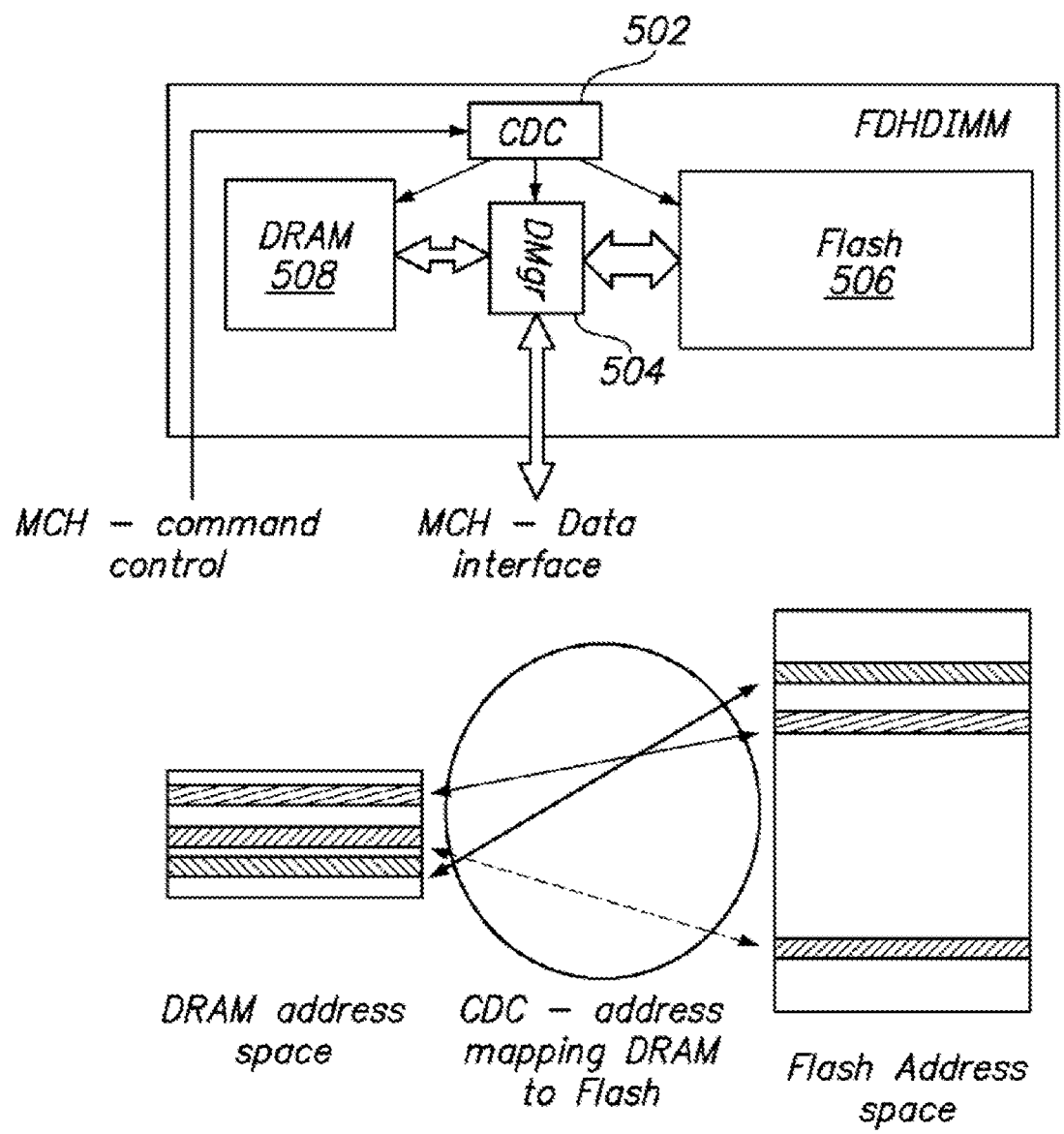
FIG. 8B is a block diagram of a Flash-DRAM hybrid DIMM (FDHDIMM) in accordance with certain embodiments disclosed herein.

In accordance with one embodiment, a memory space mapping of a Flash-DRAM hybrid DIMM is shown in FIG. 8B. A memory controller of a host system (not shown) controls both of the DRAM 508 address space and the Flash 506 address space using a single unified address space. The CDC 502 receives memory access commands from the MCH and generates control information for appropriate mapping and data transfer between Flash and DRAM memory subsystem to properly carry out the memory access commands. In one embodiment, the memory controller of the host system views the large Flash memory space as a DRAM memory space, and accesses this unified memory space with a standard DDR (double data rate) protocol used for accessing DRAM. The unified memory space in this case can exhibit overlapping memory address space between the Flash 506 and the DRAM 508. The overlapping memory address space may be used as a temporary storage or buffer for data transfer between the Flash 506 and the DRAM 508. For example, the DRAM memory space may hold a copy of data from the selected Flash memory space such that the MCH can access this data normally via DDR memory access commands. The CDC 502 controls the operation of the Flash 506 and DRAM 508 memory subsystems in response to commands received from a memory controller of a host system.

In one embodiment, the unified memory space corresponds to a contiguous address space comprising a first portion of the address space of the Flash 506 and a first portion of the address space of the DRAM 508. The first portion of the address space of the Flash 506 can be determined via a first programmable register holding a first value corresponding to the desired Flash memory size to be used. Similarly, the first portion of the address space of the DRAM 508 can be determined via a second programmable register holding a second value corresponding to the desired DRAM memory size to be used. In one embodiment, any one of the first portion of the address space of the Flash 506 and the first portion of the address space of the DRAM 508 is determined via a first value corresponding to a desired performance or memory size, the first value being received by the CDC 502 via a command sent by memory controller of the host system.

Figure 9:
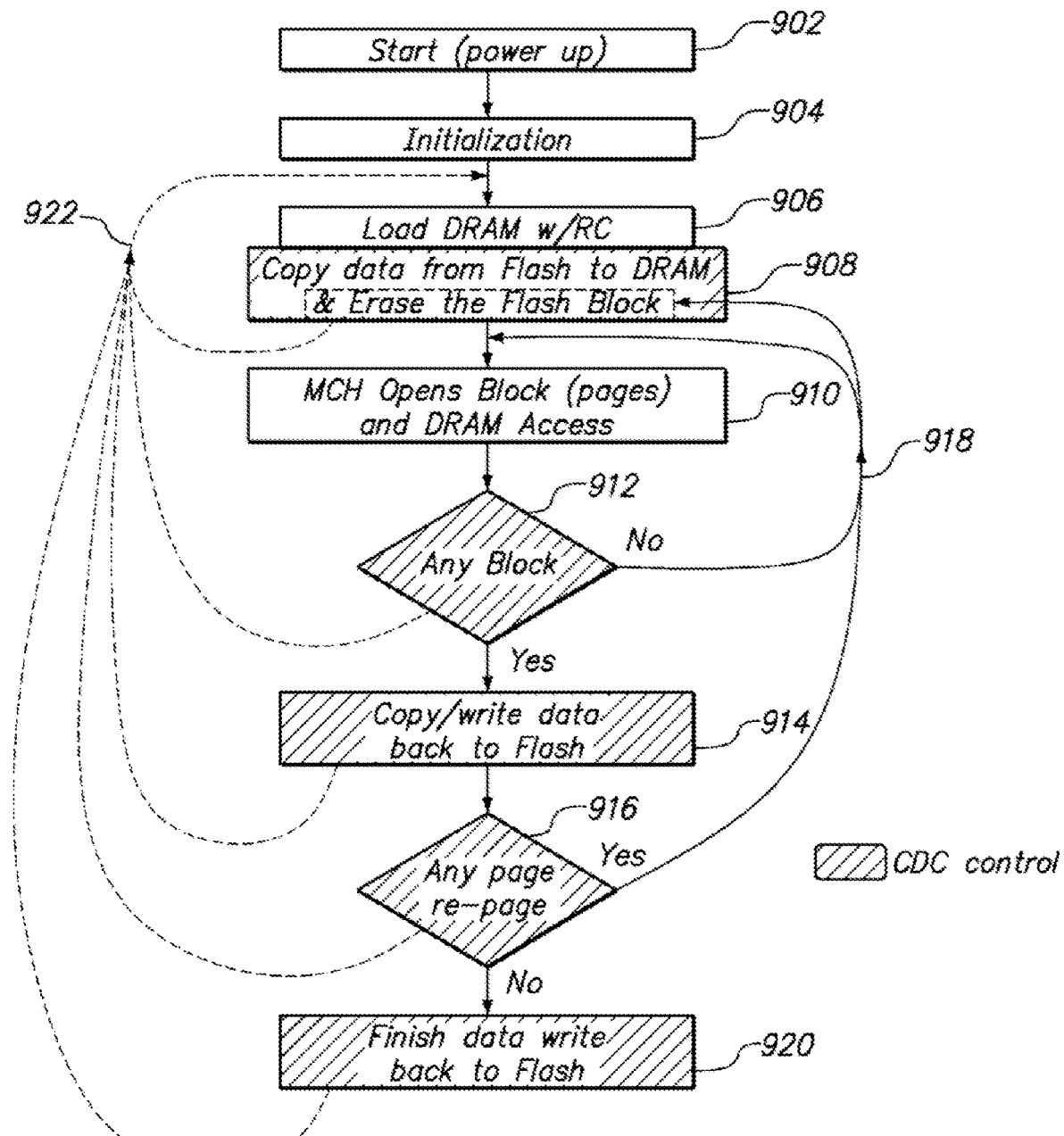
FIG. 9 is a flow diagram directed to the transfer of data from Flash memory to DRAM memory and vice versa in an exemplary FDHDIMM.

In accordance with one embodiment, a flow diagram directed to the transfer of data from Flash memory to DRAM memory and vice versa in an exemplary FDHDIMM is shown in FIG. 9. In certain embodiments, data transfer from the Flash 506 to the DRAM 508 occurs in accordance with memory access commands which the CDC 502 receives from the memory controller of the host system. In certain embodiments, the CDC 502 controls the data transfer from the DRAM 508 to the Flash 506 so as to avoid conflict with any memory operation that is currently being executed. For example, when all the pages in a particular DRAM memory block are closed. The CDC 502 partitions the DRAM memory space into a number of blocks for the purpose of optimally supporting the desired application. The controller can configure memory space in the memory module based on at least one of one or more commands received from the MCH, instructions received from the MCH, a programmable value written into a register, a value corresponding to a first portion of the volatile memory subsystem, a value corresponding to a first portion of the non-volatile memory subsystem, and a timing value. Furthermore, the block size can be configurable by the memory controller of the host system, such that the number pages in a block can be optimized to support a particular application or a task. Furthermore, the block size may be configured on-the-fly, e.g. CDC 502 can receive instruction regarding a desired block size from the memory controller via a memory command, or via a programmable value.

In certain embodiments, a memory controller can access the memory module using a standard access protocol, such as JEDEC's DDR DRAM, by sending a memory access command to the CDC 502 which in turn determines what type of a data transfer operation it is and the corresponding target address where the data information is stored, e.g. data information is stored in the DRAM 508 or Flash 506 memory subsystems. In response to a read operation, if the CDC 502 determines that data information, e.g. a page (or block), does not reside in the DRAM 508 but resides in Flash 506, then the CDC 502 initiates and controls all necessary data transfer operations from Flash 506 to DRAM 508 and subsequently to the memory controller. In one embodiment, once the CDC 502 completes the data transfer operation of the requested data information from the Flash 506 to the DRAM 508, the CDC 502 alerts the memory controller to retrieve the data information from the DRAM 508. In on embodiment, the memory controller initiates the copying of data information from Flash 506 to DRAM 508 by writing, into a register in the CDC 502, the target Flash address along with a valid block size. The CDC 502 in turn, executes appropriate operations and generates control information to copy the data information to the DRAM 508. Consequently, the memory controller can access or retrieve the data information using standard memory access commands or protocol.

An exemplary flow chart is shown in FIG. 9, a starting step or power up 902, is followed by an initialization step 904, the memory controller initiates, at step 906, a data move from the Flash 506 to the DRAM 508 by writing target address and size, to a control register in the CDC 502, which then copies, at 908, data information from the Flash 506 to the DRAM 508 and erases the block in the Flash. Erasing the data information from Flash may be accomplished independently from (or concurrently with) other steps that CDC 502 performs in this flow chart, i.e. other steps can be executed concurrently with the Erase the Flash block step. Once the data information or a block of data information is thus moved to the DRAM 508, the memory controller can operate on this data block using standard memory access protocol or commands at 910. The CDC 502 checks, at 912, if any of the DRAM 508 blocks, or copied blocks, are closed. If the memory controller closed any open blocks in DRAM 508, then the CDC 502 initiate a Flash write to write the closed block from the DRAM 508 to the Flash 506, at 914. In addition, the memory controller, at 916, reopens the closed block that is currently being written into the Flash 506, then the CDC 502 stops the Flash write operation and erases the Flash block which was being written to, as shown at 918. Otherwise, the CDC 502 continues and completes the writing operation to the Flash at 920.

The dashed lines in FIG. 9 indicate independent or parallel activities that can be performed by the CDC 502. At any time the CDC 502 receives a DRAM load command from a memory controller which writes a Flash target address and/or block size information into the RC register(s) at 922, as described above, then the CDC 502 executes a load DRAM w/RC step 906 and initiates another branch (or a thread) of activities that includes steps 908-922. In one embodiment, the CDC 502 controls the data transfer operations between DRAM 508 and Flash 506 such that the Flash 506 is completely hidden from the memory controller. The CDC 502 monitors all memory access commands sent by the memory controller using standard DRAM protocol and appropriately configures and manipulate both Flash 506 and DRAM 508 memory subsystems to perform the requested memory access operation and thus achieve the desired results. The memory controller does not interface directly with the Flash memory subsystem. Instead, the memory controller interfaces with the CDC 502 and/or DMgr 504 as shown in FIG. 5 and FIG. 6. Moreover, the memory controller may use one or more protocol, such as DDR, DDR2, DDR3, DDR4 protocols or the like.

Figure 10:
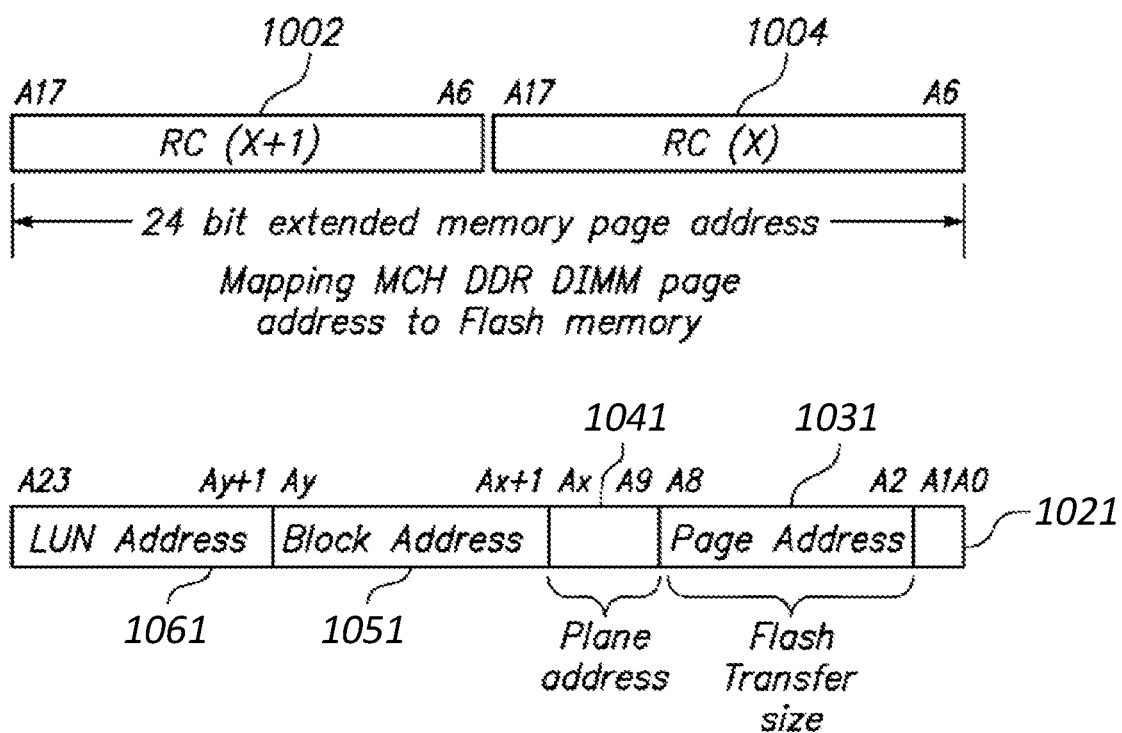
FIG. 10 is a block diagram showing an example of mapping of DRAM address space to Flash memory address space.

In accordance with one embodiment, an example of mapping a DRAM address space to Flash memory address space is shown in FIG. 10. Two sets (1002, 1004) of address bits AD6 to AD17, forming a 24 bit extended memory page address, are allocated for the block address. For example, assuming a Block size of 256K Bytes, then a 24-bit block address space (using the two sets of AD6 to AD17 1002 and 1004) would enable access to 4 TB of Flash memory storage space. If a memory module has 1 GB of DRAM storage capacity, then it can hold approximately 4K Blocks of data in the DRAM memory, each Block comprise 256 K Bytes of data. The DRAM address space, corresponding to the 4K blocks, can be assigned to different virtual ranks and banks, where the number of virtual ranks and banks is configurable and can be manipulated to meet a specific design or performance needs. For example, if a 1G Bytes memory module is configured to comprise two ranks with eight banks per rank, then each bank would hold two hundred fifty (250) blocks or the equivalent of 62 M Bytes or 62K pages, where each page correspond to a 1K Bytes. Other configurations using different page, block, banks, or ranks numbers may also be used. Furthermore, an exemplary mapping of 24-bit DDR DIMM block address to Flash memory address, using Block addressing as described above, is shown in FIG. 10. The 24-bit can be decomposed into fields, such as a logical unit number LUN address 1061 field, a Block address 1051 field, a Plane address 1041, a Page address 1031, and a group of least significant address bits $A_0A_1$ 1021. The Plane address 1041 is a sub address of the block address, and it may be used to support multiple page IO so as to improve Flash memory subsystem operation. In this example, it is understood that different number of bits may be allocated to each field of the 24-bit The CDC 502 manages the block write-back operation by queuing the blocks that are ready to be written back to the Flash memory. As described above, if any page in a queued block for a write operation is reopened, then the CDC 502 will stop the queued block write operation, and remove the block from the queue. Once all the pages in a block are closed, then the CDC 502 restarts the write-back operation and queue the block for a write operation.

In accordance with one embodiment, an exemplary read operation from Flash 506 to DRAM 508 can be performed in approximately 400 µs, while a write operation from DRAM 508 to Flash 506 can be performed in approximately 22 ms resulting in a read to write ratio of 55 to 1. Therefore, if the average time a host system's memory controller spends accessing data information in a Block of DRAM is about 22 ms (that is the duration that a Block comprises one or more pages that are open), then the block write-back operation from DRAM to Flash would not impact performance and hence the disparity between read and write access may be completely hidden from the memory controller. If the block usage time is 11 ms instead of 22 ms, then the CDC 502 control the data transfer operation between DRAM 508 and Flash 506 such that there are no more than 9 closed blocks in the queue to be written-back to the Flash memory, hence approximately an average of 100 ms can be maintained for a standard DDR DRAM operation. Moreover, the number of closed Blocks in the queue to be written-back to the Flash memory subsystem varies with the average block usage time and the desired performance for a specific host system or for a specific application running using the host system resources.

Consequently, the maximum number of closed Blocks to be written-back to Flash can be approximated to be ((# of blocks per bank)/(ratio of 'Flash_block_write-_time' to 'Flash_read_time'))*((Block usage time)/('Flash_block_write_time'))

In order to maintain less than 100 ms time period for queued write-back Blocks, then using a Flash memory subsystem having 22 ms write access time per Block would results in a maximum number of four Blocks to be queued for write operation to Flash 506. Therefore, on average approximately 88 ms (=22 ms*4) for blocks means that each bank should not have more than four Blocks that need to be written back to the Flash 506.

The above equation also indicates that bigger DRAM memory space can support shorter block usage times. For example, 2 GB of DRAM memory allows the 8 closed blocks to be written-back to Flash. The table in FIG. 11 provides an estimation of the maximum allowed closed blocks in the queue to be written back to the Flash memory for different DRAM density using various average block use time.

Certain embodiments described herein include a memory system which can communicate with a host system such as a disk controller of a computer system. The memory system can include volatile and non-volatile memory, and a controller. The controller backs up the volatile memory using the non-volatile memory in the event of a trigger condition. Trigger conditions can include, for example, a power failure, power reduction, request by the host system, etc. In order to power the system in the event of a power failure or reduction, the memory system can include a secondary power source which does not comprise a battery and may include, for example, a capacitor or capacitor array.

In certain embodiments, the memory system can be configured such that the operation of the volatile memory is not adversely affected by the non-volatile memory or by th controller when the volatile memory is interacting with the host system. For example, one or more isolation devices may isolate the non-volatile memory and the controller from the volatile memory when the volatile memory is interacting with the host system and may allow communication between the volatile memory and the non-volatile memory when the data of the volatile memory is being restored or backed-up. This configuration generally protects the operation of the volatile memory when isolated while providing backup and restore capability in the event of a trigger condition, such as a power failure.

In certain embodiments described herein, the memory system includes a power module which provides power to the various components of the memory system from different sources based on a state of the memory system in relation to a trigger condition (e.g., a power failure). The power module may switch the source of the power to the various components in order to efficiently provide power in the event of the power failure. For example, when no power failure is detected, the power module may provide power to certain components, such as the volatile memory, from system power while charging a secondary power source (e.g., a capacitor array). In the event of a power failure or other trigger condition, the power module may power the volatile memory elements using the previously charged secondary power source.

In certain embodiments, the power module. transitions relatively smoothly from powering the volatile memory with system power to powering it with the secondary power source. For example, the power system may power volatile memory with a third power source from the time the memory system detects that power failure is likely to occur until the time the memory system detects that the power failure has actually occurred.

In certain embodiments, the volatile memory system can be operated at a reduced frequency during backup and/or restore operations which can improve the efficiency of the system and save power. In some embodiments, during backup and/or restore operations, the volatile memory communicates with the non-volatile memory by writing and/or reading data words in bit-wise slices instead of by writing entire words at once. In certain embodiments, when each slice is being written to or read from the volatile memory the unused slice(s) of volatile memory is not active, which can reduce the power consumption of the system.

In yet other embodiments, the non-volatile memory can include at least 100 percent more storage capacity than the volatile memory. This configuration can allow the memory system to efficiently handle subsequent trigger conditions.

Figure 12:
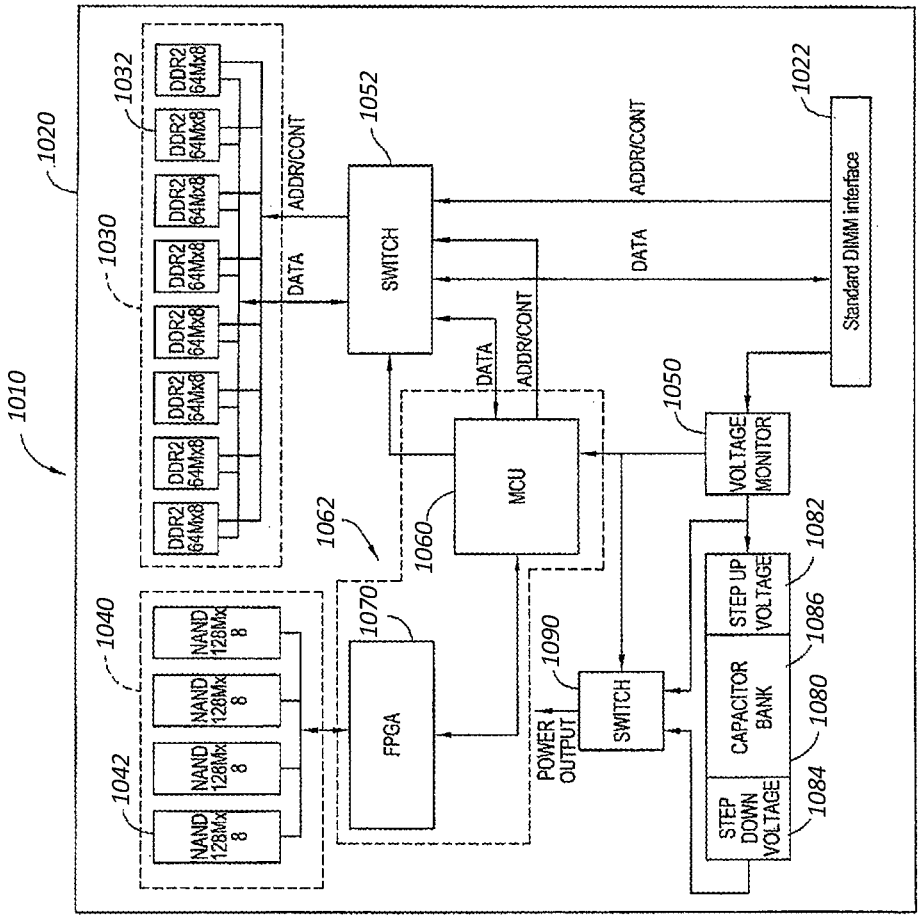
FIG. 12 is a block diagram of an example memory system compatible with certain embodiments described herein.

FIG. 12 is a block diagram of an example memory system 1010 compatible with certain embodiments described herein. The memory system 1010 can be coupled to a host computer system and can include a volatile memory subsystem 1030, a non-volatile memory subsystem 1040, and a controller 1062 operatively coupled to the non-volatile memory subsystem 1040. In certain embodiments, the memory system 1010 includes at least one circuit 1052 configured to selectively operatively decouple the controller 1062 from the volatile memory subsystem 1030.

In certain embodiments, the memory system 1010 comprises a memory module. The memory system 1010 may comprise a printed-circuit board (PCB) 1020. In certain embodiments, the memory system 1010 has a memory capacity of 512-MB, 1-GB, 2-GB, 4-GB, or 8-GB. Other volatile memory capacities are also compatible with certain embodiments described herein. In certain embodiments, the memory system 10 has a non-volatile memory capacity of 512-MB, 1-GB, 2-GB, 4-GB, 8-GB, 16-GB, or 32-GB. Other non-volatile memory capacities are also compatible with certain embodiments described herein. In addition, memory systems 1010 having widths of 4 bytes, 8 bytes, 16 bytes, 32 bytes, or 32 bits, 64 bits, 128 bits, 256 bits, as well as other widths (in bytes or in bits), are compatible with embodiments described herein. In certain embodiments, the PCB 1020 has an industry-standard form factor. For example, the PCB 1020 can have a low profile (LP) form factor with a height of 30 millimeters and a width of 133.35 millimeters. In certain other embodiments, the PCB 1020 has a very high profile (VHP) form factor with a height of 50 millimeters or more. In certain other embodiments, the PCB 1020 has a very low profile (VLP) form factor with a height of 18.3 millimeters. Other form factors including, but not limited to, small-outline (SO-DIMM), unbuffered (UDIMM), registered (RDIMM), fully-buffered (FB-DIMM), miniDIMM, mini-RDIMM, VLP mini-DIMM, micro-DIMM, and SRAM DIMM are also compatible with certain embodiments described herein. For example, in other embodiments, certain non-DIMM form factors are possible such as, for example, single in-line memory module (SIMM), multi-media card (MMC), and small computer system interface (SCSI).

In certain preferred embodiments, the memory system 1010 is in electrical communication with the host system. In other embodiments, the memory system 1010 may communicate with a host system using some other type of communication, such as, for example, optical communication. Examples of host systems include, but are not limited to, blade servers, 1U servers, personal computers (PCs), and other applications in which space is constrained or limited. The memory system 1010 can be in communication with a disk controller of a computer system, for example. The PCB 1020 can comprise an interface 1022 that is configured to be in electrical communication with the host system (not shown). For example, the interface 1022 can comprise a plurality of edge connections which fit into a corresponding slot connector of the host system. The interface 1022 of certain embodiments provides a conduit for power voltage as well as data, address, and control signals between the memory system 1010 and the host system. For example, the interface 1022 can comprise a standard 240-pin DDR2 edge connector.

The volatile memory subsystem 1030 comprises a plurality of volatile memory elements 1032 and the non-volatile memory subsystem 1040 comprises a plurality of non-volatile memory elements 1042. Certain embodiments described herein advantageously provide nonvolatile storage via the non-volatile memory subsystem 1040 in addition to high-performance (e.g., high speed) storage via the volatile memory subsystem 1030. In certain embodiments, the first plurality of volatile memory elements 1032 comprises two or more dynamic random-access memory (DRAM) elements. Types of DRAM elements 1032 compatible with certain embodiments described herein include, but are not limited to, DDR, DDR2, DDR3, and synchronous DRAM (SDRAM). For example, in the block diagram of FIG. 12, the first memory bank 1030 comprises eight 64M×8 DDR2 SDRAM elements 1032. The volatile memory elements 1032 may comprise other types of memory elements such as static random-access memory (SRAM). In addition, volatile memory elements 1032 having bit widths of 4, 8, 16, 32, as well as other bit widths, are compatible with certain embodiments described herein. Volatile memory elements 1032 compatible with certain embodiments described herein have packaging which include, but are not limited to, thin small-outline package (TSOP), ball-grid-array (BGA), fine-pitch BGA (FBOA), micro-BOA (1.1,BGA), mini-BGA (mBGA), and chip-scale packaging (CSP).

In certain embodiments, the second plurality of non-volatile memory elements 1042 comprises one or more flash memory elements. Types of flash memory elements 1042 compatible with certain embodiments described herein include, but are not limited to, NOR flash, NAND flash, ONE-NAND flash, and multi-level cell (MLC). For example, in the block diagram of FIG. 12, the second memory bank 1040 comprises 512 MB of flash memory organized as four 128 Mb×8 NAND flash memory elements 1042. In addition, nonvolatile memory elements 1042 having bit widths of 4, 8, 16, 32, as well as other bit widths, are compatible with certain embodiments described herein. Non-volatile memory elements 1042 compatible with certain embodiments described herein have packaging which include, but are not limited to, thin small-outline package (TSOP), ball-grid-array (BOA), fine-pitch BOA (FBGA), micro-BOA (POA), mini-BGA (mBGA), and chip-scale packaging (CSP).

Figure 13:
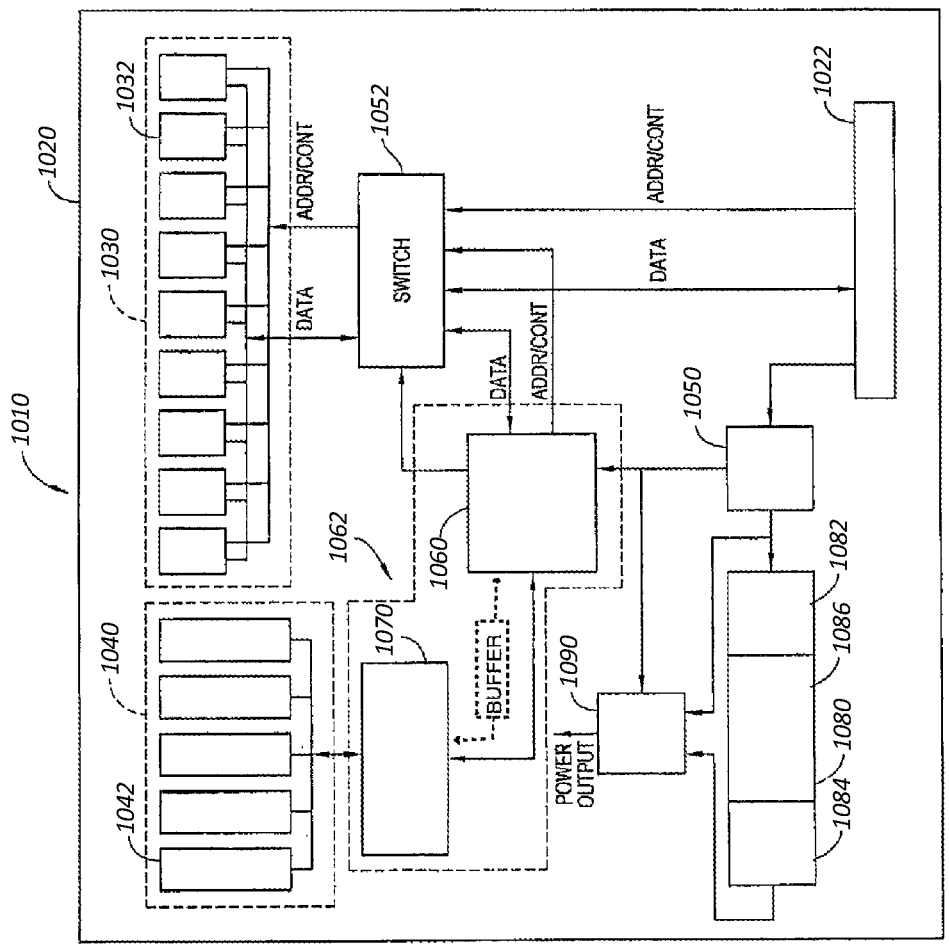
FIG. 13 is a block diagram of an example memory module with ECC (error-correcting code) having a volatile memory subsystem with nine volatile memory elements and a non-volatile memory subsystem with five non-volatile memory elements in accordance with certain embodiments described herein.

FIG. 13 is a block diagram of an example memory module 10 with ECC (error-correcting code) having a volatile memory subsystem 1030 with nine volatile memory elements 1032 and a non-volatile memory subsystem 1040 with five non-volatile memory elements 1042 in accordance with certain embodiments described herein. The additional memory element 1032 of the first memory bank 1030 and the additional memory element 1042 of the second memory bank 1040 provide the ECC capability. In certain other embodiments, the volatile memory subsystem 1030 comprises other numbers of volatile memory elements 1032 (e.g., 2, 3, 4, 5, 6, 7, more than 9). In certain embodiments, the non-volatile memory subsystem 1040 comprises other numbers of nonvolatile memory elements 1042 (e.g., 2, 3, more than 5).

Figure 14:
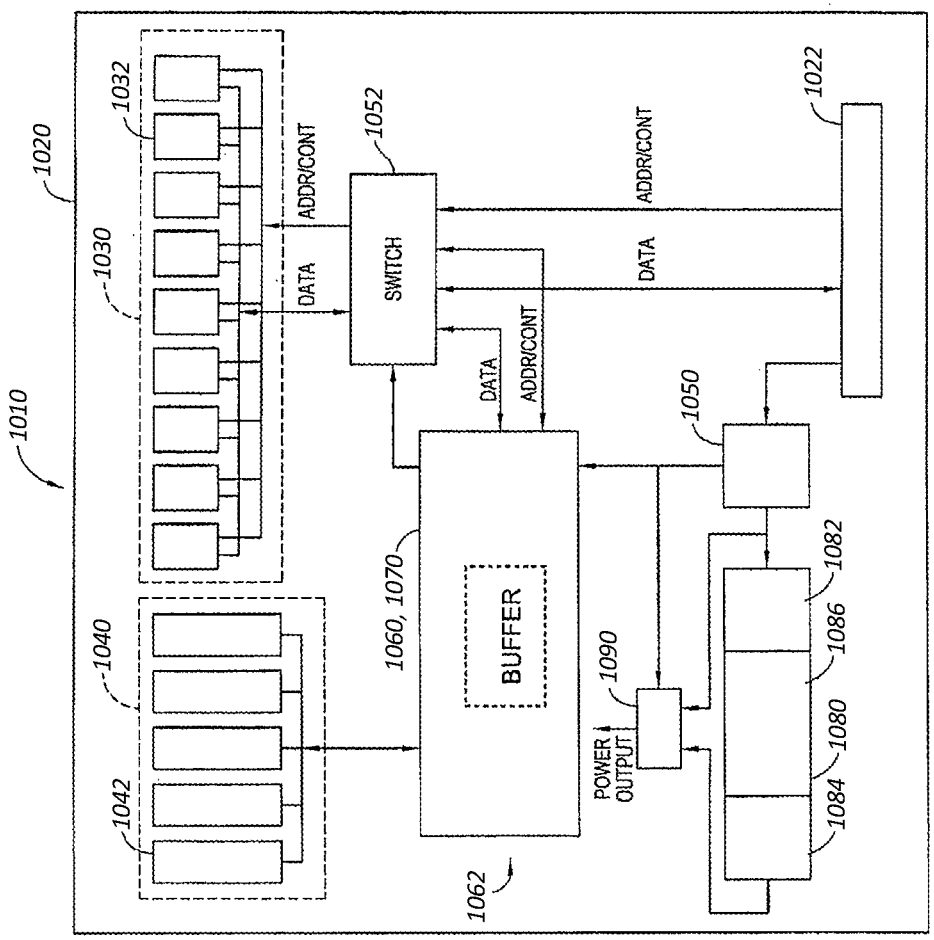
FIG. 14 is a block diagram of an example memory module having a microcontroller unit and logic element integrated into a single device in accordance with certain embodiments described herein.

Referring to FIG. 12, in certain embodiments, the logic element 1070 comprises a field-programmable gate array (FPGA). In certain embodiments, the logic element 1070 comprises an FPGA available from Lattice Semiconductor Corporation which includes an internal flash. In certain other embodiments, the logic element 1070 comprises an FPOA available from another vendor. The internal flash can improve the speed of the memory system 1010 and save physical space. Other types of logic elements 1070 compatible with certain embodiments described herein include, but are not limited to, a programmable-logic device (PLD), an application-specific integrated circuit (ASIC), a custom-designed semiconductor device, a complex programmable logic device (CPLD). In certain embodiments, the logic element 1070 is a custom device. In certain embodiments, the logic element 1070 comprises various discrete electrical elements, while in certain other embodiments, the logic element 1070 comprises one or more integrated circuits. FIG. 14 is a block diagram of an example memory module 1010 having a microcontroller unit 1060 and logic element 1070 integrated into a single controller 1062 in accordance with certain embodiments described herein. In certain embodiments, the controller 1062 includes one or more other components. For example, in one embodiment, an FPGA without an internal flash is used and the controller 1062 includes a separate flash memory component which stores configuration information to program the FPGA.

In certain embodiments, the at least one circuit 1052 comprises one or more switches coupled to the volatile memory subsystem 1030, to the controller 1062, and to the host computer (e.g., via the interface 1022, as schematically illustrated by FIGS. 12-14). The one or more switches are responsive to signals (e.g., from the controller 1062) to selectively operatively decouple the controller 1062 from the volatile memory subsystem 1030 and to selectively operatively couple the controller 1062 to the volatile memory subsystem 1030. In addition, in certain embodiments, the at least one circuit 1052 selectively operatively couples and decouples the volatile memory subsystem 1030 and the host system.

Figure 15A:
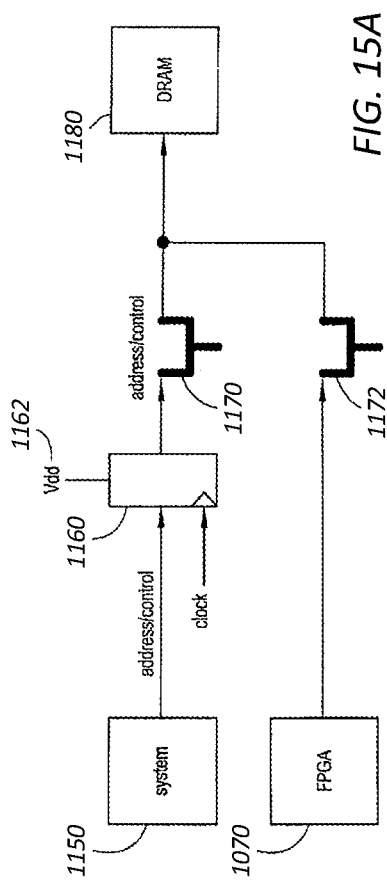
FIGS. 15A-15C schematically illustrate example embodiments of memory systems having volatile memory subsystems comprising registered dual in-line memory modules in accordance with certain embodiments described herein.
Figure 15B:
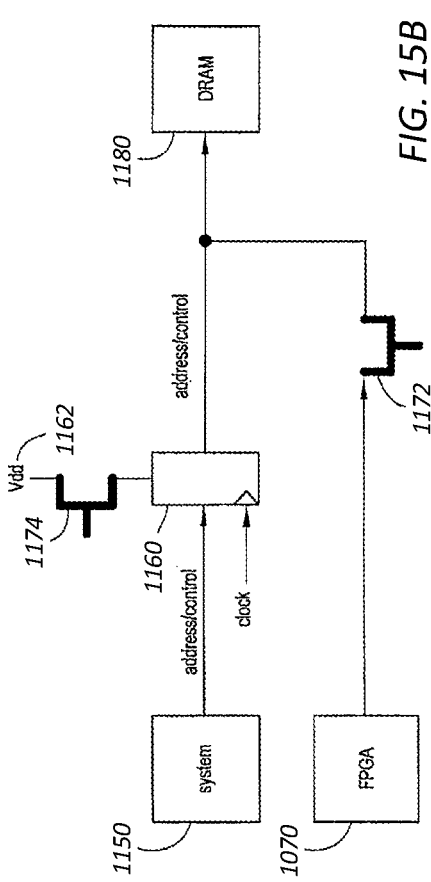
Figure 15C:
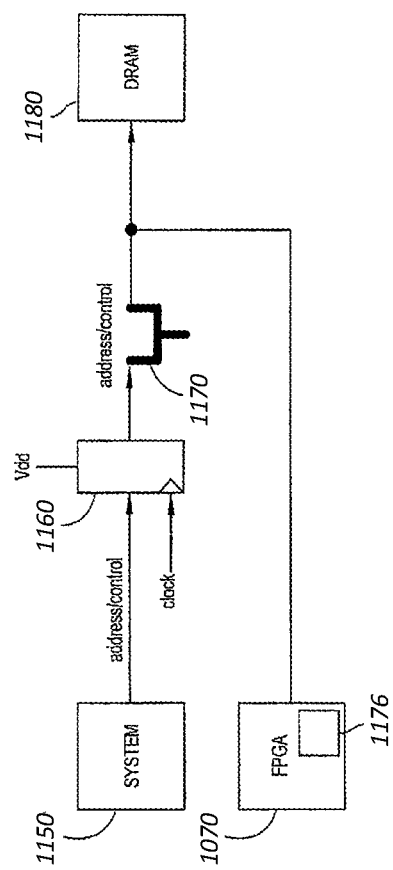

In certain embodiments, the volatile memory subsystem 1030 can comprise a registered DIMM subsystem comprising one or more registers 1160 and a plurality of DRAM elements 1180, as schematically illustrated by FIG. 15A. In certain such embodiments, the at least one circuit 1052 can comprise one or more switches 1172 coupled to the controller 1062 (e.g., logic element 1070) and to the volatile memory subsystem 1030 which can be actuated to couple and decouple the controller 1062 to and from the volatile memory subsystem 1030, respectively. The memory system 1010 further comprises one or more switches 1170 coupled to the one or more registers 1160 and to the plurality of DRAM elements 1180 as schematically illustrated by FIG. 15A. The one or more switches 1170 can be selectively switched, thereby selectively operatively coupling the volatile memory subsystem 1030 to the host system 1150. In certain other embodiments, as schematically illustrated by FIG. 15B, the one or more switches 1174 are also coupled to the one or more registers 1160 and to a power source 1162 for the one or more registers 1160. The one or more switches 1174 can be selectively switched to turn power on or off to the one or more registers 1160, thereby selectively operatively coupling the volatile memory subsystem 1030 to the host system 1150. As schematically illustrated by FIG. 15C, in certain embodiments the at least one circuit 1052 comprises a dynamic on-die termination (ODT) 1176 circuit of the logic element 1070. For example, the logic element 1070 can comprise a dynamic ODT circuit 1176 which selectively operatively couples and decouples the logic element 1070 to and from the volatile memory subsystem 1030, respectively. In addition, and similar to the example embodiment of FIG. 15A described above, the one or more switches 1170 can be selectively switched, thereby selectively operatively coupling the volatile memory subsystem 1030 to the host system 1150.

Certain embodiments described herein utilize the non-volatile memory subsystem 1040 as a flash "mirror" to provide backup of the volatile memory subsystem 1030 in the event of certain system conditions. For example, the non-volatile memory subsystem 1040 may backup the volatile memory subsystem 1030 in the event of a trigger condition, such as, for example, a power failure or power reduction or a request from the host system. In one embodiment, the nonvolatile memory subsystem 1040 holds intermediate data results in a noisy system environment when the host computer system is engaged in a long computation. In certain embodiments, a backup may be performed on a regular basis. For example, in one embodiment, the backup may occur every millisecond in response to a trigger condition. In certain embodiments, the trigger condition occurs when the memory system 1010 detects that the system voltage is below a certain threshold voltage. For example, in one embodiment, the threshold voltage is 1010 percent below a specified operating voltage. In certain embodiments, a trigger condition occurs when the voltage goes above a certain threshold value, such as, for example, 1010 percent above a specified operating voltage. In some embodiments, a trigger condition occurs when the voltage goes below a threshold or above another threshold. In various embodiments, a backup and/or restore operation may occur in reboot and/or non-reboot trigger conditions.

As schematically illustrated by FIGS. 12 and 13, in certain embodiments, the controller 1062 may comprise a microcontroller unit (MCU) 1060 and a logic element 1070. In certain embodiments, the MCU 1060 provides memory management for the non-volatile memory subsystem 1040 and controls data transfer between the volatile memory subsystem 30 and the nonvolatile memory subsystem 1040. The MCU 1060 of certain embodiments comprises a 16-bit microcontroller, although other types of microcontrollers are also compatible with certain embodiments described herein. As schematically illustrated by FIGS. 12 and 13, the logic element 1070 of certain embodiments is in electrical communication with the non-volatile memory subsystem 1040 and the MCU 1060. The logic element 1070 can provide signal level translation between the volatile memory elements 1032 (e.g., 1.8V SSTL-2 for DDR2 SDRAM elements) and the non-volatile memory elements 1042 (e.g., 3V TTL for NAND flash memory elements). In certain embodiments, the logic element 1070 is also programmed to perform address/address translation between the volatile memory subsystem 1030 and the non-volatile memory subsystem 1040. In certain preferred embodiments, 1-NAND type flash are used for the non-volatile memory elements 1042 because of their superior read speed and compact structure.

The memory system 1010 of certain embodiments is configured to be operated in at least two states. The at least two states can comprise a first state in which the controller 1062 and the non-volatile memory subsystem 1040 are operatively decoupled (e.g., isolated) from the volatile memory subsystem 1030 by the at least one circuit 1052 and a second state in which the volatile memory subsystem 1030 is operatively coupled to the controller 1062 to allow data to be communicated between the volatile memory subsystem 1030 and the nonvolatile memory subsystem 1040 via the controller 1062. The memory system 1010 may transition from the first state to the second state in response to a trigger condition, such as when the memory system 1010 detects that there is a power interruption (e.g., power failure or reduction) or a system hang-up.

The memory system 1010 may further comprise a voltage monitor 1050. The voltage monitor circuit 1050 monitors the voltage supplied by the host system via the interface 1022. Upon detecting a low voltage condition (e.g., due to a power interruption to the host system), the voltage monitor circuit 1050 may transmit a signal to the controller 1062 indicative of the detected condition. The controller 1062 of certain embodiments responds to the signal from the voltage monitor circuit 1050 by transmitting a signal to the at least one circuit 1052 to operatively couple the controller to the volatile memory system 1030, such that the memory system 1010 enters the second state. For example, the voltage monitor 1050 may send a signal to the MCU 1060 which responds by accessing the data on the volatile memory system 1030 and by executing a write cycle on the nonvolatile memory subsystem 1040. During this write cycle, data is read from the volatile memory subsystem 1030 and is transferred to the non-volatile memory subsystem 1040 via the MCU 1060. In certain embodiments, the voltage monitor circuit 1050 is part of the controller 1062 (e.g., part of the MCU 1060) and the voltage monitor circuit 1050 transmits a signal to the other portions of the controller 1062 upon detecting a power threshold condition.

The isolation or operational decoupling of the volatile memory subsystem 1030 from the non-volatile memory subsystem in the first state can preserve the integrity of the operation of the memory system 1010 during periods of operation in which signals (e.g., data) are transmitted between the host system and the volatile memory subsystem 1030. For example, in one embodiment during such periods of operation, the controller 1062 and the nonvolatile memory subsystem 1040 do not add a significant capacitive load to the volatile memory system 1030 when the memory system 1010 is in the first state. In certain such embodiments, the capacitive load of the controller 1062 and the non-volatile memory subsystem 1040 do not significantly affect the signals propagating between the volatile memory subsystem 1030 and the host system. This can be particularly advantageous in relatively high-speed memory systems where loading effects can be significant. In one preferred embodiment, the at least one circuit 1052 comprises an FSA1208 Low-Power, Eight-Port, Hi-Speed Isolation Switch from Fairchild Semiconductor. In other embodiments, the at least one circuit 1052 comprises other types of isolation devices.

Power may be supplied to the volatile memory subsystem 1030 from a first power supply (e.g., a system power supply) when the memory system 1010 is in the first state and from a second power supply 1080 when the memory system 1010 is in the second state. In certain embodiments, the memory system 1010 is in the first state when no trigger condition (e.g., a power failure) is present and the memory system 1010 enters the second state in response to a trigger condition. In certain embodiments, the memory system 1010 has a third state in which the controller 1062 is operatively decoupled from the volatile memory subsystem 1030 and power is supplied to the volatile memory subsystem 1030 from a third power supply (not shown). For example, in one embodiment the third power supply may provide power to the volatile memory subsystem 1030 when the memory system 1010 detects that a trigger condition is likely to occur but has not yet occurred.

In certain embodiments, the second power supply 1080 does not comprise a battery. Because a battery is not used, the second power supply 1080 of certain embodiments may be relatively easy to maintain, does not generally need to be replaced, and is relatively environmentally friendly. In certain embodiments, as schematically illustrated by FIGS. 12-14, the second power supply 1080 comprises a step-up transformer 1082, a step-down transformer 1084, and a capacitor bank 1086 comprising one or more capacitors (e.g., double-layer capacitors). In one example embodiment, capacitors may take about three to four minutes to charge and about two minutes to discharge. In other embodiments, the one or more capacitors may take a longer time or a shorter time to charge and/or discharge. For example, in certain embodiments, the second power supply 1080 is configured to power the volatile memory subsystem 1030 for less than thirty minutes. In certain embodiments, the second power supply 1080 may comprise a battery. For example, in certain embodiments, the second power supply 1080 comprises a battery and one or more capacitors and is configured to power the volatile memory subsystem 1030 for no more than thirty minutes.

In certain embodiments, the capacitor bank 1086 of the second power supply 1080 is charged by the first power supply while the memory system 1010 is in the first state. As a result, the second power supply 1080 is fully charged when the memory system 1010 enters the second state. The memory system 1010 and the second power supply 1080 may be located on the same printed circuit board 1020. In other embodiments, the second power supply 1080 may not be on the same printed circuit board 1020 and may be tethered to the printed circuit board 1020, for example.

When operating in the first state, in certain embodiments, the step-up transformer 1082 keeps the capacitor bank 1086 charged at a peak value. In certain embodiments, the step-down transformer 1084 acts as a voltage regulator to ensure that regulated voltages are supplied to the memory elements (e.g., 1.8V to the volatile DRAM elements 1032 and 3.0V to the non-volatile flash memory elements 1042) when operating in the second state (e.g., during power down). In certain embodiments, as schematically illustrated by FIGS. 12-14, the memory module 1010 further comprises a switch 1090 (e.g., FET switch) that switches power provided to the controller 1062, the volatile memory subsystem 1030, and the non-volatile memory subsystem 1040, between the power from the second power supply 1080 and the power from the first power supply (e.g., system power) received via the interface 1022. For example, the switch 1090 may switch from the first power supply to the second power supply 1080 when the voltage monitor 1050 detects a low voltage condition. The switch 1090 of certain embodiments advantageously ensures that the volatile memory elements 1032 and non-volatile memory elements 1042 are powered long enough for the data to be transferred from the volatile memory elements 1032 and stored in the non-volatile memory elements 1042. In certain embodiments, after the data transfer is complete, the switch 1090 then switches back to the first power supply and the controller 1062 transmits a signal to the at least one circuit 1052 to operatively decouple the controller 1062 from the volatile memory subsystem 1030, such that the memory system 1010 reenters the first state.

When the memory system 1010 re-enters the first state, data may be transferred back from the non-volatile memory subsystem 1040 to the volatile memory subsystem 1030 via the controller 1062. The host system can then resume accessing the volatile memory subsystem 1030 of the memory module 1010. In certain embodiments, after the memory system 1010 enters or re-enters the first state (e.g., after power is restored), the host system accesses the volatile memory subsystem 1030 rather than the non-volatile memory subsystem 1040 because the volatile memory elements 1032 have superior read/write characteristics. In certain embodiments, the transfer of data from the volatile memory bank 1030 to the nonvolatile memory bank 1040, or from the non-volatile memory bank 1040 to the volatile. memory bank 1030, takes less than one minute per GB.

In certain embodiments, the memory system 1010 protects the operation of the volatile memory when communicating with the host-system and provides backup and restore capability in the event of a trigger condition such as a power failure. In certain embodiments, the memory system 1010 copies the entire contents of the volatile memory subsystem 1030 into the nonvolatile memory subsystem 1040 on each backup operation. Moreover, in certain embodiments, the entire contents of the non-volatile memory subsystem 1040 are copied back into the volatile memory subsystem 1030 on each restore operation. In certain embodiments, the entire contents of the non-volatile memory subsystem 1040 are accessed for each backup and/or restore operation, such that the non-volatile memory subsystem 1040 (e.g., flash memory subsystem) is used generally uniformly across its memory space and wear-leveling is not performed by the memory system 1010. In certain embodiments, avoiding wear-leveling can decrease cost and complexity of the memory system 1010 and can improve the performance of the memory system 1010. In certain other embodiments, the entire contents of the volatile memory subsystem 1030 are not copied into the non-volatile memory subsystem 1040 on each backup operation, but only a partial copy is performed. In certain embodiments, other management capabilities such as bad-block management and error management for the flash memory elements of the non-volatile memory subsystem 1040 are performed in the controller 1062.

The memory system 1010 generally operates as a write-back cache in certain embodiments. For example, in one embodiment, the host system (e.g., a disk controller) writes data to the volatile memory subsystem 1030 which then writes the data to non-volatile storage which is not part of the memory system 1010, such as, for example, a hard disk. The disk controller may wait for an acknowledgment signal from the memory system 1010 indicating that the data has been written to the hard disk or is otherwise secure. The memory system 1010 of certain embodiments can decrease delays in the system operation by indicating that the data has been written to the hard disk before it has actually done so. In certain embodiments, the memory system 1010 will still be able to recover the data efficiently in the event of a power outage because of the backup and restore capabilities described herein. In certain other embodiments, the memory system 1010 may be operated as a write-through cache or as some other type of cache.

Figure 16:
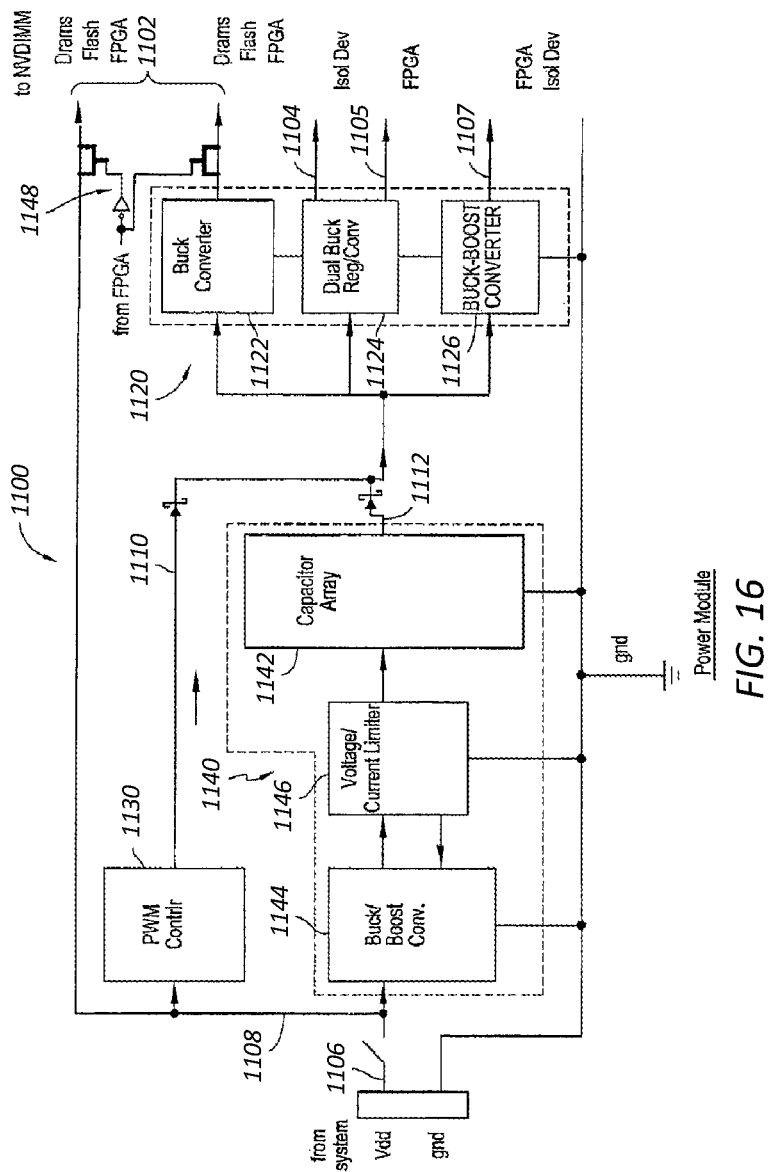
FIG. 16 schematically illustrates an example power module of a memory system in accordance with certain embodiments described herein.

FIG. 16 schematically illustrates an example power module 1100 of the memory system 1010 in accordance with certain embodiments described herein. The power module 1100 provides power to the various components of the memory system 1010 using different elements based on a state of the memory system 1010 in relation to a trigger condition. In certain embodiments, the power module 1100 comprises one or more of the components described above with respect to FIG. 12. For example, in certain embodiments, the power module 1100 includes the second power supply 1080 and the switch 1090.

The power module 1100 provides a plurality of voltages to the memory system 1010 comprising non-volatile and volatile memory subsystems 1030, 1040. The plurality of voltages comprises at least a first voltage 1102 and a second voltage 1104. The power module 1100 comprises an input 1106 providing a third voltage 1108 to the power module 1100 and a voltage conversion element 1120 configured to provide the second voltage 1104 to the memory system 1010. The power module 1100 further comprises a first power element 1130 configured to selectively provide a fourth voltage 1110 to the conversion element 1120. In certain embodiments, the first power element 1130 comprises a pulse-width modulation power controller. For example, in one example embodiment, the first power element 1130 is configured to receive a 1.8V input system voltage as the third voltage 1108 and to output a modulated 5V output as the fourth voltage 1110.

The power module 1100 further comprises a second power element 1140 can be configured to selectively provide a fifth voltage 1112 to the conversion element 1120. The power module 1100 can be configured to selectively provide the first voltage 1102 to the memory system 1010 either from the conversion element 1120 or from the input 1106.

The power module 1100 can be configured to be operated in at least three states in certain embodiments. In a first state, the first voltage 1102 is provided to the memory system 1010 from the input 1106 and the fourth voltage 1110 is provided to the conversion element 1120 from the first power element 1130. In a second state, the fourth voltage 1110 is provided to the conversion element 1120 from the first power element 1130 and the first voltage 1102 is provided to the memory system 1010 from the conversion element 1120. In the third state, the fifth voltage 1112 is provided to the conversion element 1120 from the second power element 1140 and the first voltage 1104 is provided to the memory system 1010 from the conversion element 1120.

In certain embodiments, the power module 1100 transitions from the first state to the second state upon detecting that a trigger condition is likely to occur and transitions from the second state to the third state upon detecting that the trigger condition has occurred. For example, the power module 1100 may transition to the second state when it detects that a power failure is about to occur and transitions to the third state when it detects that the power failure has occurred. In certain embodiments, providing the first voltage 1102 in the second state from the first power element 1130 rather than from the input 1106 allows a smoother transition from the first state to the third state. For example, in certain embodiments, providing the first voltage 1102 from the first power element 1130 has capacitive and other smoothing effects. In addition, switching the point of power transition to be between the conversion element 1120 and the first and second power elements 1130, 1140 (e.g., the sources of the pre-regulated fourth voltage 1110 in the second state and the pre-regulated fifth voltage 1112 in the third state) can smooth out potential voltage spikes.

In certain embodiments, the second power element 1140 does not comprise a battery and may comprise one or more capacitors. For example, as schematically illustrated in FIG. 16, the second power element 1140 comprises a capacitor array 1142, a buck-boost converter 1144 which adjusts the voltage for charging the capacitor array and a voltage/current limiter 1146 which limits the charge current to the capacitor array 1142 and stops charging the capacitor array 1142 when it has reached a certain charge voltage. In one example embodiment, the capacitor array 1142 comprises two 50 farad capacitors capable of holding a total charge of 4.6V. For example, in one example embodiment, the buck-boost converter 1144 receives a 1.8V system voltage (first voltage 1108) and boosts the voltage to 4.3V which is outputted to the voltage current limiter 1146. The voltage/current limiter 1146 limits the current going to the capacitor array 1142 to 1A and stops charging the array 1142 when it is charged to 4.3V. Although described with respect to certain example embodiments, one of ordinary skill will recognize from the disclosure herein that the second power element 1140 may include alternative embodiments. For example, different components and/or different value components may be used. For example, in other embodiments, a pure boost converter may be used instead of a buck-boost converter. In another embodiment, only one capacitor may be used instead of a capacitor array 1142.

The conversion element 1120 can comprise one or more buck converters and/or one or more buck-boost converters. The conversion element 1120 may comprise a plurality of sub-blocks 1122, 1124, 1126 as schematically illustrated by FIG. 16, which can provide more voltages in addition to the second voltage 1104 to the memory system 1010. The sub-blocks may comprise various converter circuits such as buck-converters, boost converters, and buck-boost converter circuits for providing various voltage values to the memory system 1010. For example, in one embodiment, sub-block 1122 comprises a buck converter, sub-block 1124 comprises a dual buck converter, and sub-block 1126 comprises a buck-boost converter as schematically illustrated by FIG. 16. Various other components for the sub-blocks 1122, 1124, 1126 of the conversion element 1120 are also compatible with certain embodiments described herein. In certain embodiments, the conversion element 1120 receives as input either the fourth voltage 1110 from the first power element 1130 or the fifth voltage 1112 from the second power element 1140, depending on the state of the power module 1100, and reduces the input to an appropriate amount for powering various components of the memory system. For example, the buck-converter of sub-block 1122 can provide 1.8V at 2A for about 60 seconds to the volatile memory elements 1032 (e.g., DRAM), the non-volatile memory elements 1042 (e.g., flash), and the controller 1062 (e.g., an FPGA) in one embodiment. The sub-block 1124 can provide the second voltage 1104 as well as another reduced voltage 1105 to the memory system 1010. In one example embodiment, the second voltage 1104 is 2.5V and is used to power the at least one circuit 1052 (e.g., isolation device) and the other reduced voltage 1105 is 1.2V and is used to power the controller 1062 (e.g., FPGA). The subblock 1126 can provide yet another voltage 1107 to the memory system 1010. For example, the voltage 1107 may be 3.3V and may be used to power both the controller 1062 and the at least one circuit 1052.

Although described with respect to certain example embodiments, one of ordinary skill will recognize from the disclosure herein that the conversion element 1120 may include alternative embodiments. For example, there may be more or less sub-blocks which may comprise other types of converters (e.g., pure boost converters) or which may produce different voltage values. In one embodiment, the volatile memory elements 1032 and nonvolatile memory elements 1042 are powered using independent voltages and are not both powered using the first voltage 1102.

Figure 17:
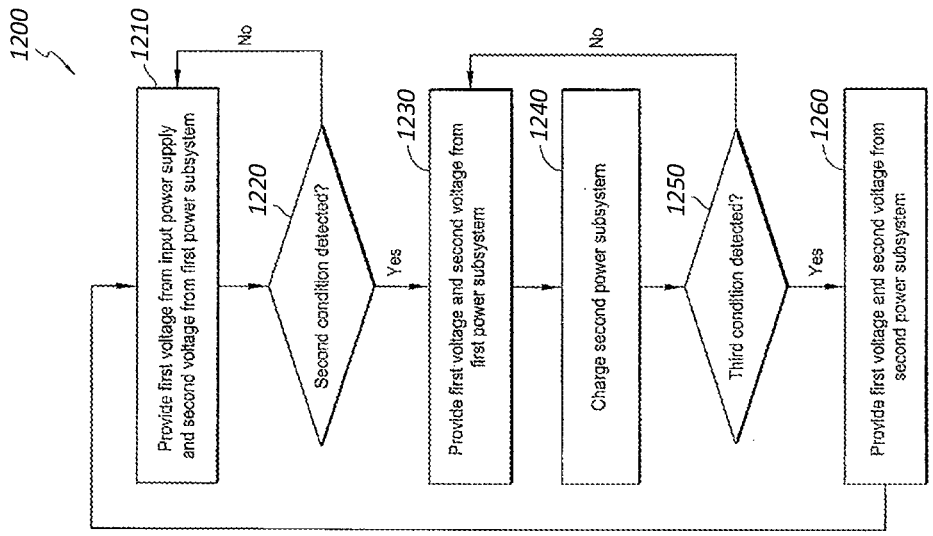
FIG. 17 is a flowchart of an example method of providing a first voltage and a second voltage to a memory system including volatile and non-volatile memory subsystems.

FIG. 17 is a flowchart of an example method 1200 of providing a first voltage 1102 and a second voltage 1104 to a memory system 1010 including volatile and nonvolatile memory subsystems 1030, 1040. While the method 1200 is described herein by reference to the memory system 1010 schematically illustrated by FIGS. 12-15, other memory systems are also compatible with embodiments of the method 1200. During a first condition, the method 1200 comprises providing the first voltage 1102 to the memory system 1010 from an input power supply 1106 and providing the second voltage 1104 to the memory system 1010 from a first power subsystem in operational block 1210. For example, in one embodiment, the first power subsystem comprises the first power element 1130 and the voltage conversion element 1120 described above with respect to FIG. 16. In other embodiments, other first power subsystems are used.

The method 1200 further comprises detecting a second condition in operational block 1220. In certain embodiments, detecting the second condition comprises detecting that a trigger condition is likely to occur. During the second condition, the method 1200 comprises providing the first voltage 1102 and the second voltage 1104 to the memory system 1010 from the first power subsystem in an operational block 1230. For example, referring to FIG. 16, a switch 1148 can be toggled to provide the first voltage 1102 from the conversion element 1120 rather than from the input power supply.

The method 1200 further comprises charging a second power subsystem in operational block 1240. In certain embodiments, the second power subsystem comprises the second power element 1140 or another power supply that does not comprise a battery. For example, in one embodiment, the second power subsystem comprises the second power element 1140 and the voltage conversion element 1120 described above with respect to FIG. 16. In other embodiments, some other second power subsystem is used.

The method 1200 further comprises detecting a third condition in an operational block 1250 and during the third condition, providing the first voltage 1102 and the second voltage 1104 to the memory system 1010 from the second power subsystem 1140 in an operational block 1260. In certain embodiments, detecting the third condition comprises detecting that the trigger condition has occurred. The trigger condition may comprise various conditions described herein. In various embodiments, for example, the trigger condition comprises a power reduction, power failure, or system hang-up. The operational blocks of the method 1200 may be performed in different orders in various embodiments. For example, in certain embodiments, the second power subsystem 1140 is charged before detecting the second condition.

In certain embodiments, the memory system 1010 comprises a volatile memory subsystem 1030 and a non-volatile memory subsystem 1040 comprising at least 100 percent more storage capacity than does the volatile memory subsystem. The memory system 1010 also comprises a controller 1062 operatively coupled to the volatile memory subsystem 1030 and operatively coupled to the non-volatile memory subsystem 1040. The controller 1062 can be configured to allow data to be communicated between the volatile memory subsystem 1030 and the host system when the memory system 1010 is operating in a first state and to allow data to be communicated between the volatile memory subsystem 1030 and the non-volatile memory subsystem 1040 when the memory system 1010 is operating in a second state.

Although the memory system 1010 having extra storage capacity of the non-volatile memory subsystem 1040 has been described with respect to certain embodiments, alternative configurations exist. For example, in certain embodiments, there may be more than 100 percent more storage capacity in the non-volatile memory subsystem 1040 than in the volatile memory subsystem 1030. In various embodiments, there may be at least 200, 300, or 400 percent more storage capacity in the non-volatile memory subsystem 1040 than in the volatile memory subsystem 1030. In other embodiments, the non-volatile memory subsystem 1040 includes at least some other integer multiples of the storage capacity of the volatile memory subsystem 1030. In some embodiments, the non-volatile memory subsystem 1040 includes a non-integer multiple of the storage capacity of the volatile memory subsystem 1030. In one embodiment, the non-volatile memory subsystem 1040 includes less than 100 percent more storage capacity than does the volatile memory subsystem 1030.

The extra storage capacity of the non-volatile memory subsystem 1040 can be used to improve the backup capability of the memory system 1010. In certain embodiments in which data can only be written to portions of the non-volatile memory subsystem 1040 which do not contain data (e.g., portions which have been erased), the extra storage capacity of the nonvolatile memory subsystem 1040 allows the volatile memory subsystem 1030 to be backed up in the event of a subsequent power failure or other trigger event. For example, the extra storage capacity of the non-volatile memory subsystem 1040 may allow the memory system 1010 to backup the volatile memory subsystem 1030 efficiently in the event of multiple trigger conditions (e.g., power failures). In the event of a first power failure, for example, the data in the volatile memory system 1030 is copied to a first, previously erased portion of the nonvolatile memory subsystem 1040 via the controller 1062. Since the non-volatile memory subsystem 1040 has more storage capacity than does the volatile memory subsystem 1030, there is a second portion of the non-volatile memory subsystem 1040 which does not have data from the volatile memory subsystem 1030 copied to it and which remains free of data (e.g., erased). Once system power is restored, the controller 1062 of the memory system 1010 restores the data to the volatile memory subsystem 1030 by copying the backed-up data from the non-volatile memory subsystem 1040 back to the volatile memory subsystem 1030. After the data is restored, the memory system 1010 erases the non-volatile memory subsystem 1040. While the first portion of the non-volatile memory subsystem 1040 is being erased, it may be temporarily unaccessible.

If a subsequent power failure occurs before the first portion of the non-volatile memory subsystem 1040 is completely erased, the volatile memory subsystem 1030 can be backed-up or stored again in the second portion of the non-volatile memory subsystem 1040 as described herein. In certain embodiments, the extra storage capacity of the non-volatile memory subsystem 1040 may allow the memory system 1010 to operate more efficiently. For example, because of the extra storage capacity of the non-volatile memory subsystem 1040, the memory system 1010 can handle a higher frequency of trigger events that is not limited by the erase time of the non-volatile memory subsystem 1040.

Figure 18:
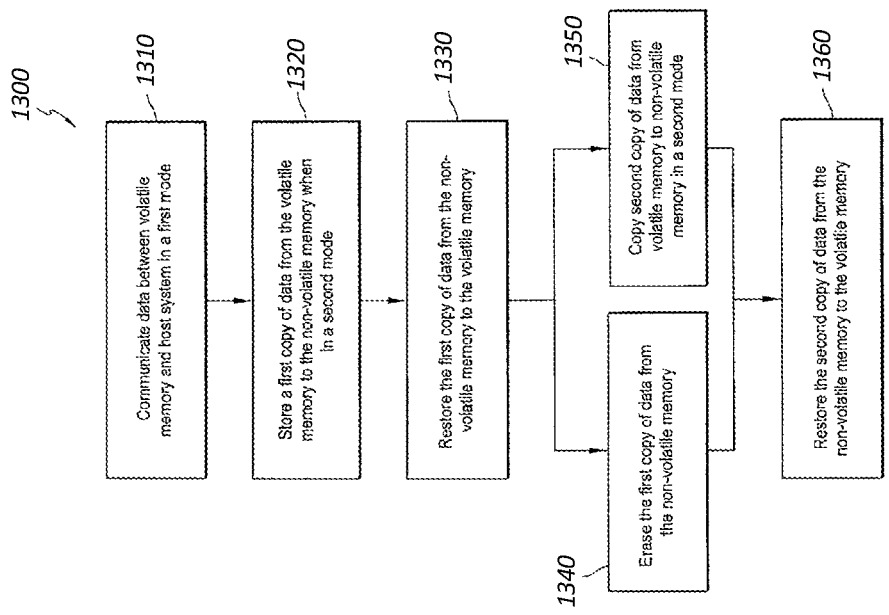
FIG. 18 is a flowchart of an example method of controlling a memory system operatively coupled to a host system and which includes at least 100 percent more storage capacity in non-volatile memory than in volatile memory.

FIG. 18 is a flowchart of an example method 1300 of controlling a memory system 1010 operatively coupled to a host system and which includes a volatile memory subsystem 1030 and a non-volatile memory subsystem 1040. In certain embodiments, the non-volatile memory subsystem 1040 comprises at least 100 percent more storage capacity than does the volatile memory subsystem 30 as described herein. While the method 1300 is described herein by reference to the memory system 1010 schematically illustrated by FIGS. 12-14, the method 1300 can be practiced using other memory systems in accordance with certain embodiments described herein. In an operational block 1310, the method 1300 comprises communicating data between the volatile memory subsystem 1030 and the host system when the memory system 1010 is in a first mode of operation. The method 1300 further comprises storing a first copy of data from the volatile memory subsystem 1030 to the non-volatile memory subsystem 1040 at a first time when the memory system 1010 is in a second mode of operation in an operational block 1320.

In an operational block 1330, the method 1300 comprises restoring the first copy of data from the non-volatile memory subsystem 1040 to the volatile memory subsystem 1030. The method 1300 further comprises erasing the first copy of data from the non-volatile memory subsystem 1040 in an operational block 1340. The method further comprises storing a second copy of data from the volatile memory subsystem 1030 to the non-volatile memory subsystem 1040 at a second time when the memory system 1010 is in the second mode of operation in an operational block 1350. Storing the second copy begins before the first copy is completely erased from the non-volatile memory subsystem 1040.

In some embodiments, the memory system 1010 enters the second mode of operation in response to a trigger condition, such as a power failure. In certain embodiments, the first copy of data and the second copy of data are stored in separate portions of the nonvolatile memory subsystem 1040. The method 1300 can also include restoring the second copy of data from the non-volatile memory subsystem 1040 to the volatile memory subsystem 1030 in an operational block 1360. The operational blocks of method 1300 referred to herein may be performed in different orders in various embodiments. For example, in some embodiments, the second copy of data is restored to the volatile memory subsystem 1030 at operational block 1360 before the first copy of data is completely erased in the operational block 1340.

Figure 19:
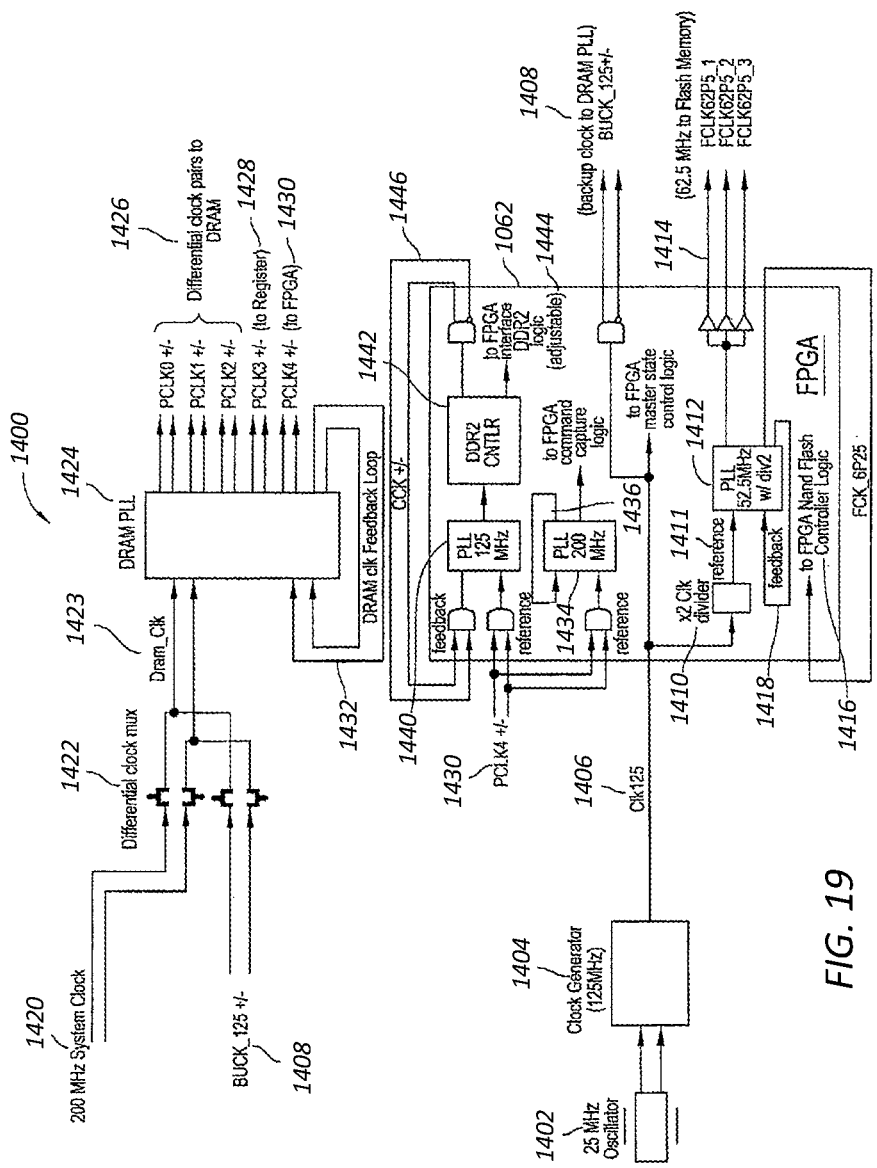
FIG. 19 schematically illustrates an example clock distribution topology of a memory system in accordance with certain embodiments described herein.

FIG. 19 schematically illustrates an example clock distribution topology 1400 of a memory system 1010 in accordance with certain embodiments described herein. The clock distribution topology 1400 generally illustrates the creation and routing of the clock signals provided to the various components of the memory system 1010. A clock source 1402 such as, for example, a 25 MHz oscillator, generates a clock signal. The clock source 1402 may feed a clock generator 1404 which provides a clock signal 1406 to the controller 1062, which may be an FPGA. In one embodiment, the clock generator 1404 generates a 125 MHz clock signal 1406. The controller 1062 receives the clock signal 1406 and uses it to clock the controller 1062 master state control logic. For example, the master state control logic may control the general operation of an FPGA controller 1062.

The clock signal 1406 can also be input into a clock divider 1410 which produces a frequency-divided version of the clock signal 1406. In an example embodiment, the clock divider 1410 is a divide by two clock divider and produces a 62.5 MHz clock signal in response to the 125 MHz clock signal 1406. A non-volatile memory phase-locked loop (PLL) block 1412 can be included (e.g., in the controller 1062) which distributes a series of clock signals to the non-volatile memory subsystem 1040 and to associated control logic. For example, a series of clock signals 1414 can be sent from the controller 1062 to the non-volatile memory subsystem 1040. Another clock signal 1416 can be used by the controller logic which is dedicated to controlling the non-volatile memory subsystem 1040. For example, the clock signal 1416 may clock the portion of the controller 1062 which is dedicated to generating address and/or control lines for the non-volatile memory subsystem 1040. A feedback clock signal 1418 is fed back into the non-volatile memory PLL block 1412. In one embodiment, the PLL block 1412 compares the feedback clock 1418 to the reference clock 1411 and varies the phase and frequency of its output until the reference 1411 and feedback 1418 clocks are phase and frequency matched.

A version of the clock signal 1406 such as the backup clock signal 1408 may be sent from the controller to the volatile memory subsystem 1030. The clock signal 1408 may be, for example, a differential version of the clock signal 1406. As described herein, the backup clock signal 1408 may be used to clock the volatile memory subsystem 1030 when the memory system 1010 is backing up the data from the volatile memory subsystem 1030 into the non-volatile memory subsystem 1040. In certain embodiments, the backup clock signal 1408 may also be used to clock the volatile memory subsystem 1030 when the memory system 1010 is copying the backed-up data back into the volatile memory subsystem 1030 from the nonvolatile memory subsystem 1040 (also referred to as restoring the volatile memory subsystem 1030). The volatile memory subsystem 1030 may normally be run at a higher frequency (e.g., DRAM running at 400 MHz) than the nonvolatile memory subsystem 1040 (e.g., flash memory running at 62.5 MHz) when communicating with the host system (e.g., when no trigger condition is present). However, in certain embodiments the volatile memory subsystem 1030 may be operated at a reduced frequency (e.g., at twice the frequency of the non-volatile memory subsystem 1040) without introducing significant delay into the system during backup operation and/or restore operations. Running the volatile memory subsystem 1030 at the reduced frequency during a backup and/or restore operation may advantageously reduce overall power consumption of the memory system 1010.

In one embodiment, the backup clock 1408 and the volatile memory system clock signal 1420 are received by a multiplexer 1422, as schematically illustrated by FIG. 19. The multiplexer 1422 can output either the volatile memory system clock signal 1420 or the backup clock signal 1408 depending on the backup state of the memory system 1010. For example, when the memory system 1010 is not performing a backup or restore operation and is communicating with the host system (e.g., normal operation), the volatile memory system clock signal 1420 may be provided by the multiplexer 422 to the volatile memory PLL block 1424. When the memory system 1010 is performing a backup (or restore) operation, the backup clock signal 1408 may be provided.

The volatile memory PLL block 1424 receives the volatile memory reference clock signal 1423 from the multiplexer 1422 and can generate a series of clock signals which are distributed to the volatile memory subsystem 1030 and associated control logic. For example, in one embodiment, the PLL block 1424 generates a series of clock signals 1426 which clock the volatile memory elements 1032. A clock signal 1428 may be used to clock control logic associated with the volatile memory elements, such as one or more registers (e.g., the one or more registers of a registered DIMM). Another clock signal 1430 may be sent to the controller 1062. A feedback clock signal 1432 is fed back into the volatile memory PLL block 1424. In one embodiment, the PLL block 1424 compares the feedback clock signal 1432 to the reference clock signal 1423 and varies the phase and frequency of its output until the reference clock signal 1423 and the feedback clock signal 1432 clocks are phase and frequency matched.

The clock signal 1430 may be used by the controller 1062 to generate and distribute clock signals which will be used by controller logic which is configured to control the volatile memory subsystem 1030. For example, control logic in the controller 1062 may be used to control the volatile memory subsystem 1030 during a backup or restore operation. The clock signal 1430 may be used as a reference clock signal for the PLL block 1434 which can generate one or more clocks 1438 used by logic in the controller 1062. For example, the PLL block 1434 may generate one or more clock signals 1438 used to drive logic circuitry associated with controlling the volatile memory subsystem 1030. In certain embodiments, the PLL block 1434 includes a feedback clock signal 1436 and operates in a similar manner to other PLL blocks described herein.

The clock signal 1430 may be used as a reference clock signal for the PLL block 1440 which may generate one or more clock signals used by a sub-block 1442 to generate one or more other clock signals 1444. In one embodiment, for example, the volatile memory subsystem 1030 comprises DDR2 SDRAM elements and the sub-block 1442 generates one or more DDR2 compatible clock signals 1444. A feedback clock signal 1446 is fed back into the PLL block 1440. In certain embodiments, the PLL block 1440 operates in a similar manner to other PLL blocks described herein.

While described with respect to the example embodiment of FIG. 19, various alternative clock distribution topologies are possible. For example, one or more of the clock signals have a different frequency in various other embodiments. In some embodiments, one or more of the clocks shown as differential signals are single ended signals. In one embodiment, the volatile memory subsystem 1030 operates on the volatile memory clock signal 1420 and there is no backup clock signal 1408. In some embodiments, the volatile memory subsystem 1030 is operated at a reduced frequency during a backup operation and not during a restore operation. In other embodiments, the volatile memory subsystem 1030 is operated at a reduced frequency during a restore operation and not during a backup operation.

Figure 20:
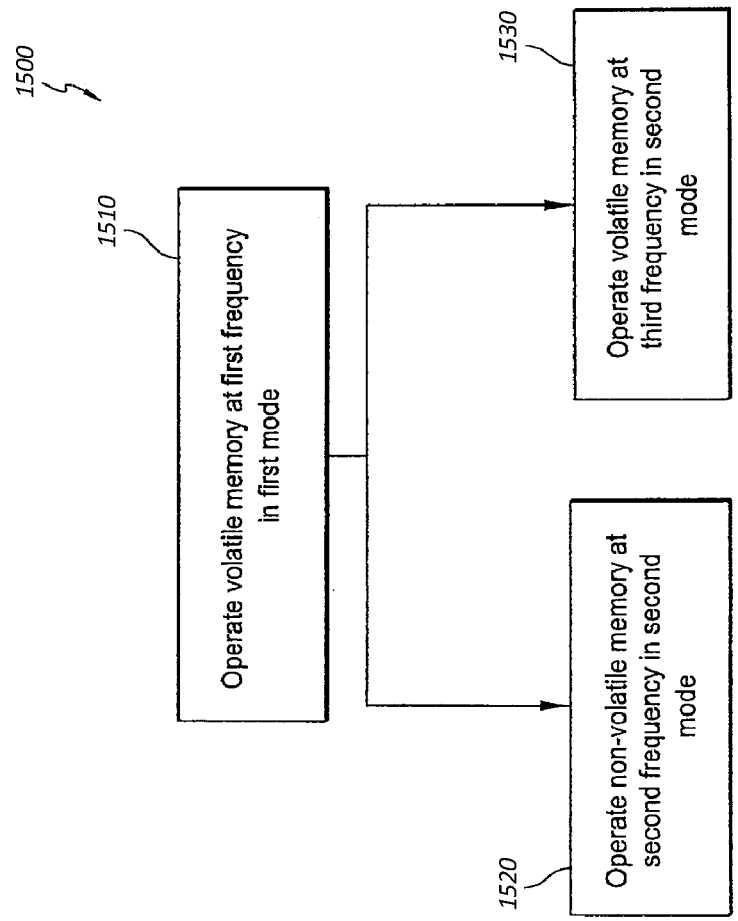
FIG. 20 is a flowchart of an example method of controlling a memory system operatively coupled to a host system, the method including operating a volatile memory subsystem at a reduced rate in a back-up mode.

FIG. 20 is a flowchart of an example method 1500 of controlling a memory system 1010 operatively coupled to a host system. Although described with respect to the memory system 1010 described herein, the method 1500 is compatible with other memory systems. The memory system 1010 may include a clock distribution topology 1400 similar to the one described above with respect to FIG. 19 or another clock distribution topology. The memory system 1010 can include a volatile memory subsystem 1030 and a non-volatile memory subsystem 1040.

In an operational block 1510, the method 1500 comprises operating the volatile memory subsystem 1030 at a first frequency when the memory system 1010 is in a first mode of operation in which data is communicated between the volatile memory subsystem 1030 and the host system. In an operational block 1520, the method 1500 comprises operating the non-volatile memory subsystem 1040 at a second frequency when the memory system 1010 is in a second mode of operation in which data is communicated between the volatile memory subsystem 1030 and the non-volatile memory subsystem 1040. The method 1500 further comprises operating the volatile memory subsystem 1030 at a third frequency in an operational block 1530 when the memory system 1010 is in the second mode of operation. In certain embodiments, the memory system 1010 is not powered by a battery when it is in the second mode of operation. The memory system 1010 may switch from the first mode of operation to the second mode of operation in response to a trigger condition. The trigger condition may be any trigger condition described herein such as, for example, a power failure condition. In certain embodiments, the second mode of operation includes both backup and restore operations as described herein. In other embodiments, the second mode of operation includes backup operations but not restore operations. In yet other embodiments, the second mode of operation includes restore operations but not backup operations.

The third frequency can be less than the first frequency. For example, the third frequency can be approximately equal to the second frequency. In certain embodiments, the reduced frequency operation is an optional mode. In yet other embodiments, the first, second and/or third frequencies are configurable by a user or by the memory system 1010.

Figure 21:
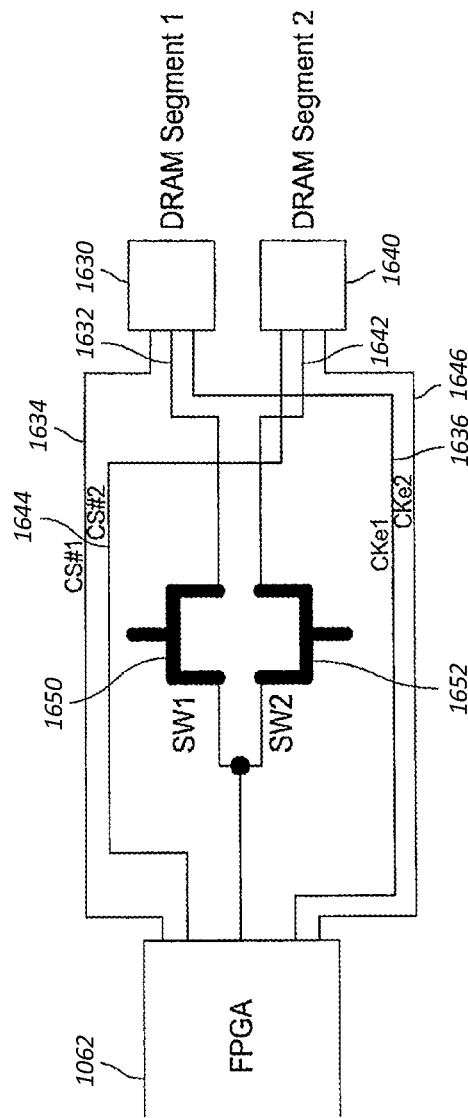
FIG. 21 schematically illustrates an example topology of a connection to transfer data slices from two DRAM segments of a volatile memory subsystem of a memory system to a controller of the memory system.

FIG. 21 schematically illustrates an example topology of a connection to transfer data slices from two DRAM segments 1630, 1640 of a volatile memory subsystem 1030 of a memory system 1010 to a controller 1062 of the memory system 1010. While the example of FIG. 21 shows a topology including two DRAM segments 1630, 1640 for the purposes of illustration, each address location of the volatile memory subsystem 1030 comprises more than the two segments in certain embodiments. The data lines 1632, 1642 from the first DRAM segment 1630 and the second DRAM segment 1640 of the volatile memory subsystem 1030 are coupled to switches 1650, 1652 which are coupled to the controller 1062 (e.g., logic element 1070) of the memory system 1010. The chip select lines 1634, 1644 and the self-refresh lines 1636, 1646 (e.g., CKe signals) of the first and second DRAM segments 1630, 1640, respectively, are coupled to the controller 1062. In certain embodiments, the controller 1062 comprises a buffer (not shown) which is configured to store data from the volatile memory subsystem 1030. In certain embodiments, the buffer is a first-in, first out buffer (FIFO). In certain embodiments, data slices from each DRAM segment 1630, 1640 comprise a portion of the volatile memory subsystem data bus. In one embodiment, for example, the volatile memory subsystem 1030 comprises a 72-bit data bus (e.g., each data word at each addressable location is 72 bits wide and includes, for example, 64 bits of accessible SDRAM and 8 bits of ECC), the first data slice from the first DRAM segment 1630 may comprise 40 bits of the data word, and the second data slice from the second DRAM segment 1640 may comprise the remaining 32 bits of the data word. Certain other embodiments comprise data buses and/or data slices of different sizes.

In certain embodiments, the switches 1650, 1652 can each be selectively switched to selectively operatively couple the data lines 1632, 1642, respectively from the first and second DRAM segments 1630, 1640 to the controller 1062. The chip select lines 1634, 1644 enable the first and second DRAM segments 1630, 1640, respectively, of the volatile memory subsystem 1030, and the self-refresh lines 1636, 1646 toggle the first and second DRAM segments 1630, 1640, respectively, from self-refresh mode to active mode. In certain embodiments, the first and second DRAM segments 1630, 1640 maintain stored information but are not accessible when they are in self-refresh mode, and maintain stored information and are accessible when they are in active mode.

In certain embodiments, when the memory system 1010 is backing up the volatile memory system 1030, data slices from only one of the two DRAM segments 1630, 1640 at a time are sent to the controller 1062. For example, when the first slice is being written to the controller 1062 during a back-up, the controller 1062 sends a signal via the CKe line 1636 to the first DRAM segment 1630 to put the first DRAM segment 1630 in active mode. In certain embodiments, the data slice from the first DRAM segment 1630 for multiple words (e.g., a block of words) is written to the controller 1062 before writing the second data slice from the second DRAM segment 1640 to the controller 1062. While the first data slice is being written to the controller 1062, the controller 1062 also sends a signal via the CKe line 1646 to put the second DRAM segment 1640 in self-refresh mode. Once the first data slice for one word or for a block of words is written to the controller 1062, the controller 1062 puts the first DRAM segment 1630 into self-refresh mode by sending a signal via the CKe line 1636 to the first DRAM segment 1640. The controller 1062 also puts the second DRAM segment 1640 into active mode by sending a signal via the CKe line 1646 to the DRAM segment 1640. The second slice for a word or for a block of words is written to the controller 1062. In certain embodiments, when the first and second data slices are written to the buffer in the controller 1062, the controller 1062 combines the first and second data slices 1630, 1640 into complete words or blocks of words and then writes each complete word or block of words to the non-volatile memory subsystem 1040. In certain embodiments, this process is called "slicing" the volatile memory subsystem 1030.

In certain embodiments, the data may be sliced in a restore operation as well as, or instead of, during a backup operation. For example, in one embodiment, the nonvolatile memory elements 1042 write each backed-up data word to the controller 1062 which writes a first slice of the data word to the volatile memory subsystem 1030 and then a second slice of the data word to the volatile memory subsystem 1030. In certain embodiments, slicing the volatile memory subsystem 1030 during a restore operation may be performed in a manner generally inverse to slicing the volatile memory subsystem 1030 during a backup operation.

Figure 22:
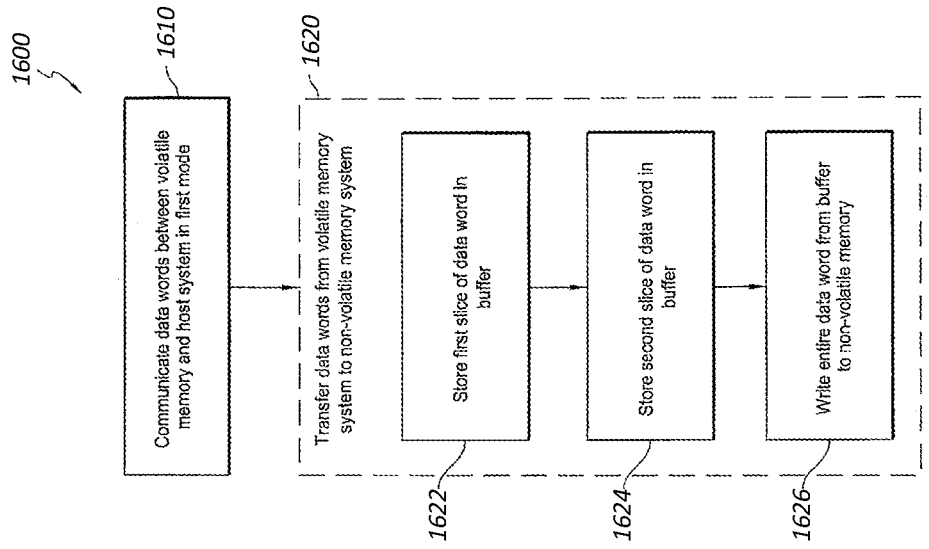
FIG. 22 is a flowchart of an example method of controlling a memory system operatively coupled to a host system, the method including backing up and/or restoring a volatile memory subsystem in slices.

FIG. 22 is a flowchart of an example method 1600 of controlling a memory system 1010 operatively coupled to a host system and which includes a volatile memory subsystem 1030 and a non-volatile memory subsystem 1040. Although described with respect to the memory system 1010 described herein with respect to FIGS. 12-14 and 21, the method 1600 is compatible with other memory systems. The method 1600 comprises communicating data words between the volatile memory subsystem 1030 and the host system when the memory system 1010 is in a first mode of operation in an operational block 1610. For example, the memory system 1010 may be in the first mode of operation when no trigger condition has occurred and the memory system is not performing a backup and/or restore operation or is not being powered by a secondary power supply.

In an operational block 1620, the method further comprises transferring data words from the volatile memory subsystem 1030 to the non-volatile memory subsystem 1040 when the memory system 1010 is in a second mode of operation. In certain embodiments, each data word comprises the data stored in a particular address of the memory system 1010. The memory system 1010 may enter the second mode of operation, for example, when a trigger condition (e.g., a power failure) occurs. In certain embodiments, transferring each data word comprises storing a first portion (also referred to as a slice) of the data word in a buffer in an operational block 1622, storing a second portion of the data word in the buffer in an operational block 1624, and writing the entire data word from the buffer to the non-volatile memory subsystem 1040 in an operational block 1626.

In one example embodiment, the data word may be a 72 bit data word (e.g., 64 bits of accessible SDRAM and 8 bits of ECC), the first portion (or "slice") may comprise 40 bits of the data word, and the second portion (or "slice") may comprise the remaining 32 bits of the data word. In certain embodiments, the buffer is included in the controller 1062. For example, in one embodiment, the buffer is a first-in, first-out buffer implemented in the controller 1062 which comprises an FPGA. The method 1600 may generally be referred to as "slicing" the volatile memory during a backup operation. In the example embodiment, the process of "slicing" the volatile memory during a backup includes bringing the 32-bit slice out of self-refresh, reading a 32-bit block from the slice into the buffer, and putting the 32-bit slice back into self-refresh. The 40-bit slice is then brought out of self-refresh and a 40-bit block from the slice is read into a buffer. Each block may comprise a portion of multiple words. For example, each 32-bit block may comprise 32-bit portions of multiple 72-bit words. In other embodiments, each block comprises a portion of a single word. The 40-bit slice is then put back into self-refresh in the example embodiment. The 32-bit and 40-bit slices are then combined into a 72-bit block by the controller 1062 and ECC detection/correction is performed on each 72-bit word as it is read from the buffer and written into the non-volatile memory subsystem (e.g., flash).

In some embodiments, the entire data word may comprise more than two portions. For example, the entire data word may comprise three portions instead of two and transferring each data word further comprises storing a third portion of each data word in the buffer. In certain other embodiments, the data word may comprise more than three portions.

In certain embodiments, the data may be sliced in a restore operation as well as, or instead of, during a backup operation. For example, in one embodiment, the nonvolatile memory elements 1040 write each backed-up data word to the controller 1062 which writes a first portion of the data word to the volatile memory subsystem 1030 and then a second portion of the data word to the volatile memory 1030. In certain embodiments, slicing the volatile memory subsystem 1030 during a restore operation may be performed in a manner generally inverse to slicing the volatile memory subsystem 1030 during a backup operation.

The method 1600 can advantageously provide significant power savings and can lead to other advantages. For example, in one embodiment where the volatile memory subsystem 1030 comprises DRAM elements, only the slice of the DRAM which is currently being accessed (e.g., written to the buffer) during a backup is configured in full-operational mode. The slice or slices that are not being accessed may be put in self-refresh mode. Because DRAM in self-refresh mode uses significantly less power than DRAM in full-operational mode, the method 1600 can allow significant power savings. In certain embodiments, each slice of the DRAM includes a separate self-refresh enable (e.g., CKe) signal which allows each slice to be accessed independently.

In addition, the connection between the DRAM elements and the controller 1062 may be as large as the largest slice instead of as large as the data bus. In the example embodiment, the connection between the controller 1062 and the DRAM may be 40 bits instead of 72 bits. As a result, pins on the controller 1062 may be used for other purposes or a smaller controller may be used due to the relatively low number of pin-outs used to connect to the volatile memory subsystem 1030. In certain other embodiments, the full width of the data bus is connected between the volatile memory subsystem 1030 and the controller 1062 but only a portion of it is used during slicing operations. For example, in some embodiments, memory slicing is an optional mode.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

What is claimed is:

1. A memory module comprising:
   a printed circuit board (PCB) having an interface configured to fit into a corresponding slot connector of a host system, the interface including a plurality of edge connections configured to couple power, data, address and control signals between the memory module and the host system;
   a first buck converter configured to provide a first regulated voltage having a first voltage amplitude;
   a second buck converter configured to provide a second regulated voltage having a second voltage amplitude;
   a third buck converter configured to provide a third regulated voltage having a third voltage amplitude;
   a converter circuit configured to provide a fourth regulated voltage having a fourth voltage amplitude; and
   a plurality of components coupled to the PCB, each component of the plurality of components coupled to one or more regulated voltages of the first, second, third and fourth regulated voltages, the plurality of components comprising:
   a plurality of synchronous dynamic random access memory (SDRAM) devices coupled to the first regulated voltage, and
   at least one circuit coupled between a first portion of the plurality of edge connections and the plurality of SDRAM devices, the at least one circuit operable to (i) receive a first plurality of address and control signals via the first portion of the plurality of edge connections, and (ii) output a second plurality of address and control signals to the plurality of SDRAM devices, the at least one circuit coupled to both the second regulated voltage and the fourth regulated voltage, wherein a first one of the second and fourth voltage amplitudes is less than a second one of the second and fourth voltage amplitudes.

2. The memory module of claim 1, wherein the first and third buck converters are further configured to operate as a dual buck converter.

3. The memory module of claim 1, wherein the first voltage amplitude is 1.8 volts.

4. The memory module of claim 1, wherein the second, third, and fourth voltage amplitudes are 2.5 volts, 1.2 volts, and 3.3 volts, respectively.

5. The memory module of claim 1, further comprising:
   a voltage monitor circuit configured to monitor a power input voltage received via a second portion of the plurality of edge connections, the voltage monitor circuit configured to produce a trigger signal in response to the power input voltage having a voltage amplitude that is greater than a first threshold voltage.

6. The memory module of claim 5, wherein the voltage monitor circuit is further configured to produce the trigger signal in response to the power input voltage having a voltage amplitude that is less than a second threshold voltage.

7. The memory module of claim 6, wherein the second threshold voltage corresponds to a voltage level that is ten percent less than a specified operating voltage.

8. The memory module of claim 1, the plurality of components further comprising:
one or more registers coupled to one of the first, second, third and fourth regulated voltages, the one or more registers configured to register, in response to a clock, the first plurality of address and control signals, wherein the one of the first, second, third and fourth regulated voltages is selectively switched off to turn power off to the one or more registers while one or more components of the plurality of components are powered on.

9. The memory module of claim 5, wherein the first threshold voltage corresponds to a voltage level that is ten percent greater than a specified operating voltage.

10. The memory module of claim 5, the plurality of components further comprising:
a logic element including a non-volatile memory, the non-volatile memory is configured to store configuration information.

11. The memory module of claim 10, wherein, in response to the trigger signal, the logic element writes information into the non-volatile memory.

12. The memory module of claim 5, the plurality of components further comprising:
a non-volatile memory; and
a controller configured to receive the trigger signal, wherein, in response to the trigger signal, the controller performs a write operation to the non-volatile memory.

13. The memory module of claim 5, wherein the power input voltage is coupled to the first, second, and third buck converters and the converter circuit.

14. The memory module of claim 8, wherein, in response to selectively switching on the one of the first, second, third and fourth regulated voltages to the one or more registers, the one or more registers is configured to output the registered first plurality of address and control signals to the plurality of SDRAM devices.

15. The memory module of claim 1, the plurality of components further comprising:
a logic element including one or more integrated circuits and discrete electrical elements, the one or more integrated circuit including an internal non-volatile memory, wherein the non-volatile memory is configured to store configuration information.

16. A memory module comprising:
a printed circuit board (PCB) having an interface configured to fit into a corresponding slot connector of a host system, the interface including a plurality of edge connections configured to couple power, data, address and control signals between the memory module and the host system;
first, second, and third buck converters configured to receive a pre-regulated input voltage and to produce first, second and third regulated voltages, respectively;
a converter circuit configured to reduce the pre-regulated input voltage to provide a fourth regulated voltage, wherein the first, second, third and fourth regulated voltages have first, second, third, and fourth voltage amplitudes, respectively;
a plurality of components coupled to the PCB, the plurality of components including a plurality of synchronous dynamic random access memory (SDRAM) devices, each component of the plurality of components coupled to one or more regulated voltages of the first, second, third and fourth regulated voltages; and
a voltage monitor circuit configured to monitor an input voltage received via a first portion of the plurality of edge connections, the voltage monitor circuit configured to produce a signal in response to the input voltage having a voltage amplitude that is greater than a first threshold voltage.

17. The memory module of claim 16, wherein the second and third buck converters are configured to operate as a dual buck converter.

18. The memory module of claim 16, the plurality of components further including:
a controller coupled to the voltage monitor circuit and configured to receive the signal, wherein the controller executes a write operation in response to the signal.

19. The memory module of claim 18, wherein the write operation includes writing data information into non-volatile memory.

20. The memory module of claim 16, wherein the plurality of SDRAM devices are configured to receive at least one of the first, second, third and fourth regulated voltages having a voltage amplitude of 1.8 volts.

21. The memory module of claim 16, the plurality of components further including:
at least one circuit coupled between the interface and the plurality of SDRAM devices, the at least one circuit operable to receive a first plurality of address and control signals via a second portion of the plurality of edge connections and to output a second plurality of address and control signals to the plurality of SDRAM devices, the at least one circuit coupled to both the second regulated voltage and the fourth regulated voltage, wherein a first one of the second and fourth voltage amplitudes is less than a second one of the second and fourth voltage amplitudes.

22. The memory module of claim 16, the plurality of components further including:
a logic element including an internal non-volatile memory, wherein the non-volatile memory is configured to store configuration information, wherein the configuration information is used to program the logic element.

23. A memory module comprising:
a printed circuit board (PCB) having an interface configured to fit into a corresponding slot connector of a host system, the interface including a plurality of edge connections configured to couple power, data, address and control signals between the memory module and the host system;
a plurality of components coupled to the PCB, each component of the plurality of components coupled to one or more regulated voltages of first, second, third and fourth regulated voltages, the plurality of components including a plurality of synchronous dynamic random access memory (SDRAM) devices and one or more registers, the plurality of SDRAM devices coupled to the first regulated voltage, the one or more registers coupled to (i) the second regulated voltage, (ii) a portion of the plurality of edge connections, and (iii) the plurality of SDRAM devices, wherein a plurality of address and control signals are coupled to the one or more registers via the portion of the plurality of edge connections;

first, second, and third buck converters configured to provide the first, second and third regulated voltages, respectively; and a converter circuit configured to provide the fourth regulated voltage, wherein the second regulated voltage is configured to be selectively switched on or off to the one or more registers while at least the plurality of SDRAM devices are powered on, wherein if the second regulated voltage is switched on while at least the plurality of SDRAM devices are powered on, the one or more registers are configured to couple the first plurality of address and control signals to the plurality of SDRAM devices, and wherein if the second regulated voltage is switched off while the plurality of SDRAM devices are powered on, the one or more registers are configured to decouple the plurality of SDRAM devices from the first plurality of address and control signals.

24. The memory module of claim 23, further comprising:
a voltage monitor circuit configured to monitor an input voltage received from the host system via the interface, the voltage monitor circuit configured to produce a signal in response to the input voltage having a voltage amplitude that is greater than a first threshold voltage.

25. The memory module of claim 24, the plurality of components further including:
a controller coupled to the voltage monitor circuit and configured to receive the signal, wherein, in response to the signal, the controller executes a write operation.

26. The memory module of claim 25, wherein the write operation includes writing data information to non-volatile memory.

27. The memory module of claim 24, wherein the voltage monitor circuit is further configured to produce the signal in response to the input voltage having a voltage amplitude that is less than a second threshold voltage.

28. The memory module of claim 23, wherein the second and third buck converters are configured to operate as a dual buck converter.

29. The memory module of claim 23, wherein the plurality of SDRAM devices are configured to receive at least one of the first, second, third and fourth regulated voltages having a voltage amplitude of 1.8 volts.

30. The memory module of claim 23, wherein the first, second, and third buck converters are configured to receive a pre-regulated input voltage and to provide the first, second and third regulated voltages, respectively, and wherein the converter circuit is configured to reduce the pre-regulated voltage input to provide the fourth regulated voltage.

* * * * *